United States Patent
Yu et al.

(10) Patent No.: US 11,532,713 B2
(45) Date of Patent: Dec. 20, 2022

(54) SOURCE/DRAIN CONTACTS AND METHODS OF FORMING SAME

(71) Applicant: Taiwan Semiconductor Manufacturing Co., Ltd., Hsinchu (TW)

(72) Inventors: Li-Zhen Yu, New Taipei (TW); Huan-Chieh Su, Tianzhong Township (TW); Lin-Yu Huang, Hsinchu (TW); Cheng-Chi Chuang, New Taipei (TW); Chih-Hao Wang, Baoshan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 9 days.

(21) Appl. No.: 17/091,159

(22) Filed: Nov. 6, 2020

(65) Prior Publication Data
US 2021/0408247 A1 Dec. 30, 2021

Related U.S. Application Data

(60) Provisional application No. 63/044,129, filed on Jun. 25, 2020.

(51) Int. Cl.
*H01L 29/417* (2006.01)
*H01L 23/528* (2006.01)
(Continued)

(52) U.S. Cl.
CPC .. *H01L 29/41733* (2013.01); *H01L 21/02236* (2013.01); *H01L 21/02603* (2013.01);
(Continued)

(58) Field of Classification Search
CPC ......... H01L 29/41733; H01L 21/02236; H01L 21/02603; H01L 23/5286; H01L 29/0673; H01L 29/42392; H01L 29/66545; H01L 29/66553; H01L 29/66636; H01L 29/66742; H01L 29/7848; H01L 29/78618; H01L 29/78696
(Continued)

(56) References Cited

U.S. PATENT DOCUMENTS

| 6,124,179 A | 9/2000 | Adamic, Jr. |
| 9,780,210 B1 * | 10/2017 | Goktepeli ........... H01L 21/2652 |
| 2020/0303509 A1 * | 9/2020 | Mehandru ......... H01L 29/41791 |

FOREIGN PATENT DOCUMENTS

| KR | 20190036533 A | 4/2019 |
| WO | 2018031175 A1 | 2/2018 |

* cited by examiner

*Primary Examiner* — Tong-Ho Kim
(74) *Attorney, Agent, or Firm* — Slater Matsil, LLP

(57) ABSTRACT

A device includes a device layer comprising a first transistor and a second transistor; a first interconnect structure on a front-side of the device layer; and a second interconnect structure on a backside of the device layer. The second interconnect structure comprising a first dielectric layer on the backside of the device layer, wherein a semiconductor material is disposed between the first dielectric layer and a first source/drain region of the first transistor; a contact extending through the first dielectric layer to a second source/drain region of the second transistor; and a first conductive line electrically connected to the second source/drain region of the second transistor through the contact.

20 Claims, 78 Drawing Sheets

(51) Int. Cl.
    *H01L 29/06*         (2006.01)
    *H01L 29/423*       (2006.01)
    *H01L 29/78*         (2006.01)
    *H01L 29/786*       (2006.01)
    *H01L 21/02*         (2006.01)
    *H01L 29/66*         (2006.01)

(52) U.S. Cl.
    CPC ...... *H01L 23/5286* (2013.01); *H01L 29/0673* (2013.01); *H01L 29/42392* (2013.01); *H01L 29/66545* (2013.01); *H01L 29/66553* (2013.01); *H01L 29/66636* (2013.01); *H01L 29/66742* (2013.01); *H01L 29/7848* (2013.01); *H01L 29/78618* (2013.01); *H01L 29/78696* (2013.01)

(58) Field of Classification Search
    USPC .......................................................... 257/347
    See application file for complete search history.

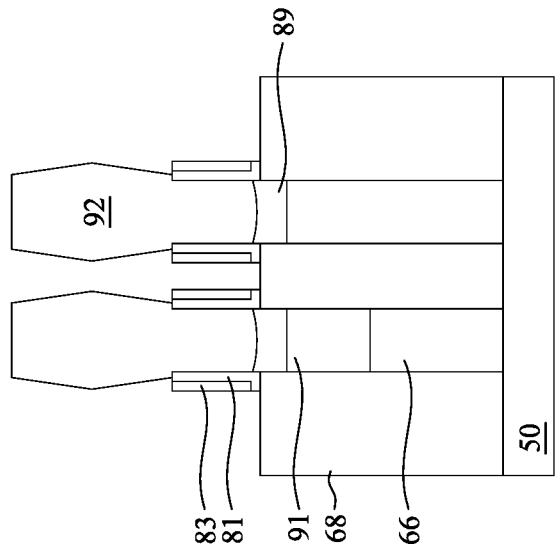
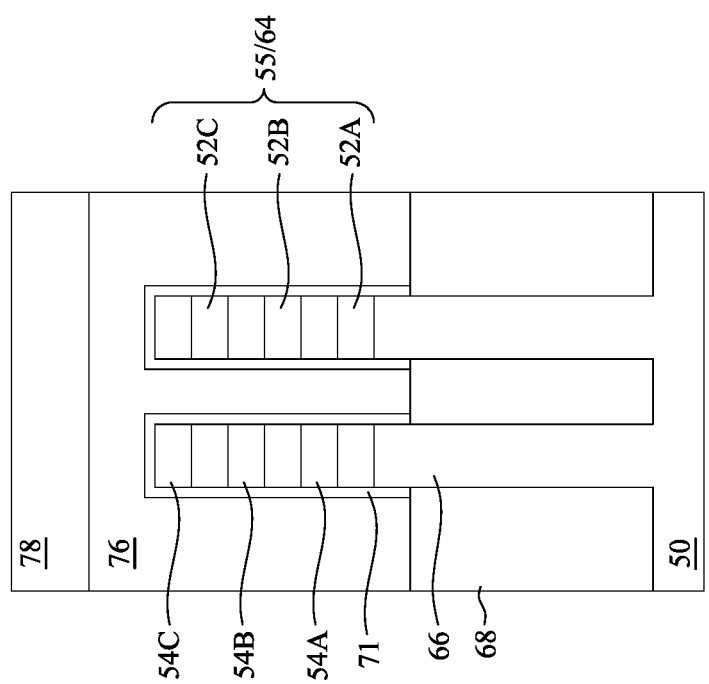
Fig. 12B
Fig. 12A

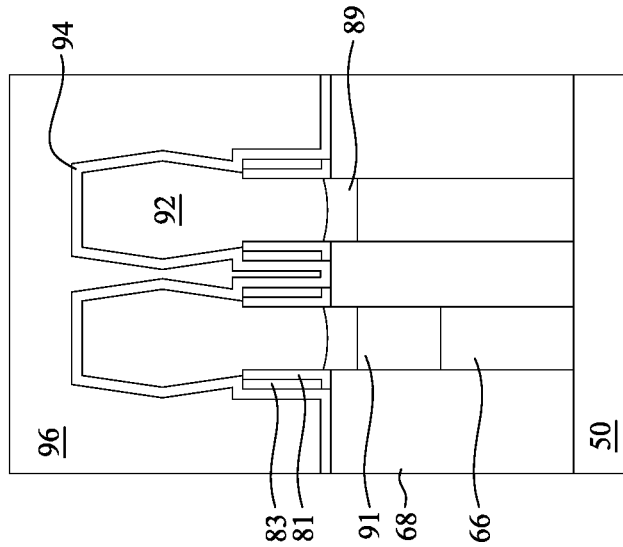
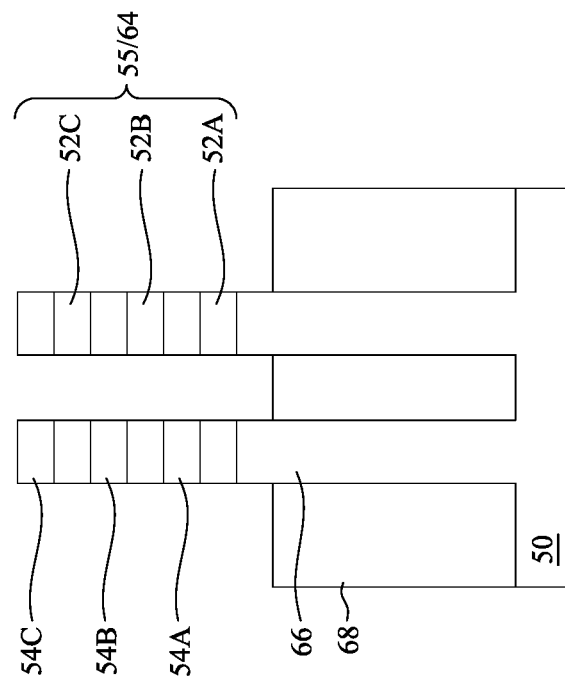
Fig. 15B
Fig. 15A

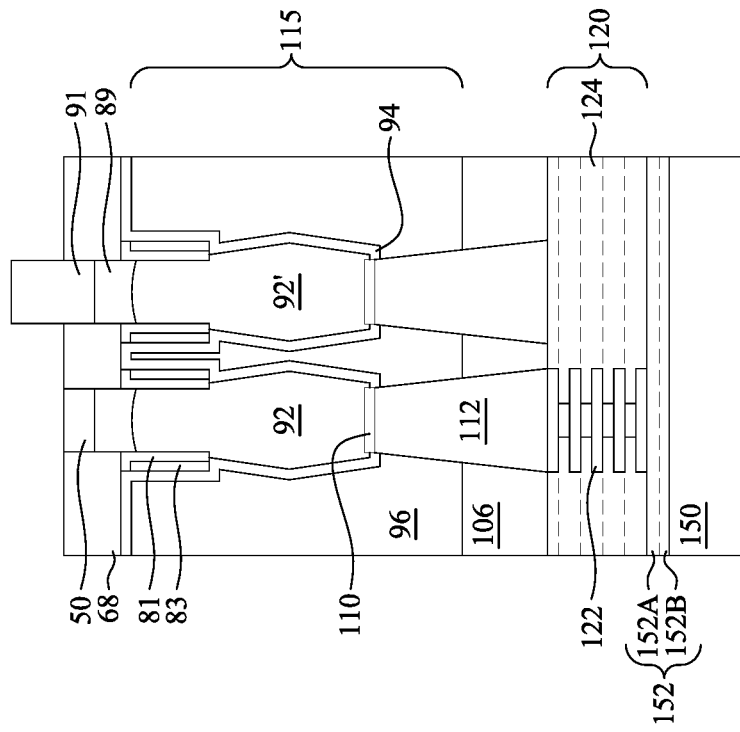
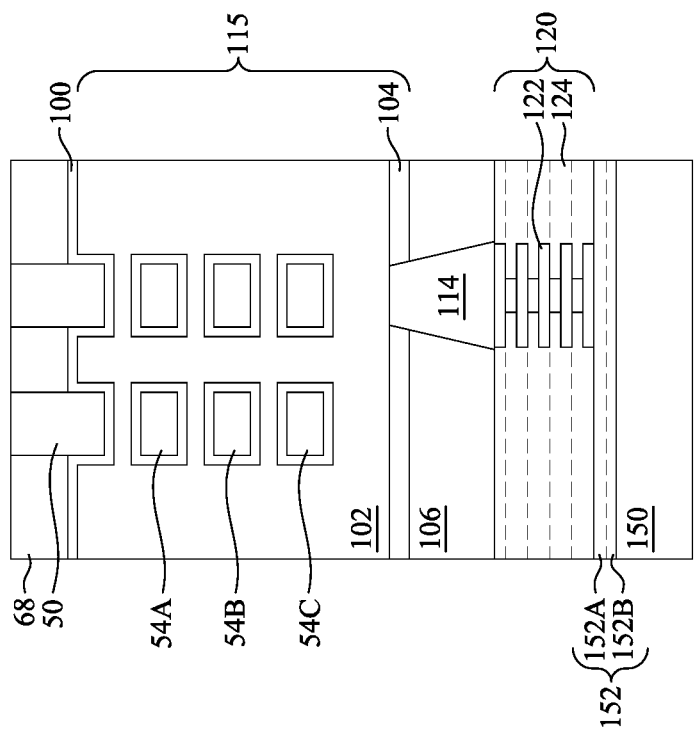
Fig. 22B
Fig. 22A

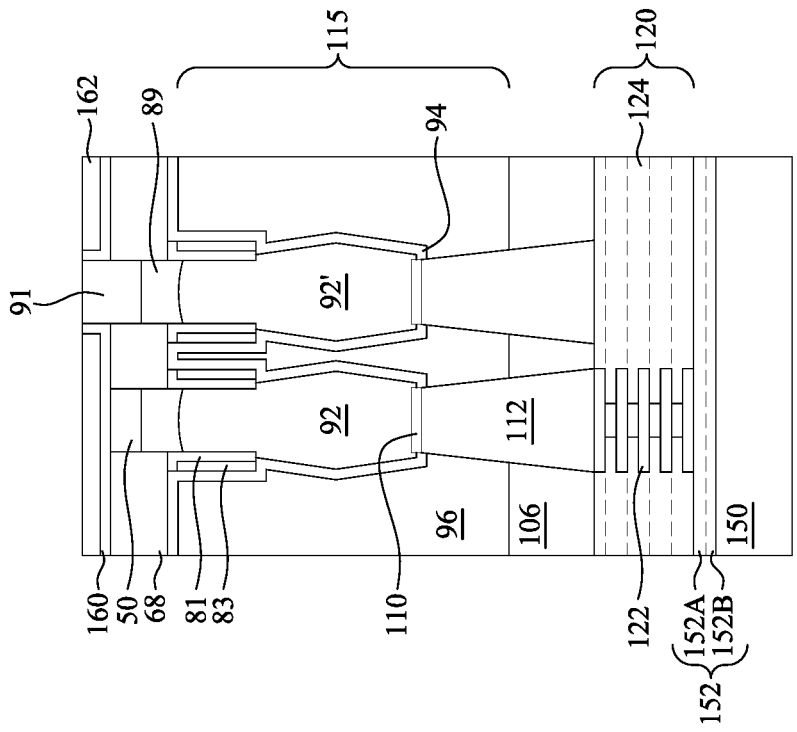
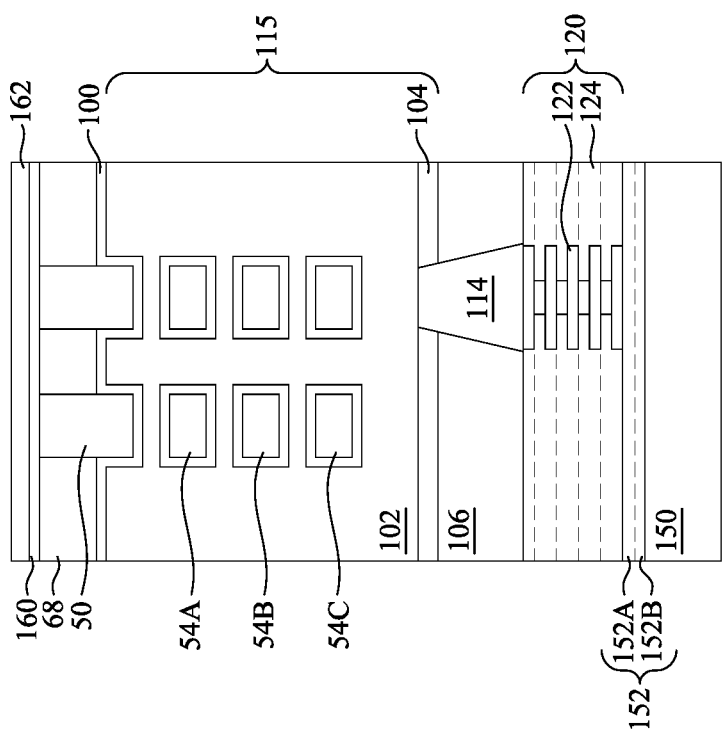
Fig. 24B
Fig. 24A

SOURCE/DRAIN CONTACTS AND METHODS OF FORMING SAME

PRIORITY CLAIM AND CROSS-REFERENCE

This application claims the benefit of U.S. Provisional Application No. 63/044,129, filed on Jun. 25, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C, 8A, 8B, 8C, 9A, 9B, 9C, 10A, 10B, 10C, 11A, 11B, 11C, 11D, 12A, 12B, 12C, 12D, 12E, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 20D, 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, and 29C are cross-sectional views of intermediate stages in the manufacturing of nano-FETs, in accordance with some embodiments.

DETAILED DESCRIPTION

Figure 1:
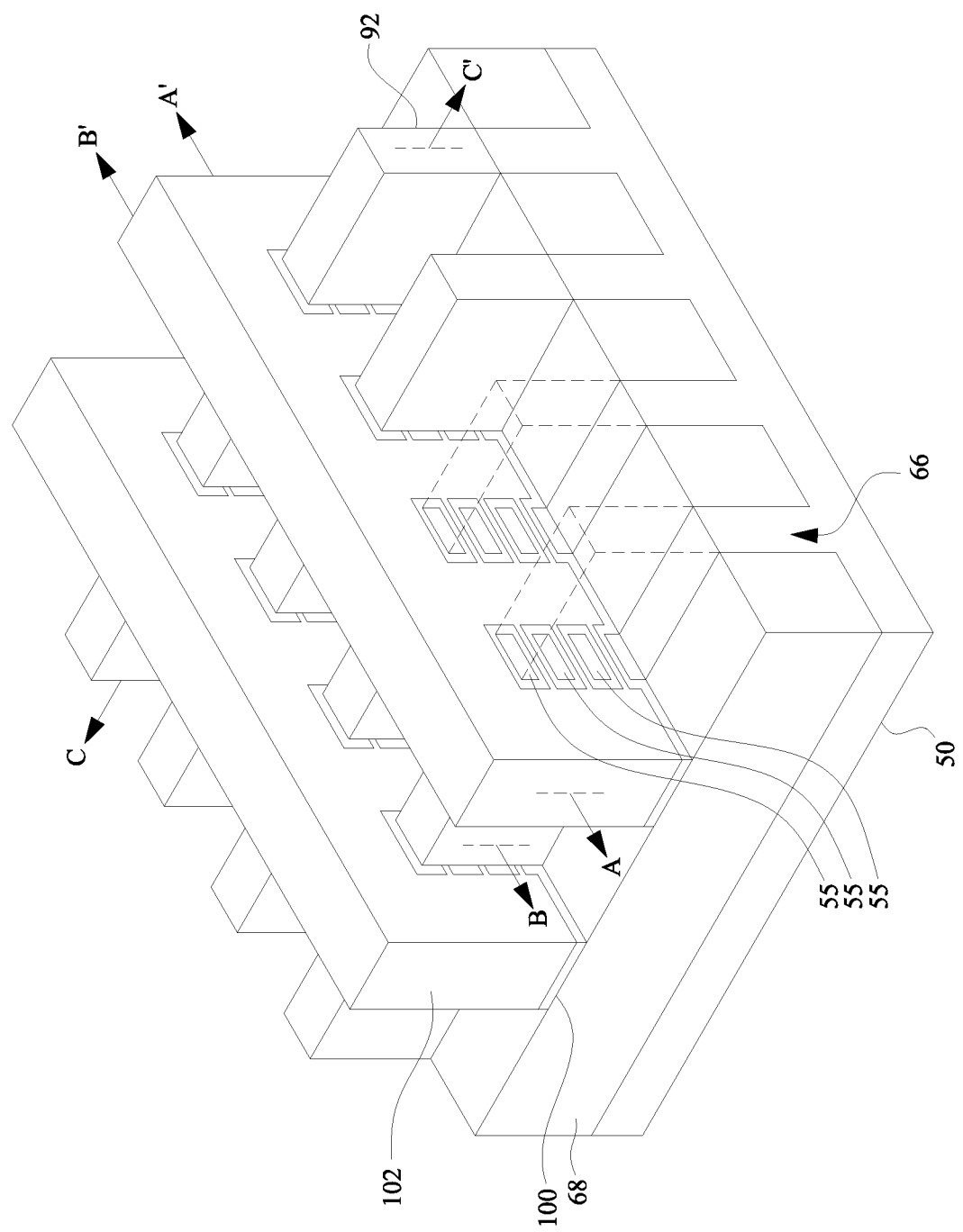
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a backside interconnect structure where a majority of a semiconductor substrate is etched away and removed, and backside contacts are made to source/drain regions of transistors formed on the semiconductor substrate. As part of forming the backside contacts, etching the semiconductor substrate includes leaving a portion of the semiconductor substrate to cover at least edge regions of the source/drain regions. As a result, the source/drain regions can be protected by the remaining semiconductor substrate during the backside contact formation process, and manufacturing defects can be reduced.

Some embodiments discussed herein are described in the context of a die including nano-FETs. However, various embodiments may be applied to dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 93 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 93 of a nano-FET. Cross-section B-B' is parallel to cross-section A-A' and extends through epitaxial source/drain regions 93 of multiple nano-FETs. Cross-section C-C' is perpendicular to cross-section A-A' and is parallel to a longitudinal axis of a fin 66 of the nano-FET and in a direction of, for example, a current flow between the epitaxial source/drain regions 93 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 21D are cross-sectional views of intermediate stages in the front-side manufacturing of nano-FETs, in accordance with some embodiments. FIGS. 2 through 5, 6A, 7A, 8A, 9A, 10A, 11A, 12A, 13A, 14A, 15A, 16A, 17A, 18A, 19A, 20A, and 21A illustrate reference cross-section A-A' illustrated in FIG. 1. FIGS. 6B, 7B, 8B, 9B, 10B, 11B, 12B, 12D, 13B, 14B, 15B, 16B, 17B, 18B, 19B, 20B, and 21B illustrate reference cross-section B-B' illustrated in FIG. 1. FIGS. 7C, 8C, 9C, 10C, 11C, 11D, 12C, 12E, 13C, 14C, 15C, 16C, 17C, 18C, 19C, 20C, 21C, and 21D illustrate reference cross-section C-C' illustrated in FIG. 1.

Figure 2:
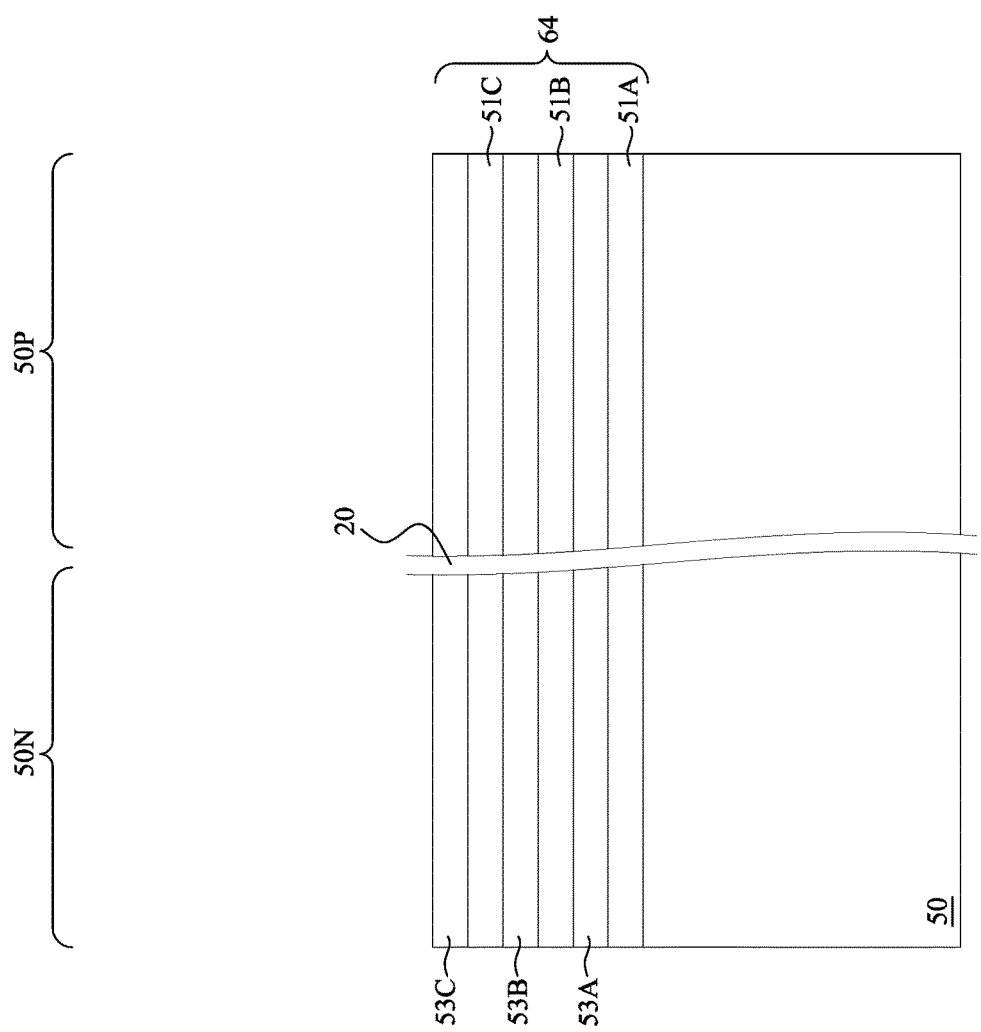

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers 51 will be removed and the second semiconductor layers 53 will be patterned to form channel regions of nano-FETs in the n-type region 50N and the p-type region 50P. However, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments, the second semiconductor layers 53 may be removed and the first semiconductor layers 51 may be patterned to form channel regions of nano-FETs in both the n-type region 50N and the p-type region 50P. In such embodiments, the channel regions in both the n-type region 50N and the p-type region 50P may have a same material composition (e.g., silicon, or the like) and be formed simultaneously.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53 to be patterned to form channel regions of nano-FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material, thereby allowing the first semiconductor layers 51 to be patterned to form channel regions of nano-FETs.

Figure 3:
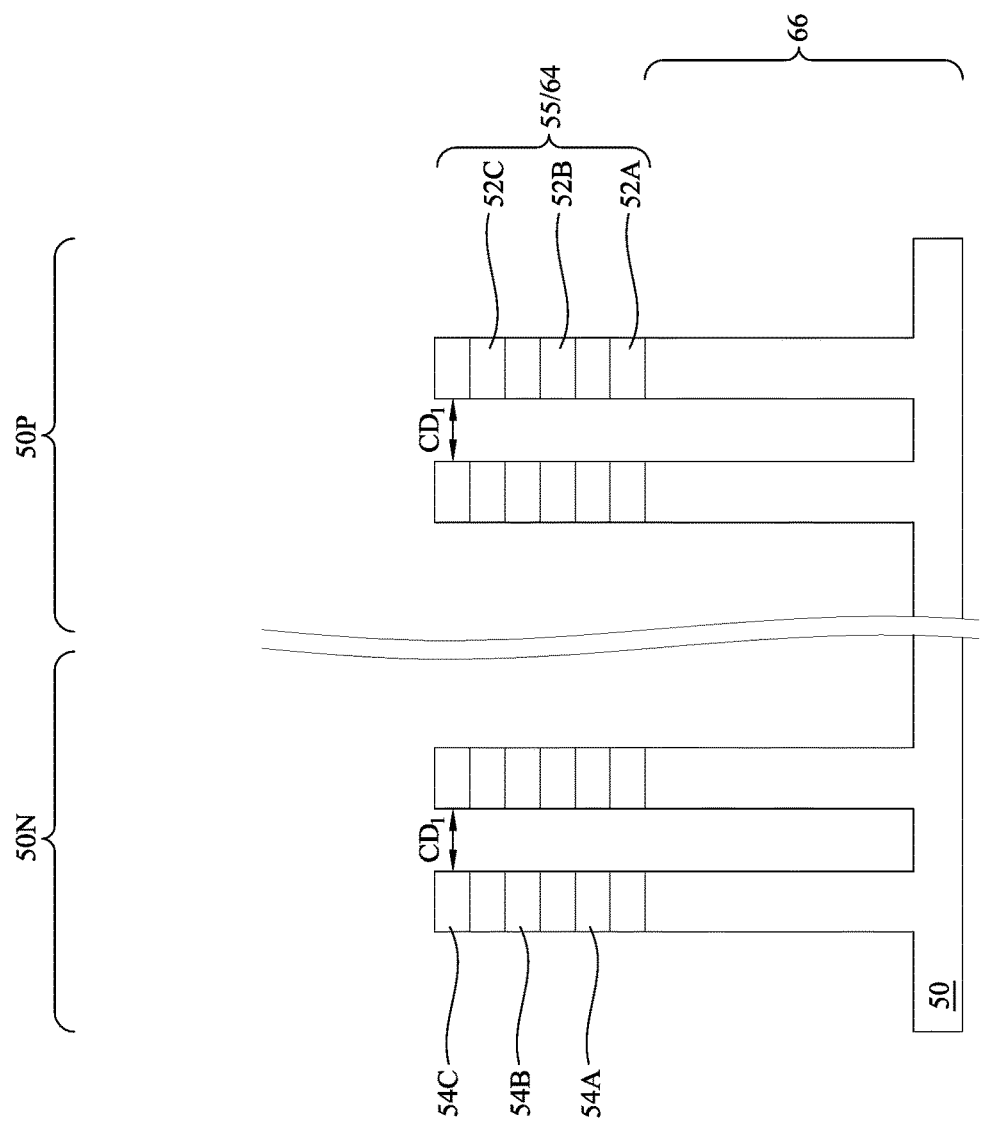

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nano structures 54A-54C (collectively referred to as the second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
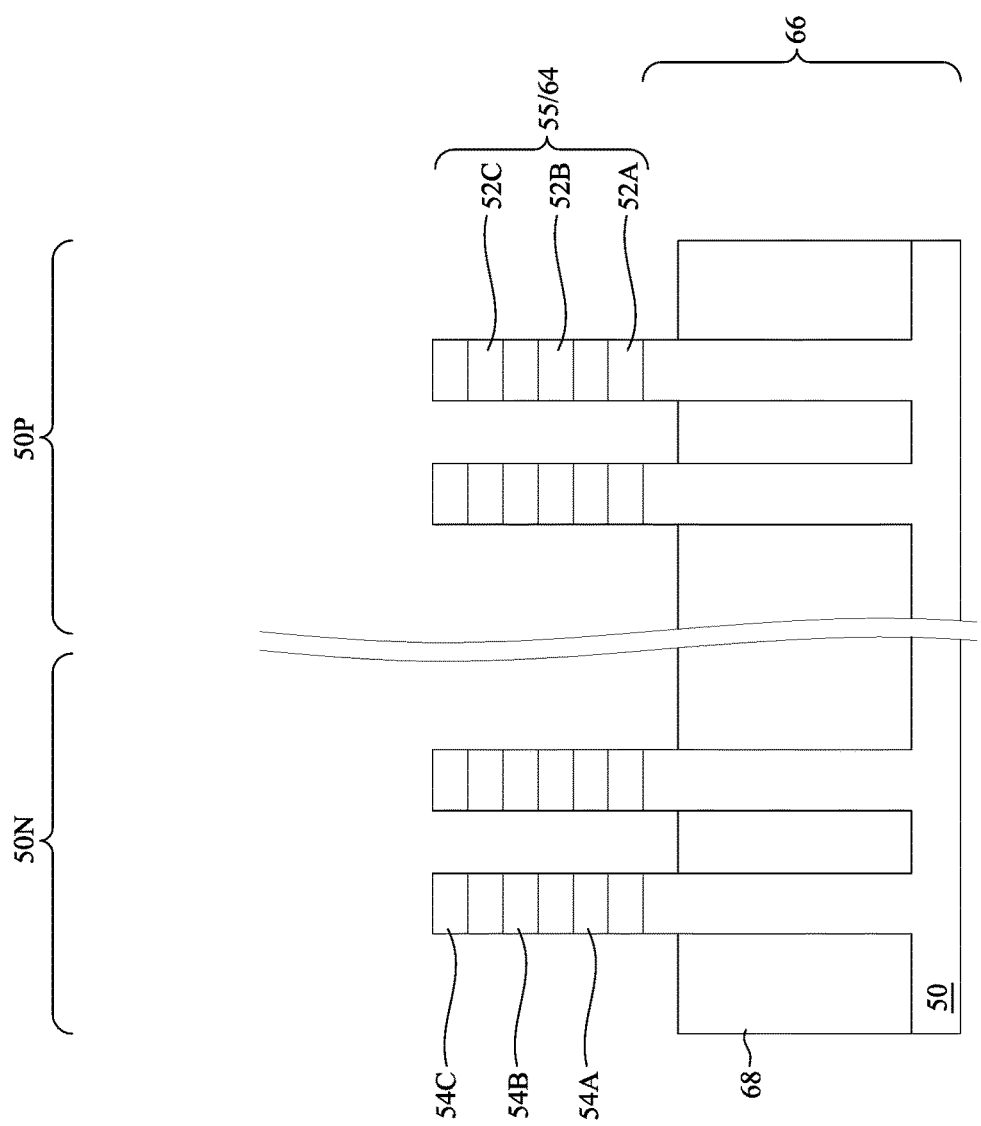

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
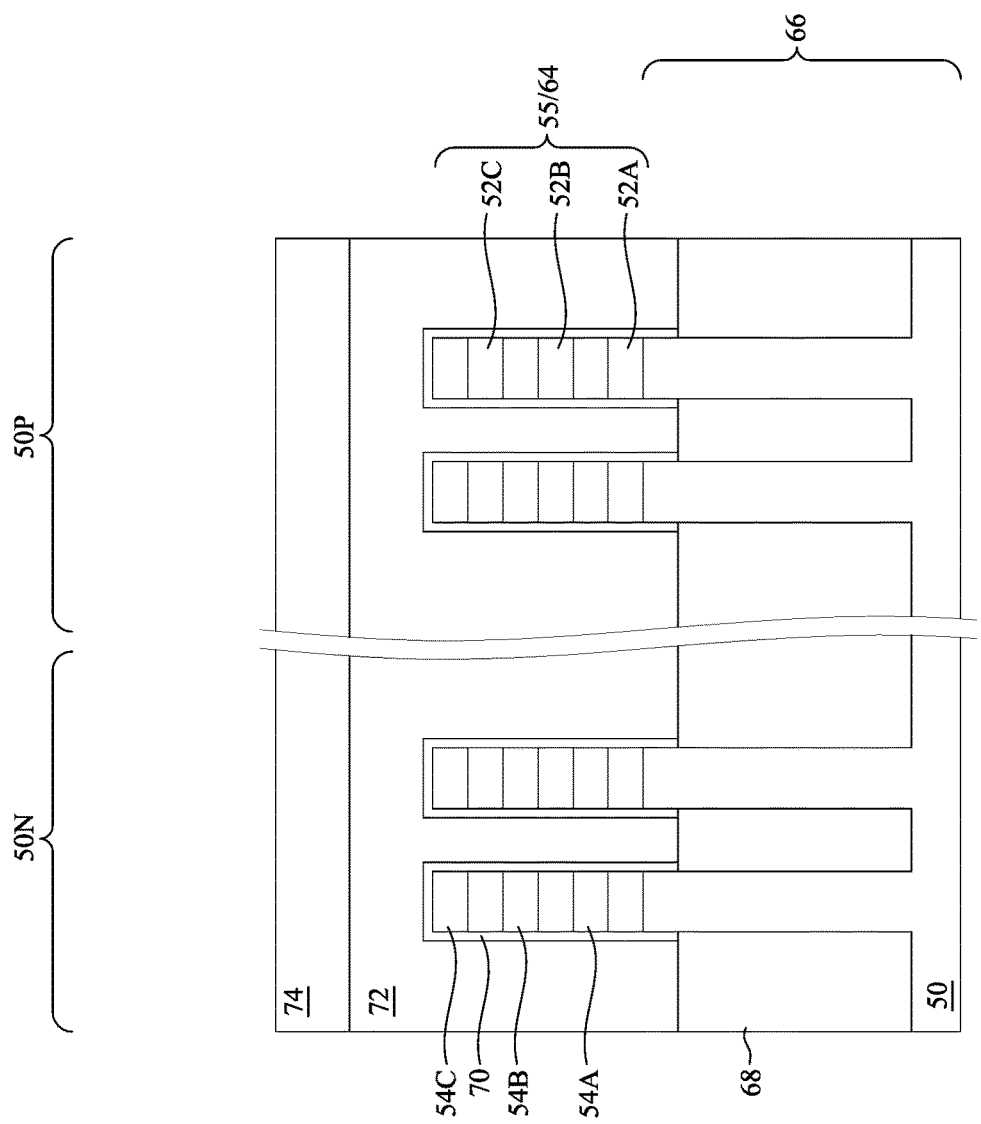

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6B:
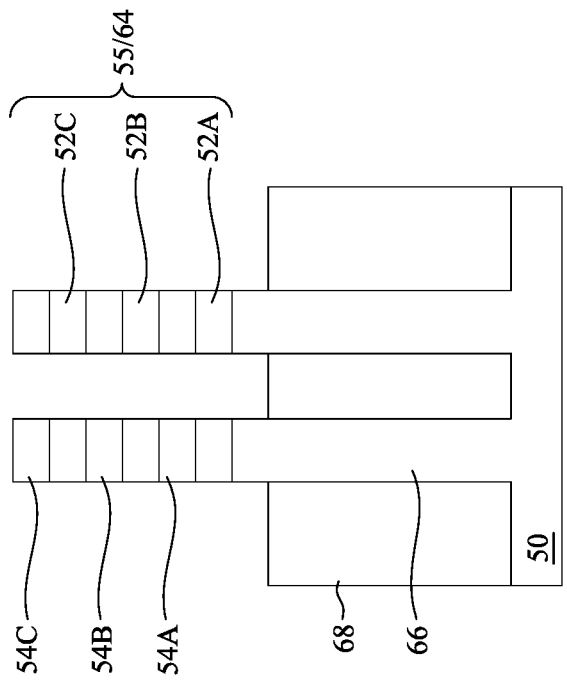
Figure 6A:
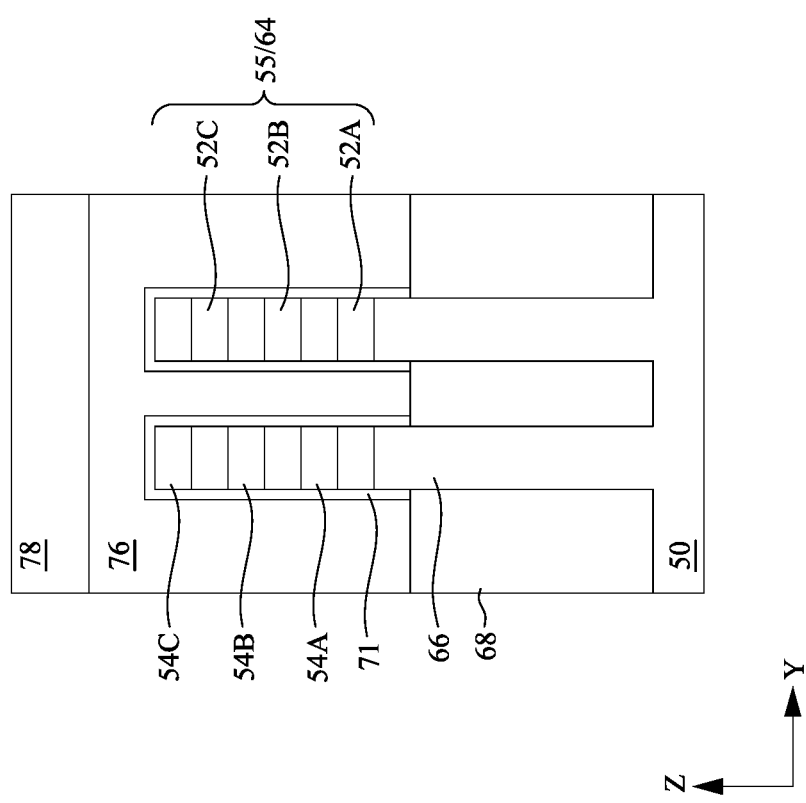
Figure 6C:
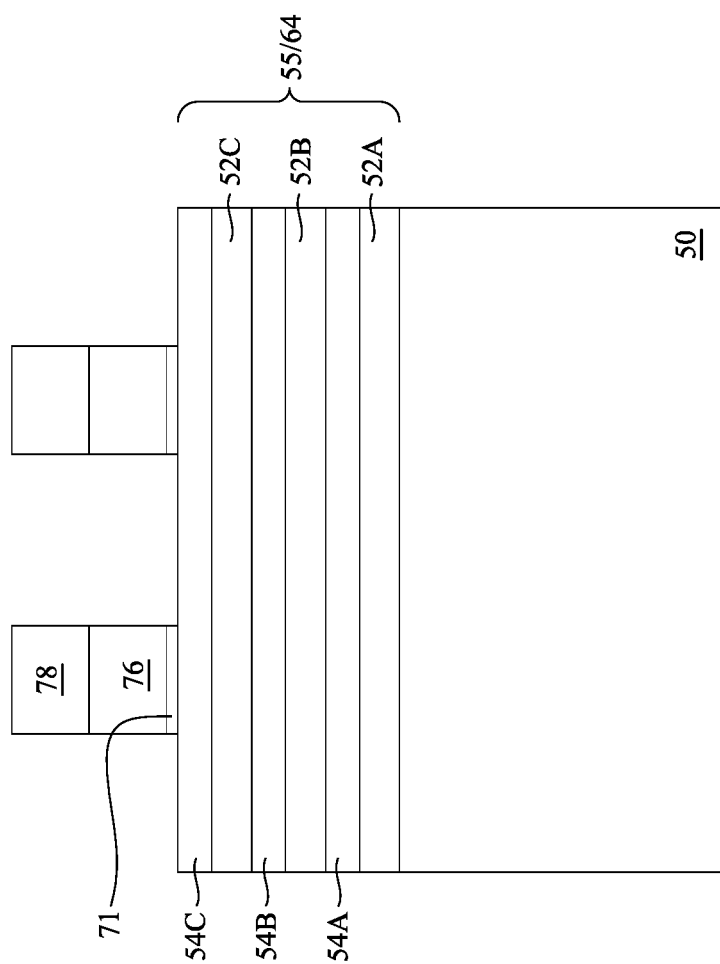

FIGS. 6A through 21C illustrate various additional steps in the manufacturing of embodiment devices. FIGS. 6A through 21C illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7B:
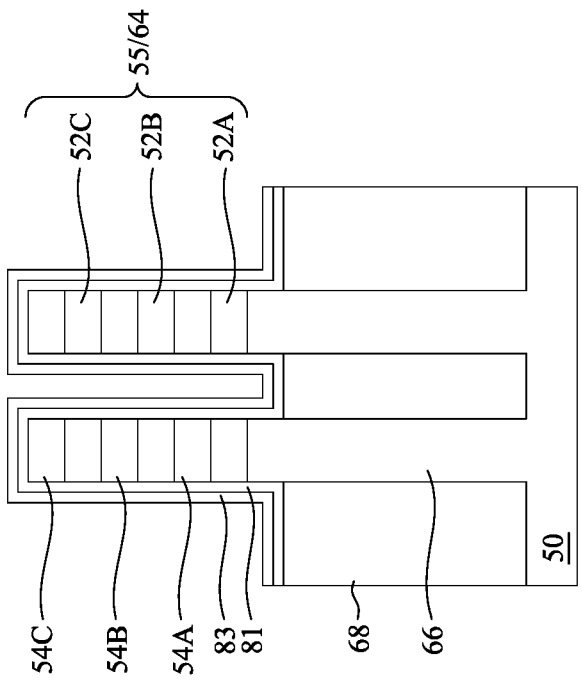
Figure 7A:
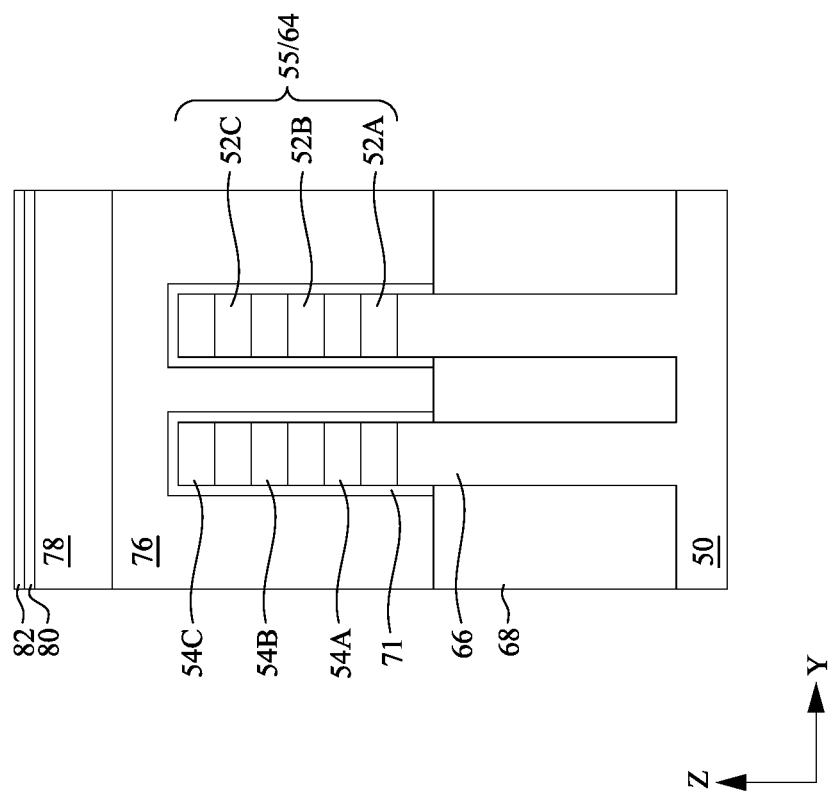
Figure 7C:
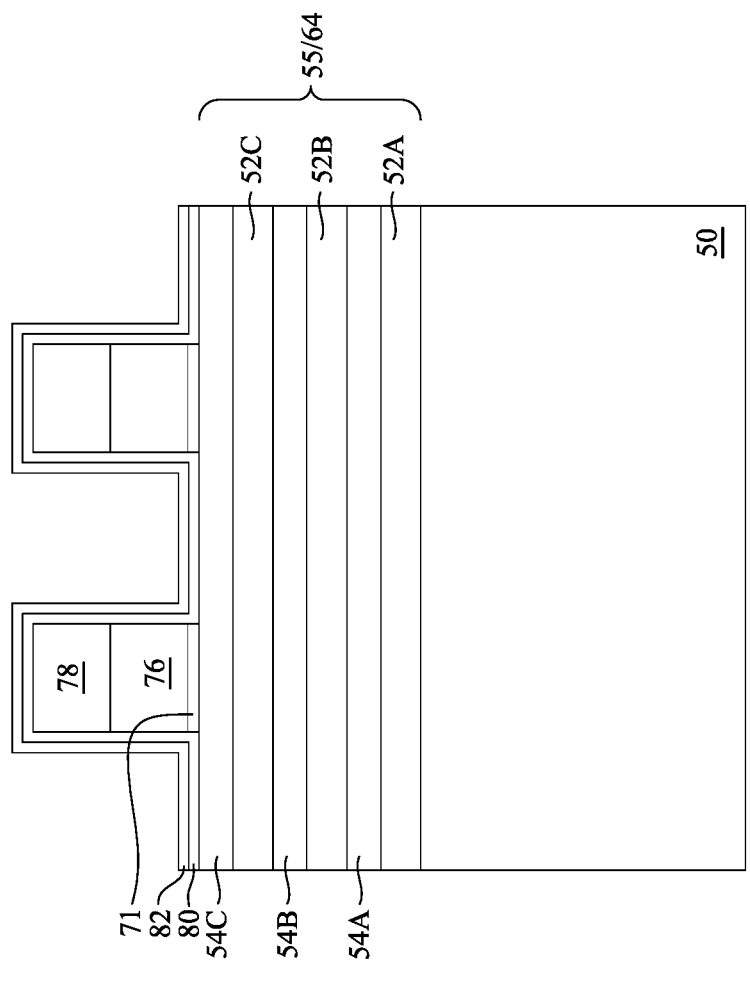

In FIGS. 7A through 7C, a first spacer layer 80 and a second spacer layer 82 are formed over the structures illustrated in FIGS. 6A through 6C. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8B:
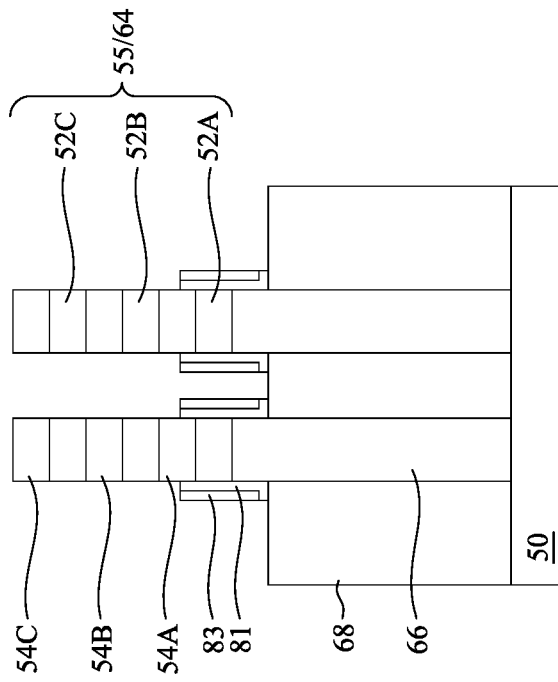
Figure 8A:
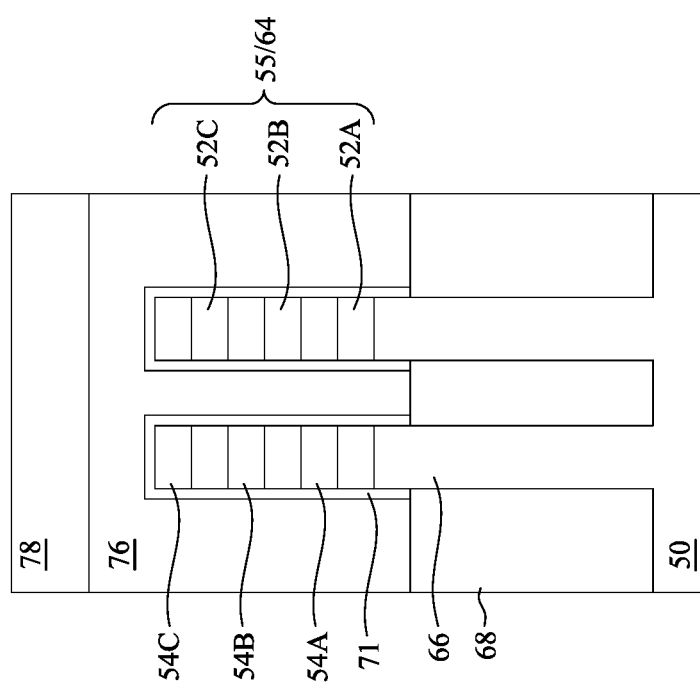
Figure 8C:
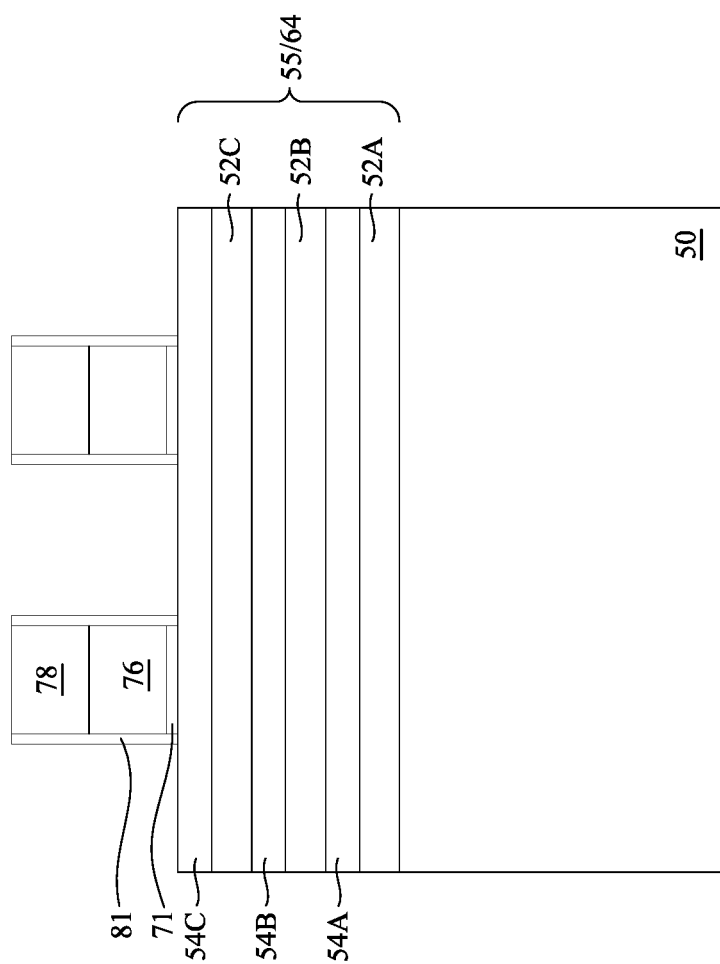

In FIGS. 8A through 8C, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8B. Thereafter, the second spacers 83 acts as a mask while etching exposed portions of the first spacer layer 80, thereby forming first spacers 81 as illustrated in FIGS. 8B and 8C.

As illustrated in FIG. 8B, the first spacers 81 and the second spacers 83 are disposed on sidewalls of the fins 66 and/or nanostructures 55. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 60. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9B:
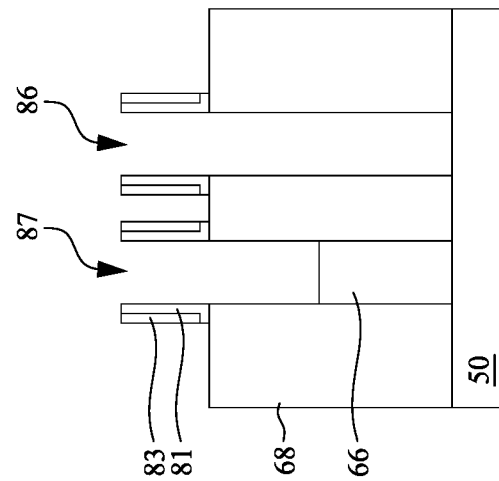
Figure 9A:
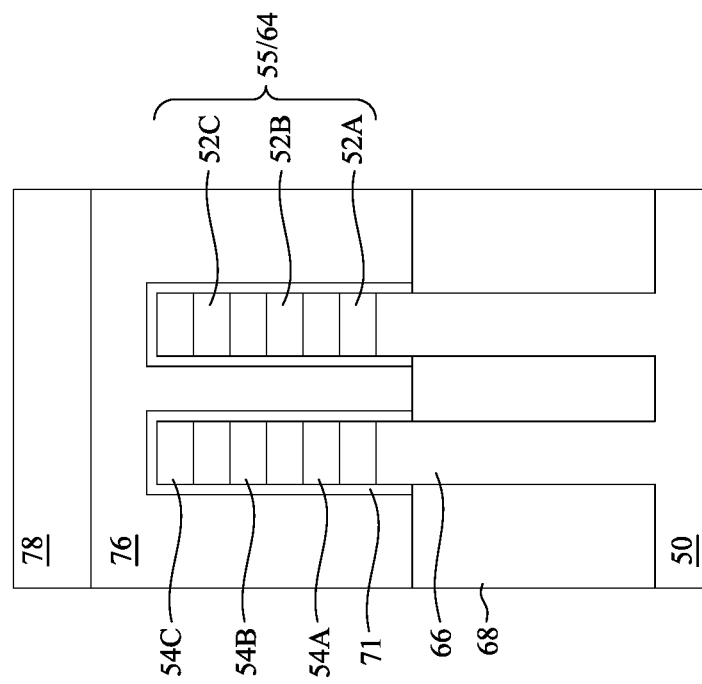
Figure 9C:
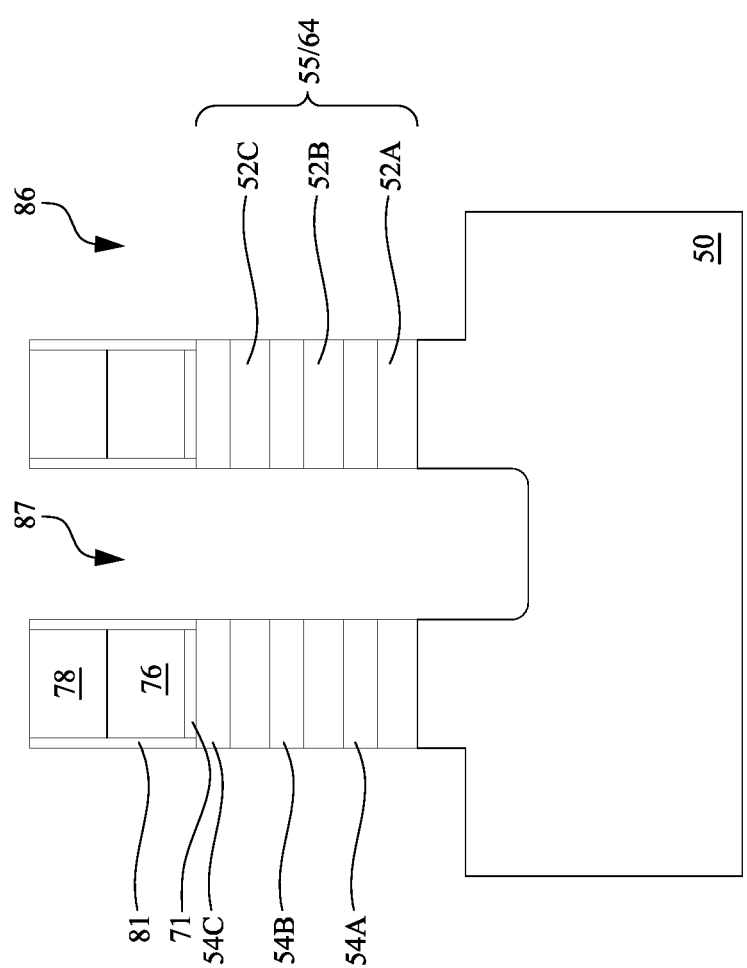

In FIGS. 9A through 9C, first recesses 86 and second recesses 87 are formed in the fins 66, the nanostructures 55, and the substrate 50, in accordance with some embodiments. Epitaxial source/drain regions will be subsequently formed in the first recesses 86 and second recess 87 and epitaxial materials and epitaxial source/drain regions will be subsequently formed in the second recesses 87. The first recesses 86 and the second recesses 87 may extend through the first nanostructures 52 and the second nanostructures 54, and into underlying fins 66 of the substrate 50. As illustrated in FIG. 9B, top surfaces of the STI regions 58 may be higher than bottom surfaces of the first recesses 86. In various embodiments, the fins 66 may be etched such that bottom surfaces of the first recesses 86 are disposed at the same level as the top surfaces of the STI regions 68 or the like. Bottom surfaces of the second recesses 87 may be disposed below the bottom surfaces of the first recesses 86 and the top surfaces of the STI regions 68.

The first recesses 86 and the second recesses 87 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86 and the second recesses 87. A single etch process or multiple etch processes may be used to etch each layer of the nanostructures 55 and/or the fins 66. Timed etch processes may be used to stop the etching after the first recesses 86 and the second recesses 87 reach desired depths. The second recesses 87 may be etched by the same processes used to etch the first recesses 86 and an additional etch process before or after the first recesses 86 are etched. In some embodiments, regions corresponding to the first recesses 86 may be masked while the additional etch process for the second recesses 87 is performed.

Figure 10B:
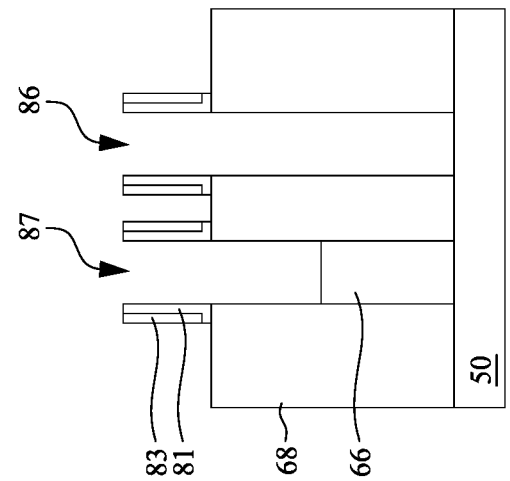
Figure 10A:
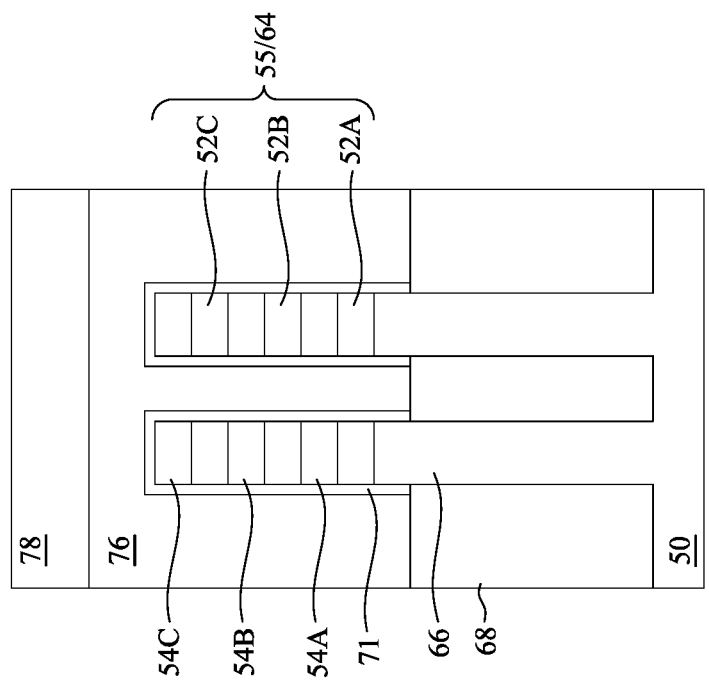
Figure 10C:
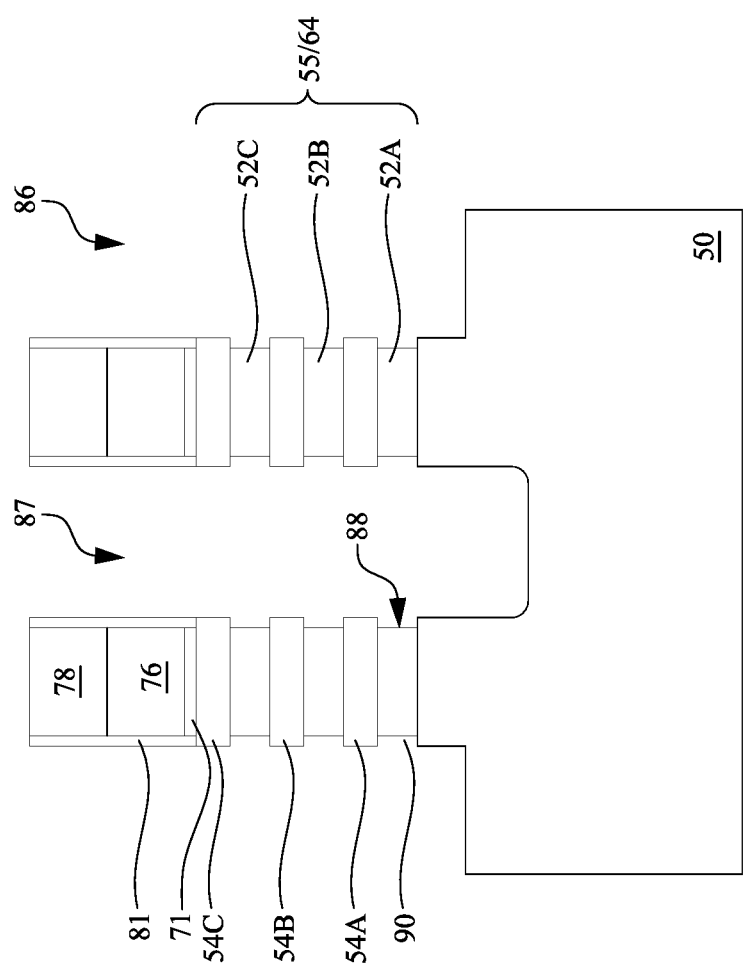

In FIGS. 10A through 10C, portions of sidewalls of the layers of the multi-layer stack 64 formed of the first semiconductor materials (e.g., the first nanostructures 52) exposed by the first recesses 86 and the second recesses 87 are etched to form sidewall recesses 88. Although sidewalls of the first nanostructures 52 adjacent the sidewall recesses 88 are illustrated as being straight in FIG. 10C, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52.

In FIGS. 11A through 11D, first inner spacers 89 are formed in the sidewall recess 88. The first inner spacers 89 may be formed by depositing an inner spacer layer (not separately illustrated) over the structures illustrated in FIGS. 10A through 10C. The first inner spacers 89 act as isolation features between subsequently formed source/drain regions and a gate structure. As will be discussed in greater detail below, source/drain regions and epitaxial materials will be formed in the first recesses 86 and the second recesses 87, while the first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 89. Although outer sidewalls of the first inner spacers 89 are illustrated as being flush with sidewalls of the second nanostructures 54, the outer sidewalls of the first inner spacers 89 may extend beyond or be recessed from sidewalls of the second nanostructures 54.

Figure 11B:
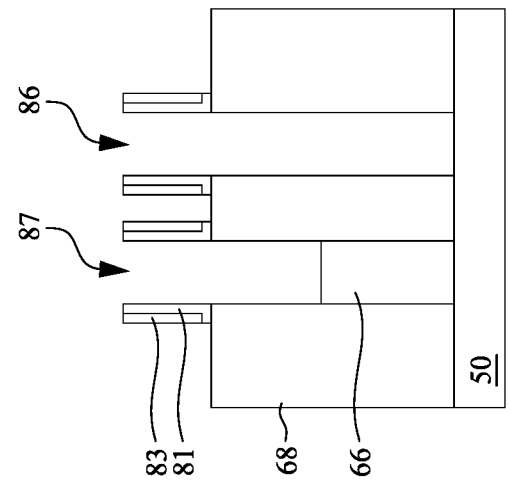
Figure 11A:
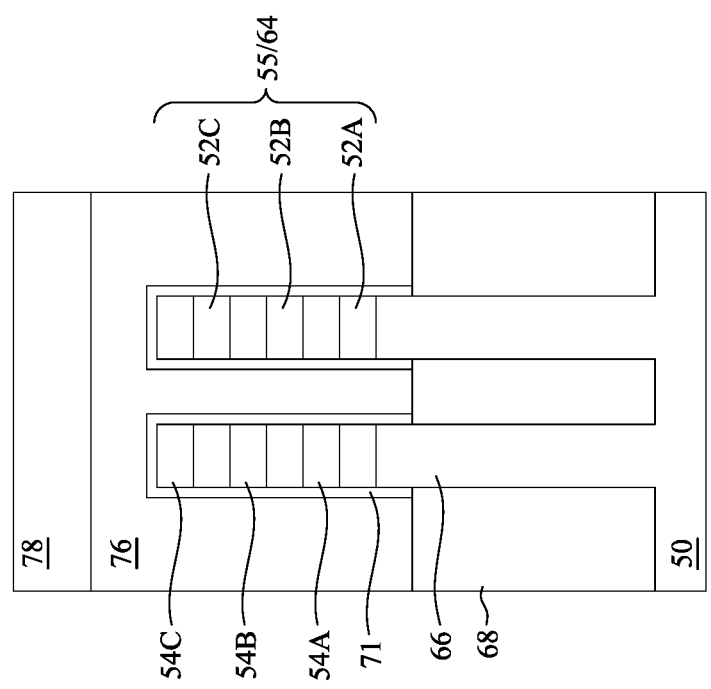
Figure 11C:
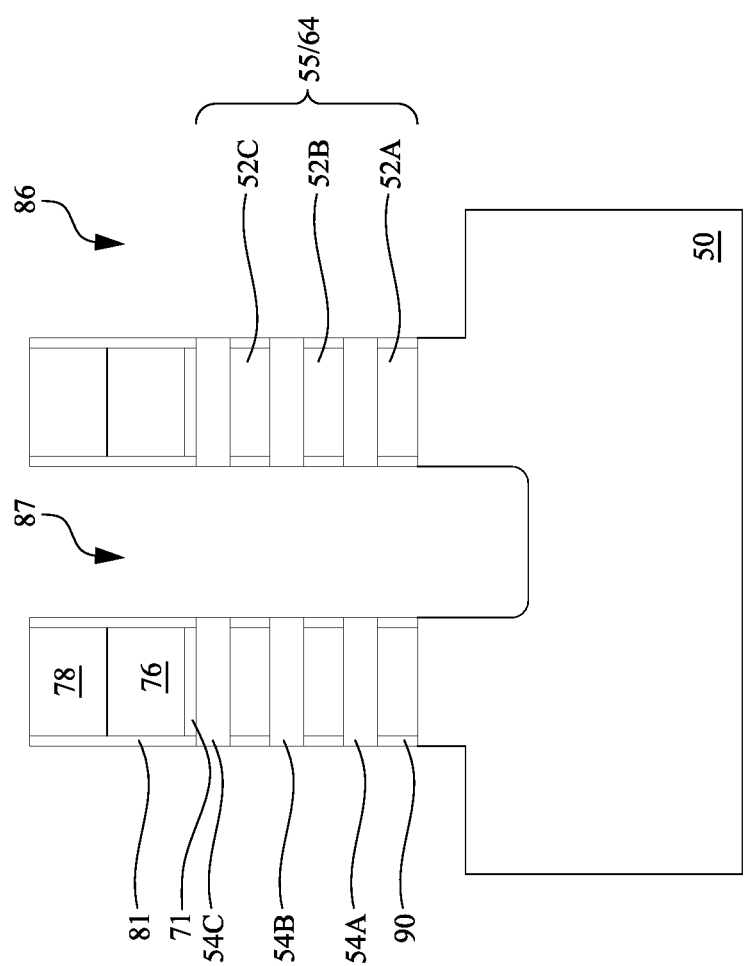
Figure 11D:
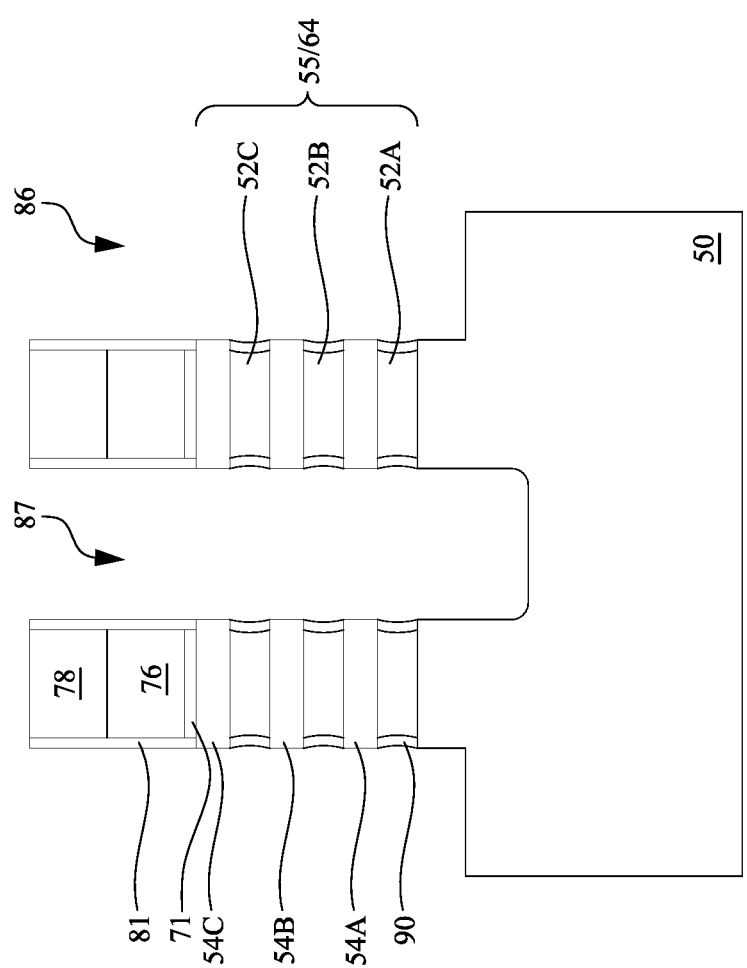

Moreover, although the outer sidewalls of the first inner spacers 89 are illustrated as being straight in FIG. 11C, the outer sidewalls of the first inner spacers 89 may be concave or convex. As an example, FIG. 11D illustrates an embodiment in which sidewalls of the first nanostructures 52 are concave, outer sidewalls of the first inner spacers 89 are concave, and the first inner spacers 89 are recessed from sidewalls of the second nanostructures 54. The inner spacer layer may be etched by an anisotropic etching process, such as RIE, NBE, or the like. The first inner spacers 89 may be used to prevent damage to subsequently formed source/drain regions (such as the epitaxial source/drain regions 93, discussed below with respect to FIGS. 12A through 12E) by subsequent etching processes, such as etching processes used to form gate structures.

Figure 12C:
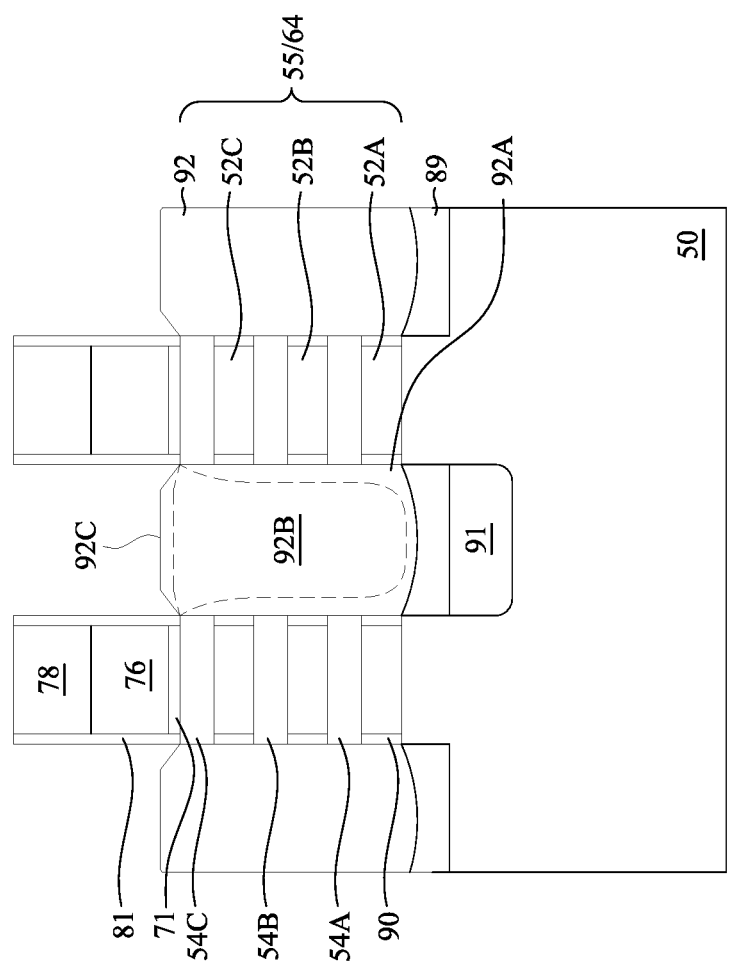
Figure 12E:
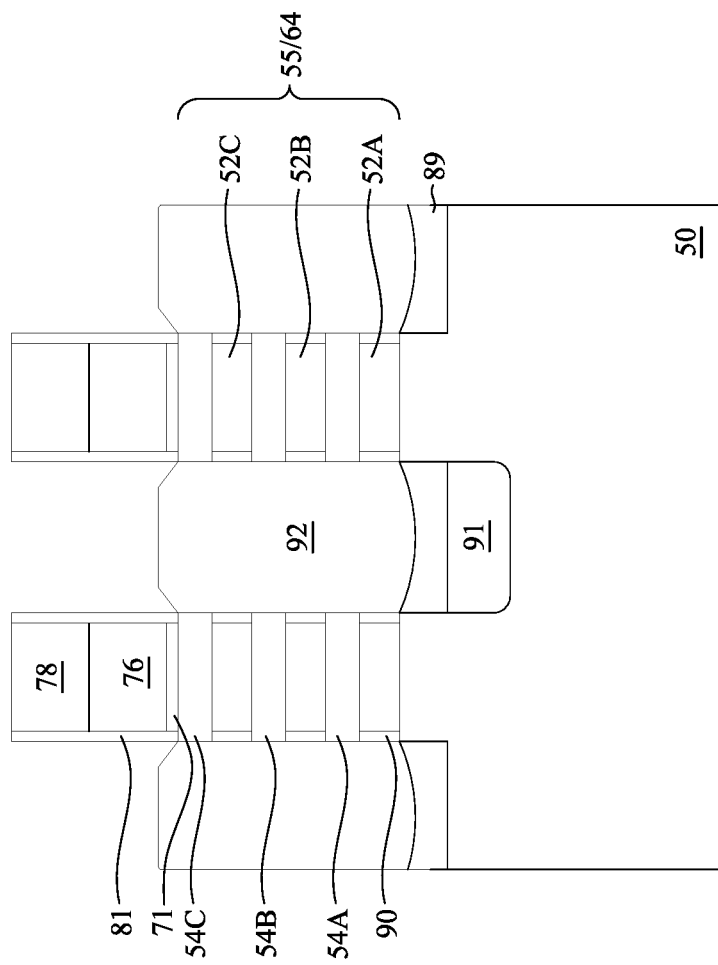

In FIGS. 12A through 12D, first epitaxial materials 91 are formed in the second recesses 87, second epitaxial materials 89 are formed in the first recesses 86 and are formed over the first epitaxial materials 91 in the second recesses 87, and epitaxial source/drain regions 92 are formed in the first recesses 86 and the second recesses 87 over the second epitaxial materials 89. In some embodiments, the first epitaxial materials 91 may be sacrificial materials, which are subsequently removed to form backside vias (such as the backside vias 170, discussed below with respect to FIGS. 27A through 27C). As illustrated in FIGS. 12B through 12C, top surfaces of the first epitaxial materials 91 may be level with bottom surfaces of the first recesses 86. However, in some embodiments, top surfaces of the first epitaxial materials 91 may be disposed below or above bottom surfaces of the first recesses 86. The first epitaxial materials 91 may be epitaxially grown in the second recesses 87 using a process such as chemical vapor deposition (CVD), atomic layer deposition (ALD), vapor phase epitaxy (VPE), molecular beam epitaxy (MBE), or the like. The first epitaxial materials 91 may include any acceptable material, such as silicon germanium or the like. The first epitaxial materials 91 may be formed of materials having high etch selectivity to materials of the epitaxial source/drain regions 92, the substrate 50, and dielectric layers (such as the STI regions 68 and second dielectric layers 125). As such, the first epitaxial materials 91 may be removed and replaced with the backside vias without significantly removing the epitaxial source/drain regions 92 and the dielectric layers.

The second epitaxial materials 89 are then formed in the first recesses 86 and in the second recesses 87 over the first epitaxial materials 91. In some embodiments, portions of the second epitaxial materials 89 in on the first epitaxial materials 91 may be sacrificial materials, which are subsequently removed to form backside vias (such as the backside vias 130, discussed below with respect to FIGS. 30A through 30C). Other portions of the second epitaxial materials 89 (e.g., formed in the first recesses 86) may be used as a mask that protects the third epitaxial materials 89 during subsequent etching steps to remove portions of the substrate 50 and the first epitaxial materials 91. As illustrated in FIGS. 12B through 12C, top surfaces of the second epitaxial materials 89 may be level with top surfaces of the STI regions 68. However, in some embodiments, top surfaces of the second epitaxial materials 89 may be disposed below or above top surfaces of the STI regions 68. The second epitaxial materials 89 may be epitaxially grown in the first recesses 86 and in the second recesses 87 using a process such as chemical vapor deposition (CVD), atomic layer deposition (ALD), vapor phase epitaxy (VPE), molecular beam epitaxy (MBE), or the like. The second epitaxial materials 89 may include any acceptable material, such as silicon germanium or the like. In some embodiments, the second epitaxial materials 89 may be similar materials as the first epitaxial materials 91 (e.g., silicon germanium); however, a germanium concentration in the second epitaxial materials 89 may be different than a germanium concentration of the first epitaxial materials 91. As a result, the first epitaxial materials 91 may be selectively etched without significantly etching the second epitaxial materials 89. The second epitaxial materials 89 may be formed of materials having high etch selectivity to materials of the epitaxial source/drain regions 92, the substrate 50, and dielectric layers (such as the STI regions 68 and dielectric layer 162, discussed below). As such, second epitaxial materials 89 may be removed and replaced with the backside vias without significantly removing the epitaxial source/drain regions 92 and the dielectric layers.

The epitaxial source/drain regions 92 are then formed over the second epitaxial materials 89 in the first recesses 86 and in the second recesses 87. In some embodiments, the epitaxial source/drain regions 92 may exert stress on the second nanostructures 54, thereby improving performance. As illustrated in FIG. 12C, the epitaxial source/drain regions 92 are formed in the first recesses 86 and the second recesses 87 such that each dummy gate 76 is disposed between respective neighboring pairs of the epitaxial source/drain regions 92. In some embodiments, the first spacers 81 are used to separate the epitaxial source/drain regions 92 from the dummy gates 76 and the inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 and the second recesses 87 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 and the second recesses 87 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 56 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

Figure 12D:
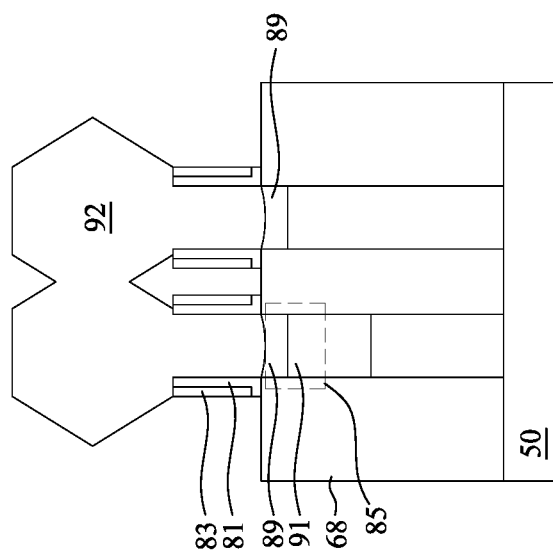

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, adjacent epitaxial source/drain regions 92 remain separated after the epitaxy process is completed as illustrated by FIG. 12B. In the embodiments illustrated in FIG. 12B, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68. In other embodiments, the expansion of the epitaxial source/drain regions 92 may cause neighboring epitaxial source/drain regions 92 to merge together as illustrated by the embodiment of FIG. 12D.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 13B:
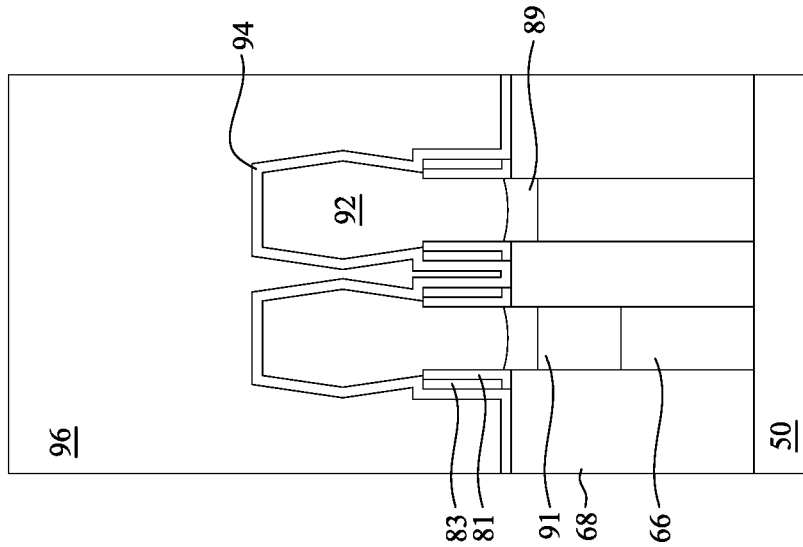
Figure 13A:
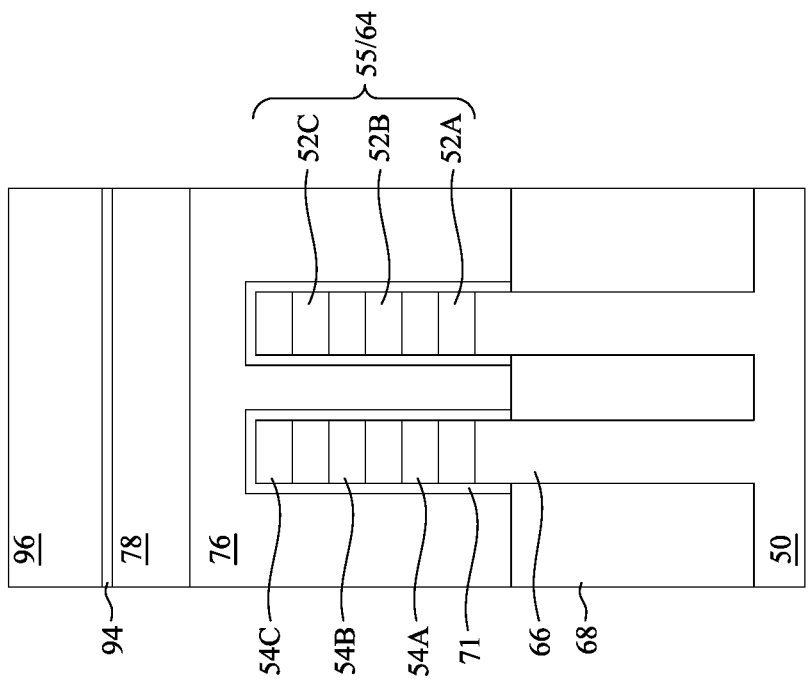
Figure 13C:
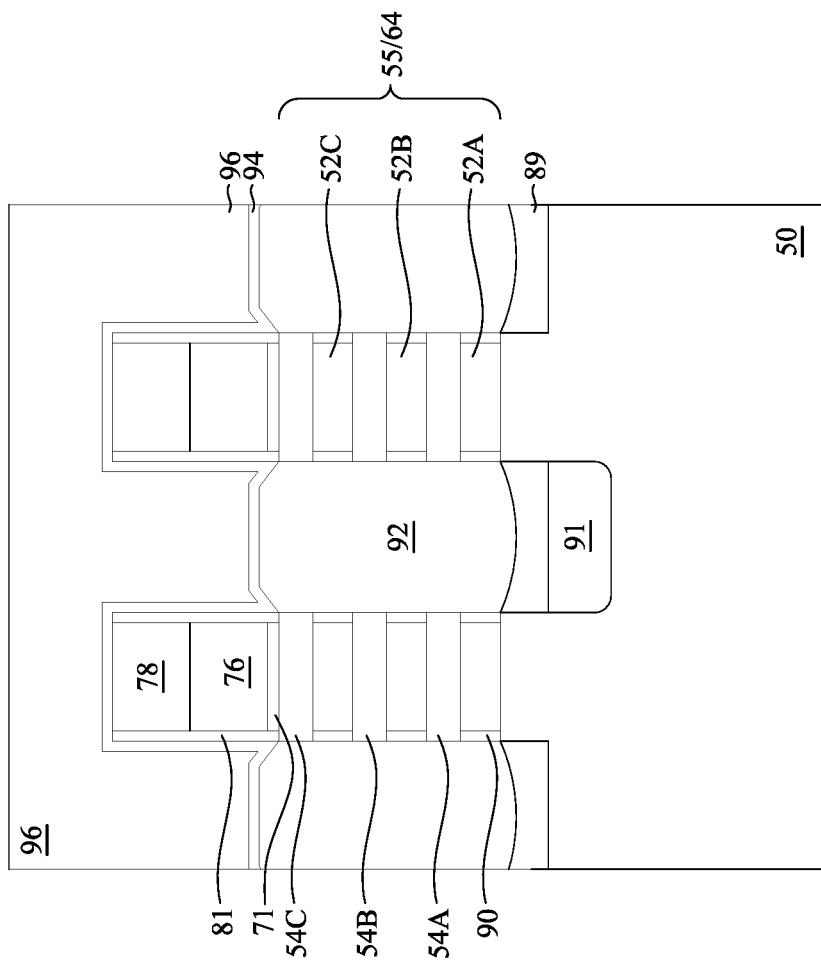

In FIGS. 13A through 13C, a first interlayer dielectric (ILD) 96 is deposited over the structure illustrated in FIGS. 12A through 12D. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 93, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 14B:
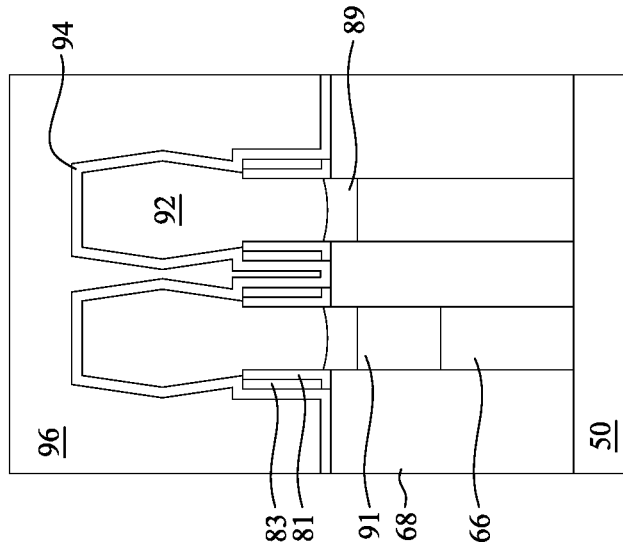
Figure 14A:
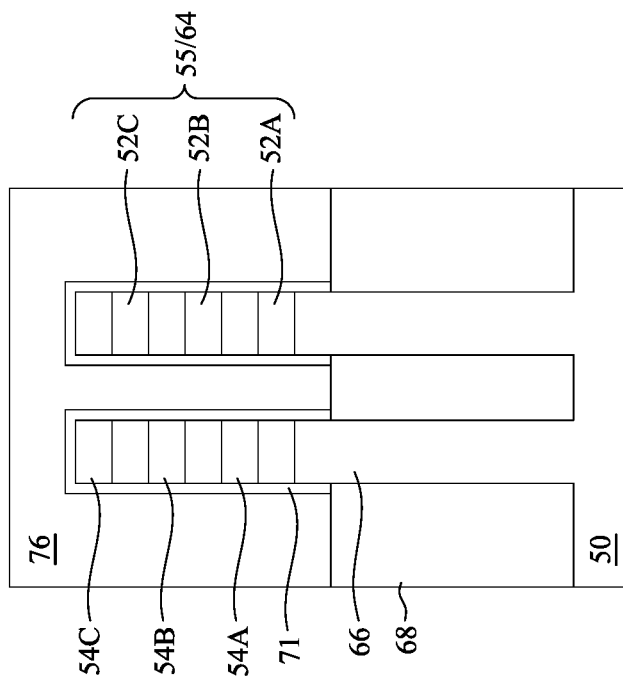
Figure 14C:
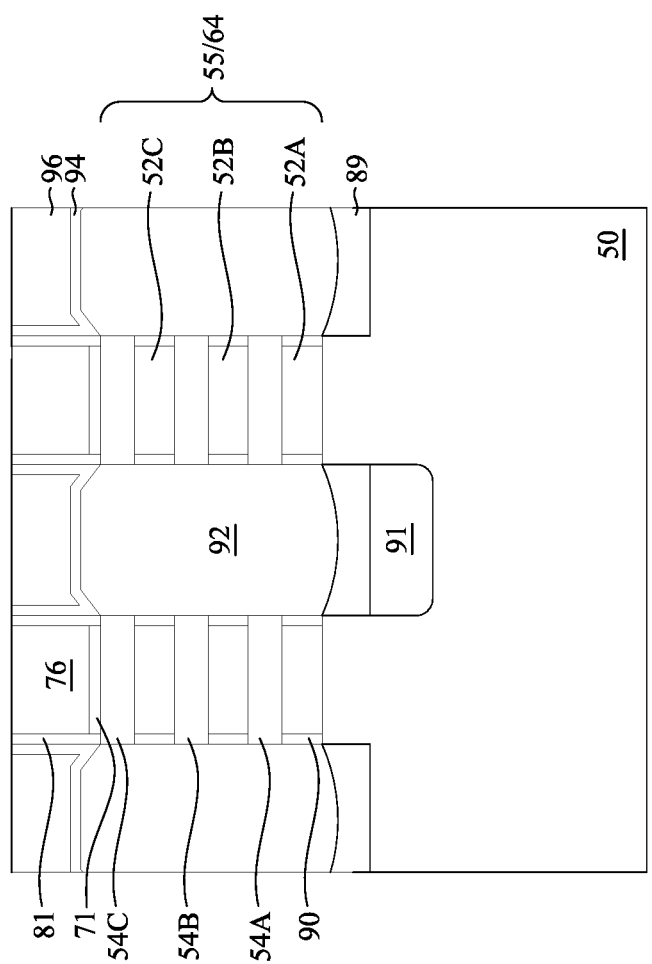

In FIGS. 14A through 14C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 15C:
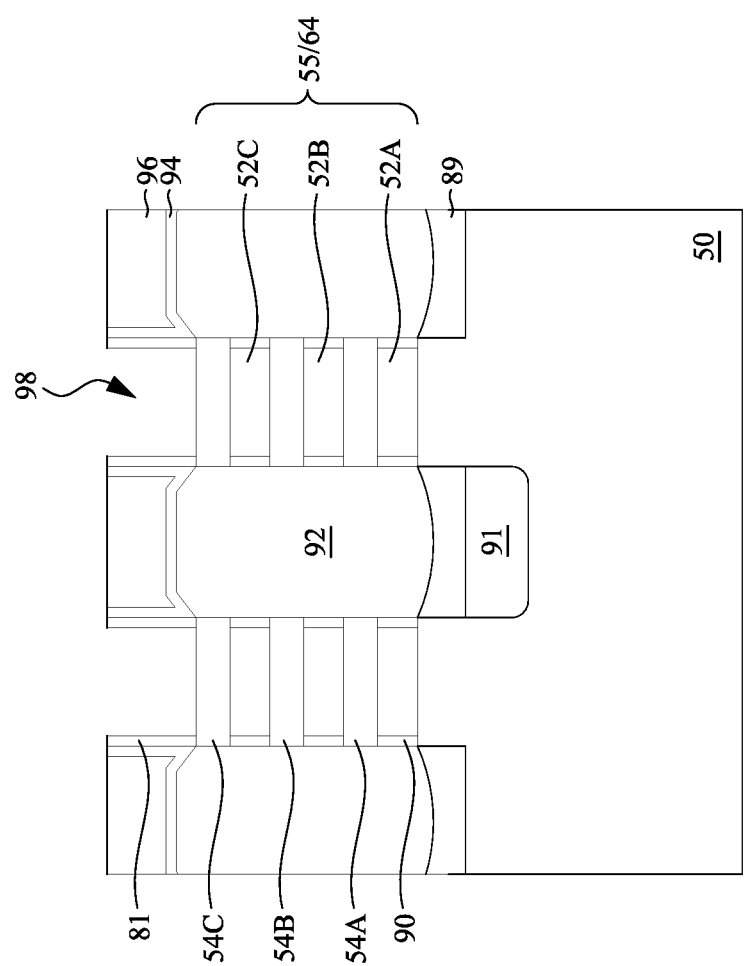

In FIGS. 15A through 15C, the dummy gates 76, and the masks 78 if present, are removed in one or more etching steps, so that third recesses 98 are formed. Portions of the dummy gate dielectrics 60 in the third recesses 98 are also be removed. In some embodiments, the dummy gates 76 and the dummy gate dielectrics 60 are removed by an anisotropic dry etch process. For example, the etching process may include a dry etch process using reaction gas(es) that selectively etch the dummy gates 76 at a faster rate than the first ILD 96 or the first spacers 81. Each of the third recess 98 exposes and/or overlies portions of nanostructures 55, which act as channel regions in subsequently completed nanoFETs. Portions of the nanostructures 55 which act as the channel regions are disposed between neighboring pairs of the epitaxial source/drain regions 93. During the removal, the dummy gate dielectrics 60 may be used as etch stop layers when the dummy gates 76 are etched. The dummy gate dielectrics 60 may then be removed after the removal of the dummy gates 76.

Figure 16B:
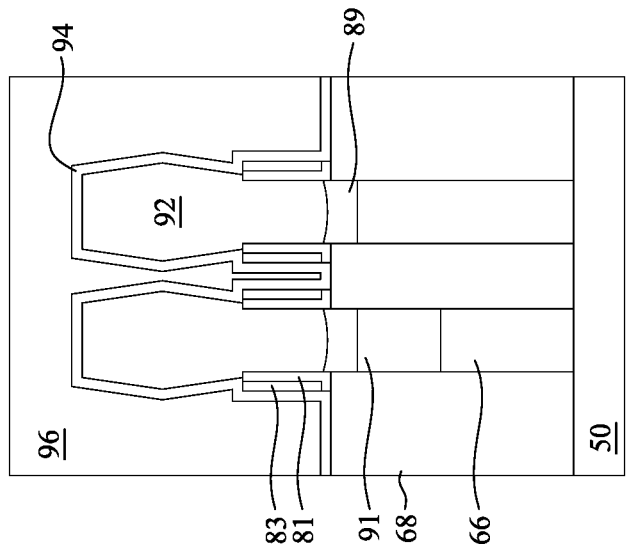
Figure 16A:
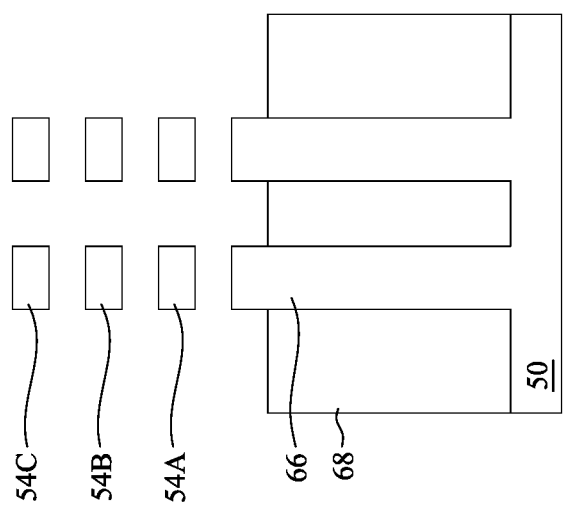
Figure 16C:
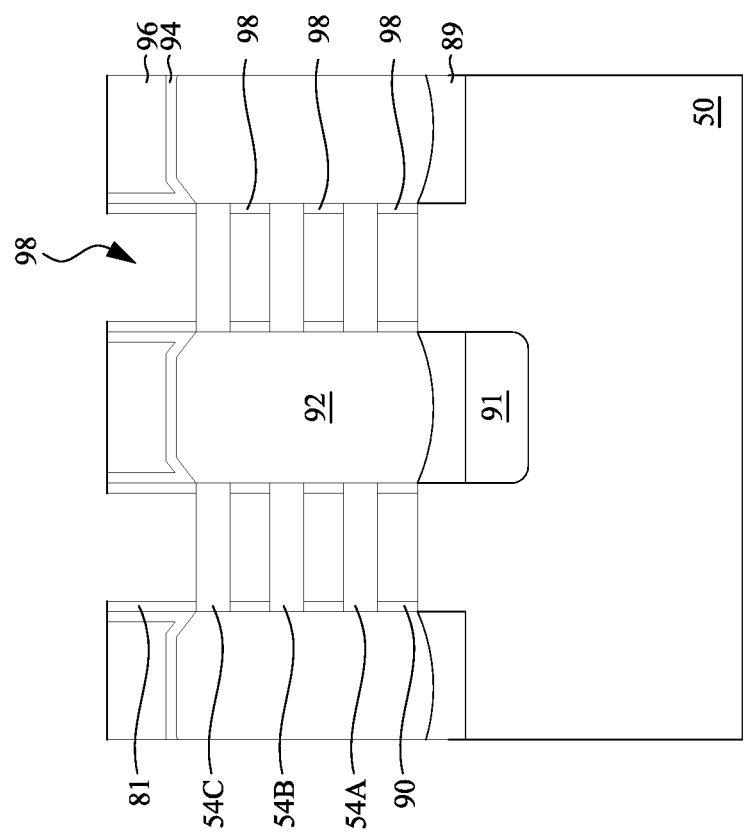

In FIGS. 16A through 16C, the first nanostructures 52 are removed extending the third recesses 98. The first nanostructures 52 may be removed by performing an isotropic etching process such as wet etching or the like using etchants which are selective to the materials of the first nanostructures 52, while the second nanostructures 54, the substrate 50, the STI regions 58 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52.

Figure 17B:
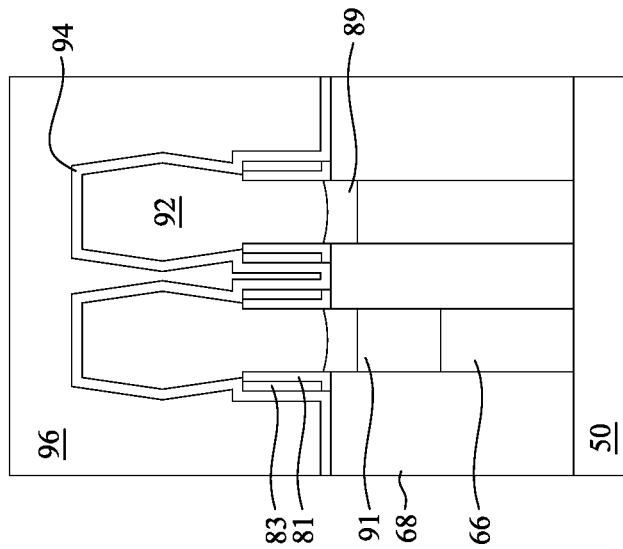
Figure 17A:
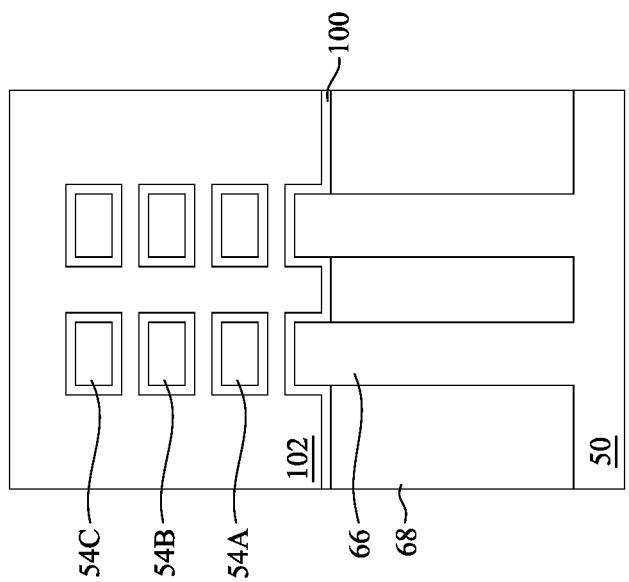
Figure 17C:
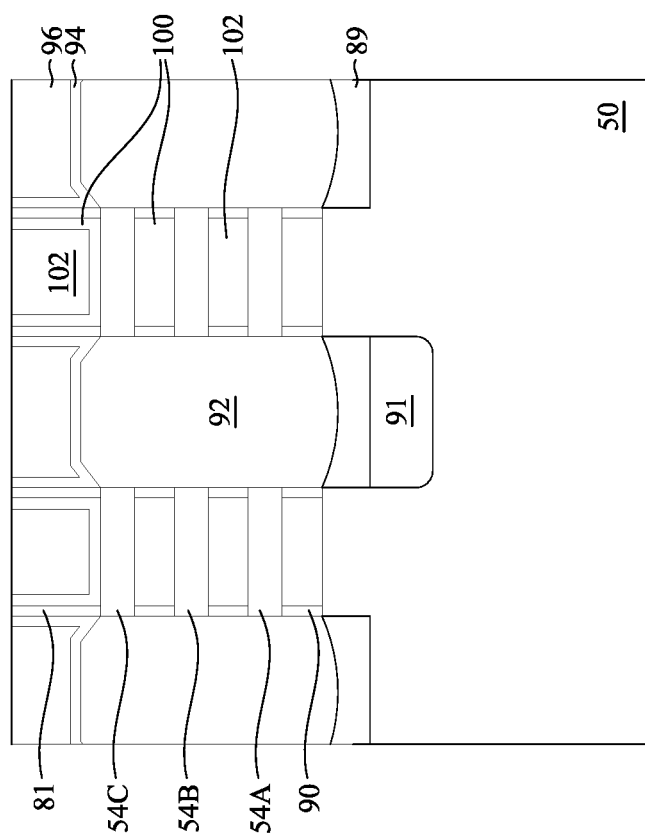

In FIGS. 17A through 17C, gate dielectric layers 100 and gate electrodes 102 are formed for replacement gates. The gate dielectric layers 100 are deposited conformally in the third recesses 98. The gate dielectric layers 100 may be formed on top surfaces and sidewalls of the substrate 50 and on top surfaces, sidewalls, and bottom surfaces of the second nanostructures 54. The gate dielectric layers 100 may also be deposited on top surfaces of the first ILD 96, the CESL 94, the first spacers 81, and the STI regions 68 and on sidewalls of the first spacers 81 and the first inner spacers 89.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the third recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 17A and 17C, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the third recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 18B:
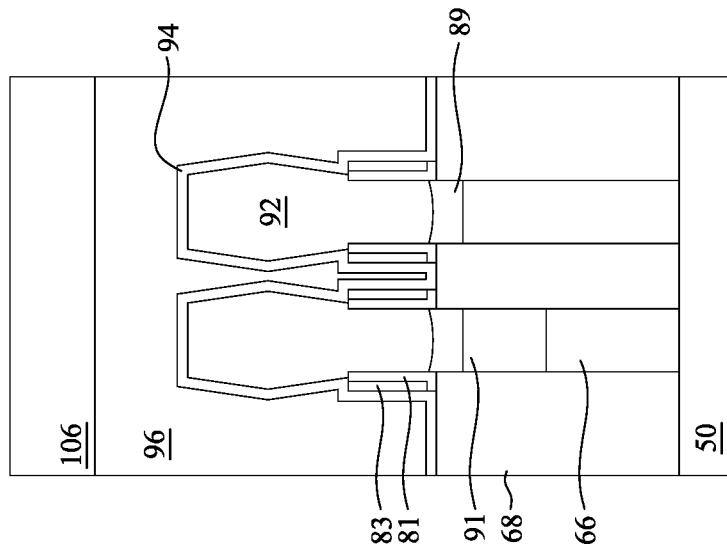
Figure 18A:
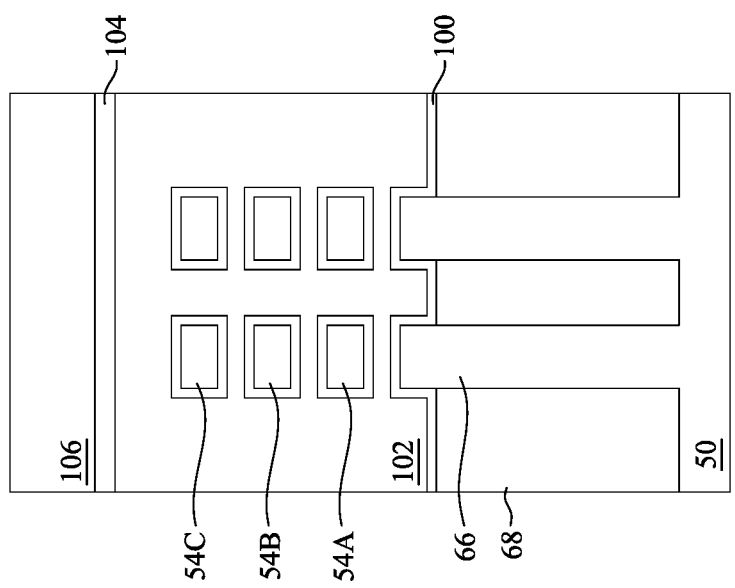
Figure 18C:
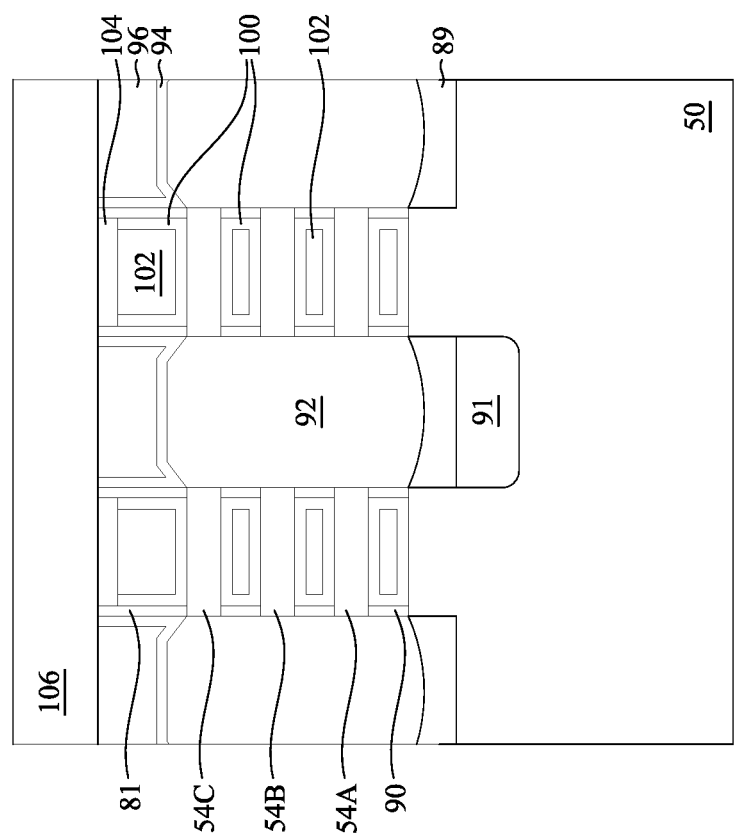

In FIGS. 18A through 18C, the gate structures (including the gate dielectric layers 100 and the corresponding overlying gate electrodes 102) are recessed, so that recess are formed directly over the gate structures and between opposing portions of first spacers 81. Gate masks 104 comprising one or more layers of dielectric material, such as SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, combinations thereof, or the like, are filled in the recesses, followed by a planarization process to remove excess portions of the material extending over the first ILD 96. Subsequently formed gate contacts (such as the gate contacts 114, discussed below with respect to FIGS. 20A through 20C) penetrate through the gate masks 104 to contact the top surfaces of the recessed gate electrodes 102. In some embodiments, a thickness of the gate masks 104 (e.g., measured between top and bottom surfaces) may be 50 nm or less, and a width of the gate masks 104 (e.g., measured between opposing sidewalls) may be in a range of about 5 nm to about 30 nm. In other embodiments, the gate masks 104 may have a different dimension.

As further illustrated by FIGS. 18A through 18C, a second ILD 106 is deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 19B:
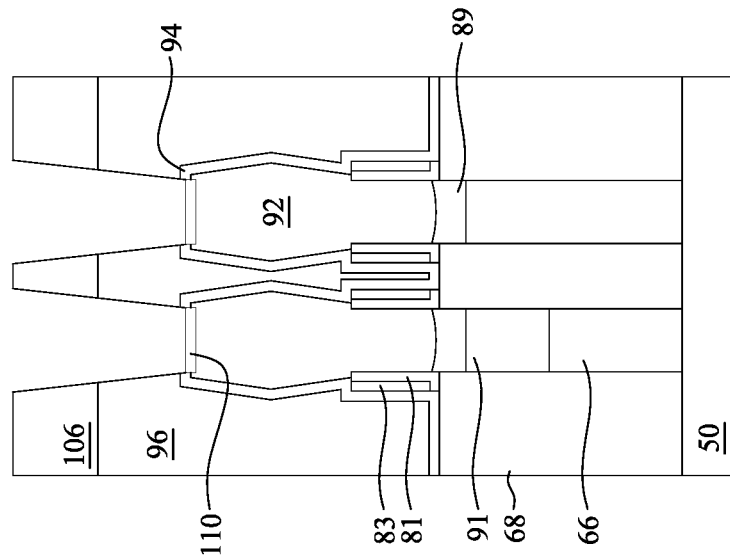
Figure 19A:
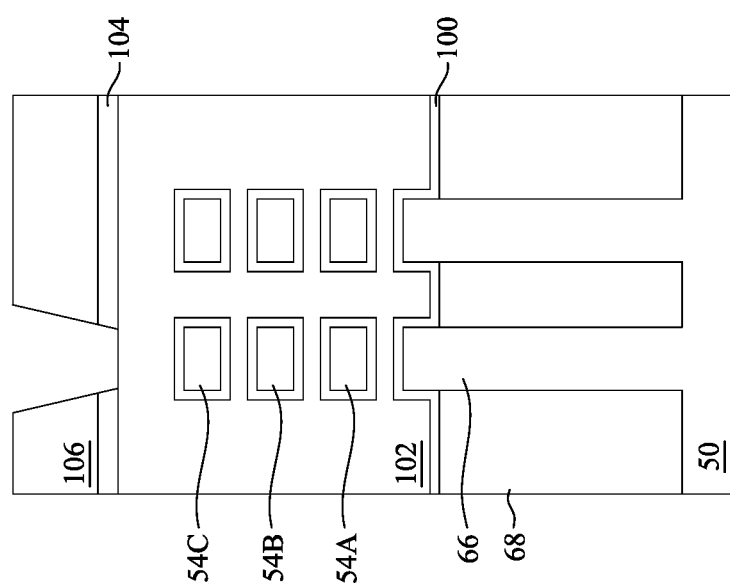
Figure 19C:
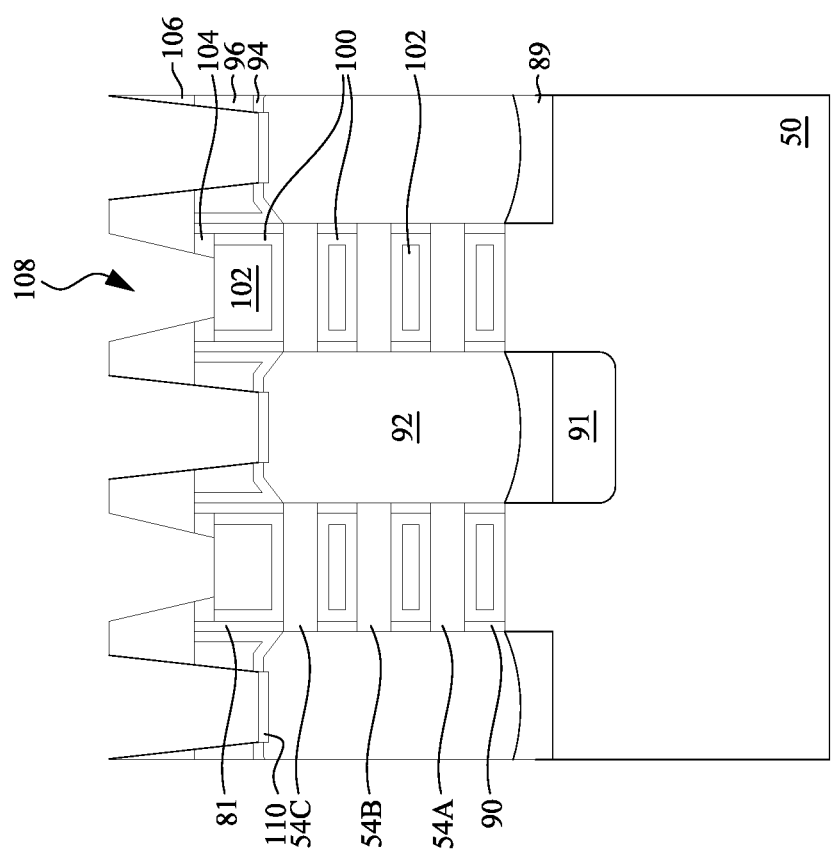

In FIGS. 19A through 19C, the second ILD 106, the first ILD 96, the CESL 94, and the gate masks 104 are etched to form fourth recesses 108 exposing surfaces of the epitaxial source/drain regions 93 and/or the gate structures. The fourth recesses 108 may be formed by etching using an anisotropic etching process, such as RIE, NBE, or the like. In some embodiments, the fourth recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the fourth recesses 108 extend into the epitaxial source/drain regions 93 and/or the gate structures, and a bottom of the fourth recesses 108 may be level with (e.g., at a same level, or having a same distance from the substrate 50), or lower than (e.g., closer to the substrate 50) the epitaxial source/drain regions 93 and/or the gate structures. Although FIG. 19C illustrates the fourth recesses 108 as exposing the epitaxial source/drain regions 93 and the gate structures in a same cross-section, in various embodiments, the epitaxial source/drain regions 93 and the gate structures may be exposed in different cross-sections, thereby reducing the risk of shorting subsequently formed contacts.

After the fourth recesses 108 are formed, first silicide regions 110 are formed over the epitaxial source/drain regions 93. In some embodiments, the first silicide regions 110 are formed by first depositing a metal (not separately illustrated) capable of reacting with the semiconductor materials of the underlying epitaxial source/drain regions 93 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 93, then performing a thermal anneal process to form the first silicide regions 110. The un-reacted portions of the deposited metal are then removed, e.g., by an etching process. Although the first silicide regions 110 are referred to as silicide regions, the first silicide regions 110 may also be germanide regions, or silicon germanide regions (e.g., regions comprising silicide and germanide). In an embodiment, the first silicide regions 110 comprise TiSi, CrSi, TaSi, MoSi, ZrSi, HfSi, ScSi, YSi, HoSi, TbSi, GdSi, LuSi, DySi, ErSi, YbSi, or the like in the n-type region 50N, and the first silicide regions 110 comprise NiSi, CoSi, MnSi, WSi, FeSi, RhSi, PdSi, RuSi, PtSi, IrSi, OsSi, or the like in the p-type region 50P. The first silicide regions 110 has a thickness in a range between about 1 nm and about 10 nm in some embodiments.

Figure 20B:
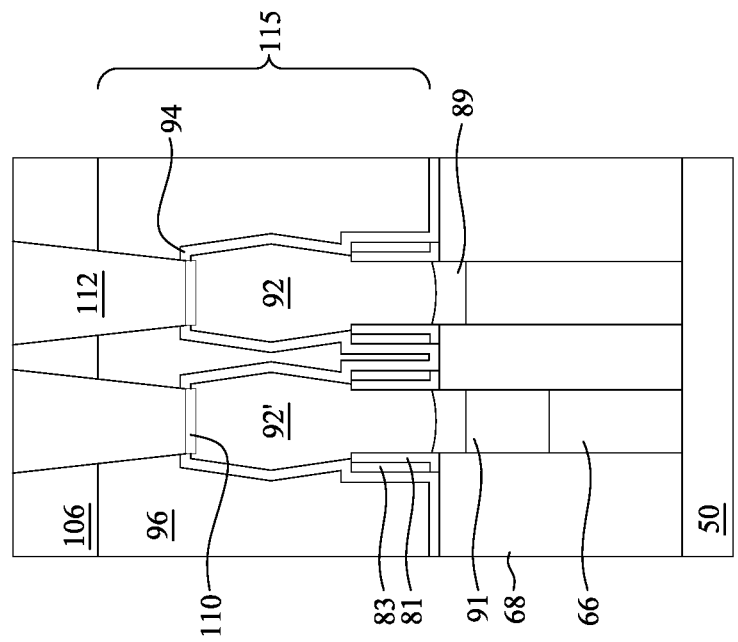
Figure 20A:
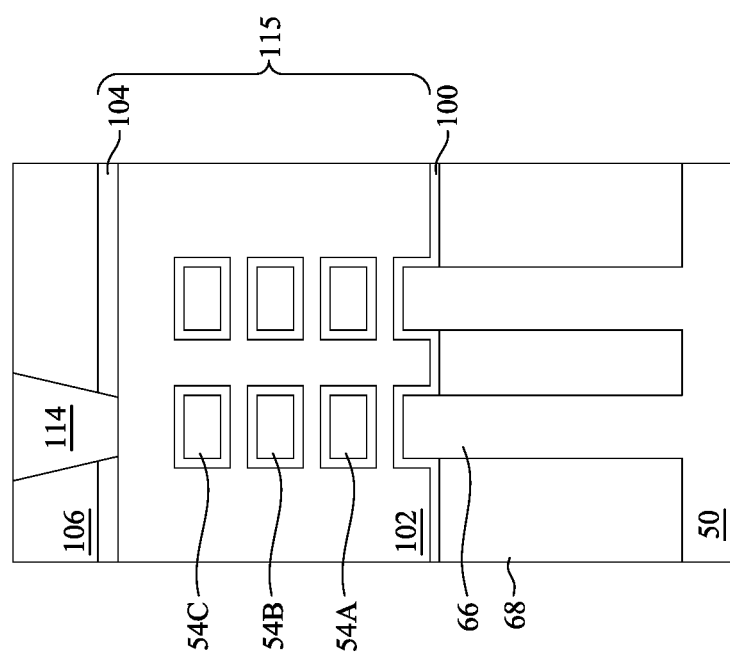
Figure 20C:
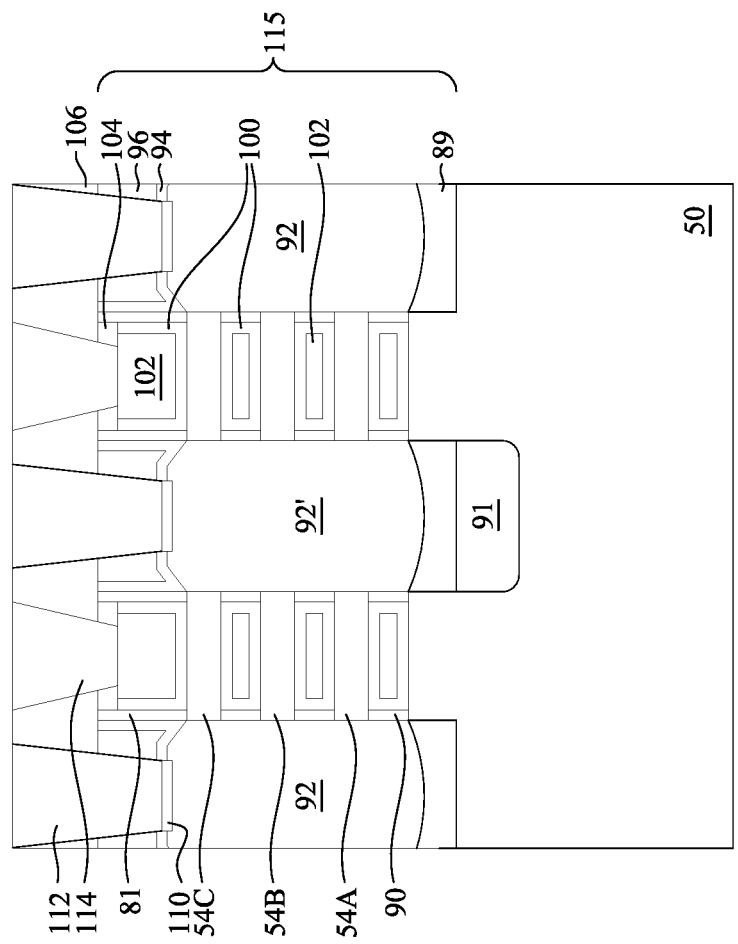

In FIGS. 20A through 20C, source/drain contacts 112 and gate contacts 114 (also referred to as contact plugs) are formed in the fourth recesses 108. The source/drain contacts 112 and the gate contacts 114 may each comprise one or more layers, such as barrier layers, diffusion layers, and fill materials. For example, in some embodiments, the source/drain contacts 112 and the gate contacts 114 each include a barrier layer and a conductive material, and are each electrically coupled to an underlying conductive feature (e.g., a gate electrode 102 and/or a first silicide region 110). The gate contacts 114 are electrically coupled to the gate electrodes 102 and the source/drain contacts 112 are electrically coupled to the first silicide regions 110. The barrier layer may include titanium, titanium nitride, tantalum, tantalum nitride, or the like. The conductive material may be copper, a copper alloy, silver, gold, tungsten, cobalt, ruthenium, aluminum, nickel, titanium, titanium nitride, tantalum, tantalum nitride, molybdenum, nickel, or the like. A planarization process, such as a CMP, may be performed to remove excess material from surfaces of the second ILD 106. The epitaxial source/drain regions 93, the second nanostructures 54, and the gate structures (including the gate dielectric layers 100 and the gate electrodes 102) may collectively be referred to as a transistor structure. The transistor structures may be formed in a device layer 115, with a first interconnect structure (such as the front-side interconnect structure 120, discussed below with respect to FIGS. 21A through 21C) being formed over a front-side thereof and a second interconnect structure (such as the backside interconnect structure 136, discussed below with respect to FIGS. 28A through 28C) being formed over a backside thereof. Although the device layer 115 is described as having nano-FETs, other embodiments may include a device layer 115 having different types of transistors (e.g., planar FETs, finFETs, thin film transistors (TFTs), or the like).

Although FIGS. 20A through 20C illustrate a source/drain contact 112 extending to each of the epitaxial source/drain regions 92, the source/drain contacts 112 may be omitted from certain ones of the epitaxial source/drain regions 92 (labeled source/drain regions 92'). The source/drain regions 92' may correspond to source/drain regions formed directly over the first epitaxial regions 91. For example, as explained in greater detail below, conductive features (e.g., backside vias or power rails) may be subsequently attached through a backside of one or more of the epitaxial source/drain regions 92. For these particular epitaxial source/drain regions 92, the source/drain contacts 112 may be omitted or may be replaced with dummy contacts that are not electrically connected to any overlying conductive lines (such as the first conductive features 122, discussed below with respect to FIGS. 22A through 22C).

Figure 20D:
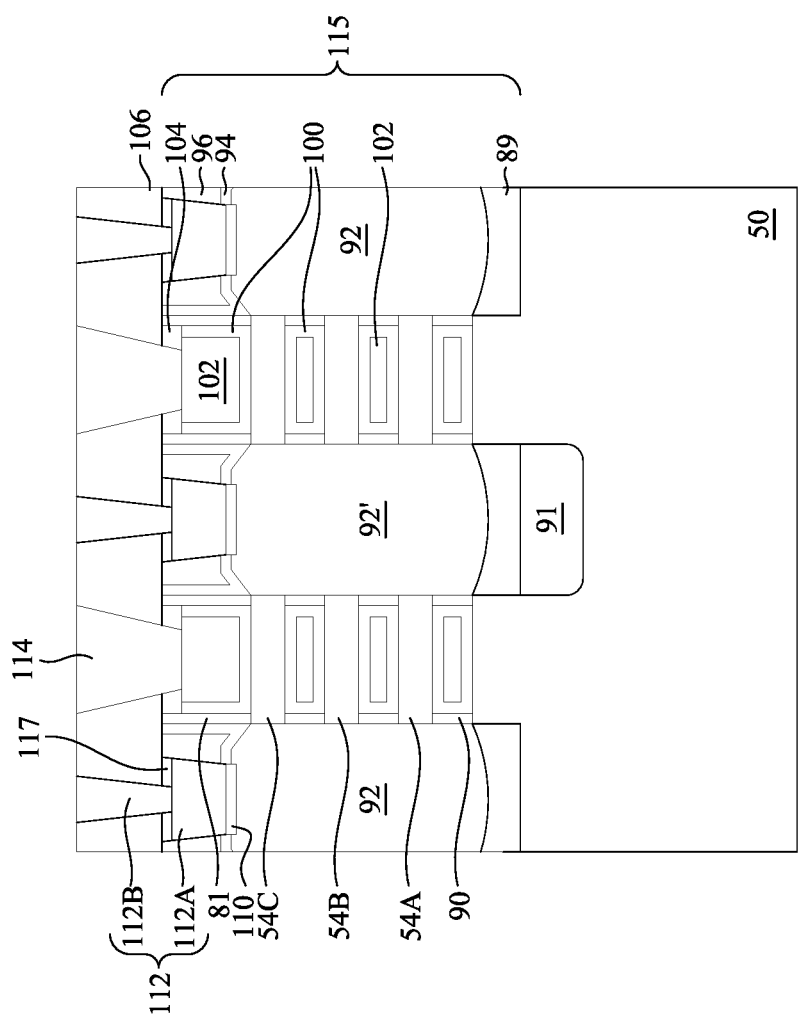

FIG. 20D illustrates a cross-sectional view along cross-section C-C' of FIG. 1 of a device according to some other embodiments. The embodiment of FIG. 20D may be similar to the embodiments described above with respect to FIGS. 20A through 20C where like reference numerals indicate like elements formed using like processes. However, in FIG. 20D, the source/drain contacts 112 may have a composite structure and may each include a first contact 112A in the first ILD 96 and a second contact 112B in the second ILD 106. In various embodiments, the first contacts 112A may be formed in the first ILD 96 prior to depositing the second ILD 106, and the first contacts 112A may be recessed from a top surface of the first ILD 96. After the first contacts 112A are recessed, insulating masks 117 may be deposited to cover the first contacts 112A. The first contacts 112A may comprise W, Ru, Co, Cu, Ti, TiN, Ta, TaN, Mo, Ni, combinations thereof, or the like and may have a thickness (e.g., measured between opposing sidewalls) in a range of about 1 nm to about 50 nm. The insulating masks 117 may comprise SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, combinations thereof, or the like. In some embodiments, a material of the insulating masks 117 may be different than a material of the gate masks 104 such that the insulating mask 117 and the gate masks 104 may be etched selectively to each other. In this manner, the second contacts 112B and gate contacts 114 may be formed independently from each other.

Subsequently, the second ILD 106 is deposited over the insulating masks 117 and the first contacts 112A as described above. After the second ILD 106 is deposited, second contacts 112B may be formed to extend through the second ILD 106, extend through the insulating masks 117, and electrically connect to the first contacts 112A. The second contacts 112B may further extend partially into and be embedded in the first contacts 112A. The second contacts 112B may comprise W, Ru, Co, Cu, Ti, TiN, Ta, TaN, Mo, Ni, combinations thereof, or the like and may have a thickness (e.g., measured between opposing sidewalls) in a range of about 1 nm to about 50 nm. A thickness of the second contacts 112B may be the same or different than a thickness of the first contacts 112A, and a material of the second contacts 112B may be the same or different than a material of the first contacts 112A. Thus, composite source/drain contacts 112 comprising the first contacts 112A and the second contacts 112B can be formed. The following process steps are described with respect to the embodiment of FIGS. 20A through 20C for ease of illustration, but it should be understood that they are equally applicable to the embodiment of FIG. 20D. Other configurations of the source/drain contact 112 are also possible in other embodiments.

FIGS. 21A through 29C illustrate intermediate steps of forming front-side interconnect structures and backside interconnect structures on the device layer 115. The front-side interconnect structures and the backside interconnect structures may each comprise conductive features that are electrically connected to the nano-FETs formed on the substrate 50. FIGS. 21A, 22A, 23A, 24A, 25A, 26A, 27A, 28A, and 29A illustrate reference cross-section A-A' illustrated in FIG. 1. FIGS. 21B, 22B, 23B, 24B, 25B, 26B, 27B, 28B, and 29B illustrate reference cross-section B-B' illustrated in FIG. 1. FIGS. 21C, 22C, 23C, 24C, 25C, 26C, 27C, 28C, and 29C illustrate reference cross-section C-C' illustrated in FIG. 1. The process steps described in FIGS. 21A through 29C may be applied to one or both of the n-type region 50N and the p-type region 50P. As noted above, a back-side conductive feature (e.g., a backside via) may be connected to one or more of the epitaxial source/drain regions 92'. As such, the source/drain contacts 112 may be optionally omitted from the epitaxial source/drain regions 92'.

Figure 21B:
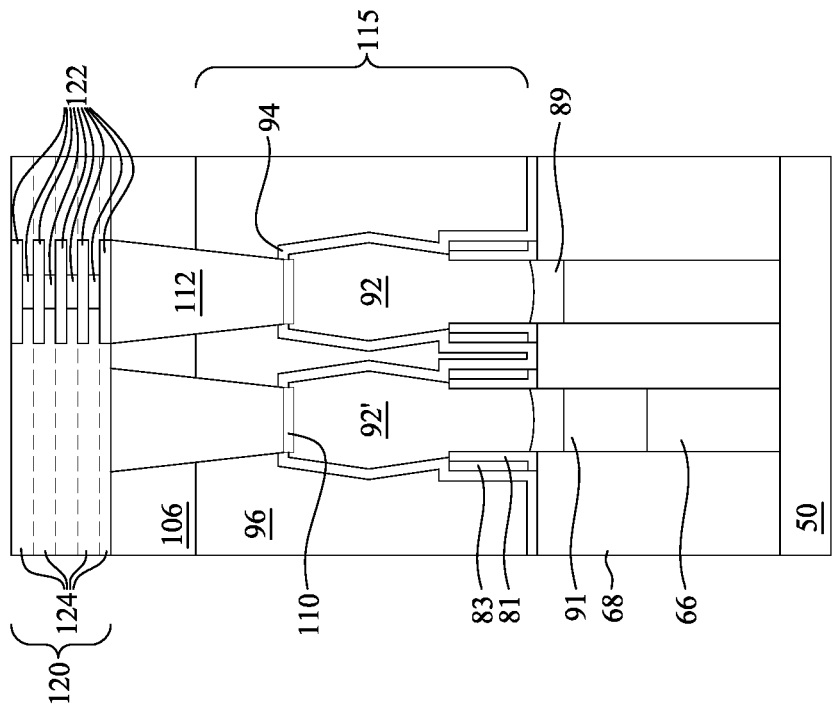
Figure 21A:
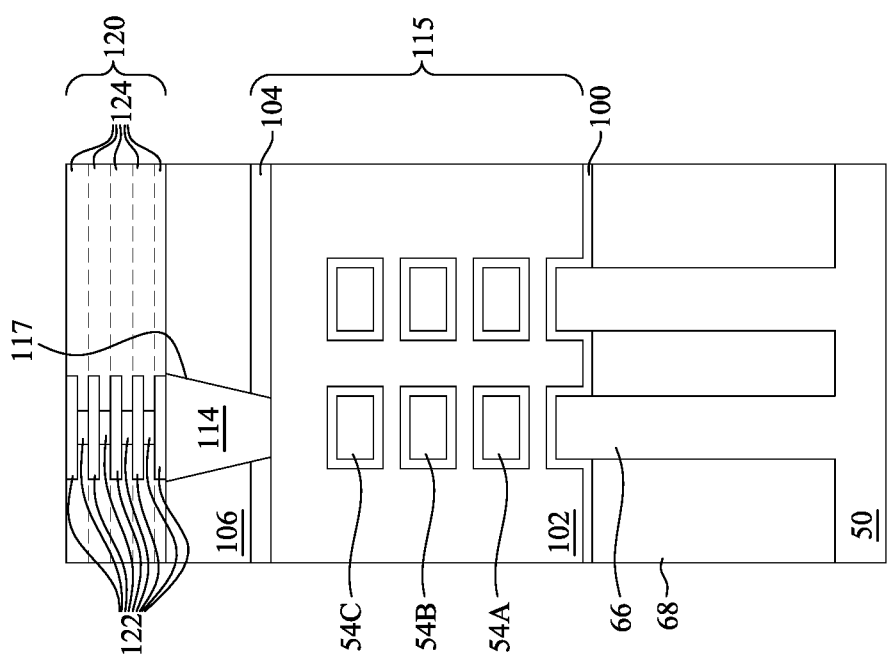
Figure 21C:
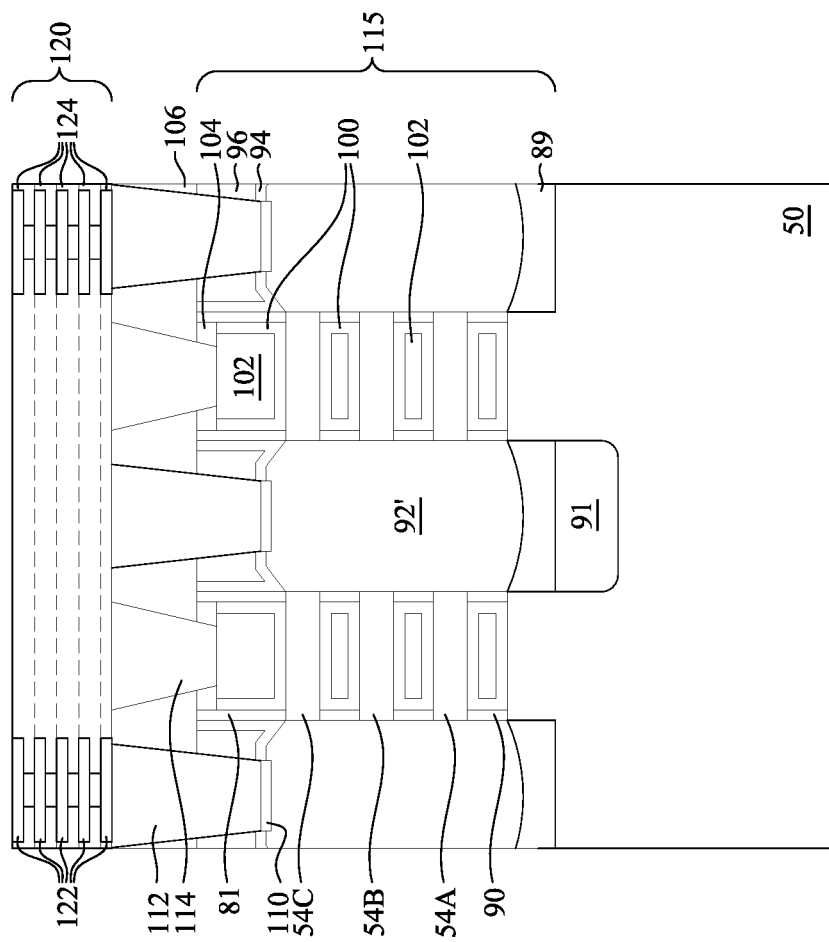

In FIGS. 21A through 21C, a front-side interconnect structure 120 is formed on the second ILD 106. The front-side interconnect structure 120 may be referred to as a front-side interconnect structure because it is formed on a front-side of the device layer 115 (e.g., a side of the device layer 115 having the gate electrodes 102).

The front-side interconnect structure 120 may comprise one or more layers of first conductive features 122 formed in one or more stacked first dielectric layers 124. Each of the stacked first dielectric layers 124 may comprise a dielectric material, such as a low-k dielectric material, an extra low-k (ELK) dielectric material, or the like. The first dielectric layers 124 may be deposited using an appropriate process, such as, CVD, ALD, PVD, PECVD, or the like.

The first conductive features 122 may comprise conductive lines and conductive vias interconnecting the layers of conductive lines. The conductive vias may extend through respective ones of the first dielectric layers 124 to provide vertical connections between layers of the conductive lines. The first conductive features 122 may be formed through any acceptable process, such as, a damascene process, a dual damascene process, or the like.

In some embodiments, the first conductive features 122 may be formed using a damascene process in which a respective first dielectric layer 124 is patterned utilizing a combination of photolithography and etching techniques to form trenches corresponding to the desired pattern of the first conductive features 122. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the first conductive features 122 may be formed by depositing a seed layer of copper or a copper alloy, and filling the trenches by electroplating. A chemical mechanical planarization (CMP) process or the like may be used to remove excess conductive material from a surface of the respective first dielectric layer 124 and to planarize surfaces of the first dielectric layer 124 and the first conductive features 122 for subsequent processing.

FIGS. 21A through 21C illustrate five layers of the first conductive features 122 and the first dielectric layers 124 in the front-side interconnect structure 120. However, it should be appreciated that the front-side interconnect structure 120 may comprise any number of first conductive features 122 disposed in any number of first dielectric layers 124. The front-side interconnect structure 120 may be electrically connected to the gate contacts 114 and the source/drain contacts 112 to form functional circuits. In some embodiments, the functional circuits formed by the front-side interconnect structure 120 may comprise logic circuits, memory circuits, image sensor circuits, or the like.

Figure 22C:
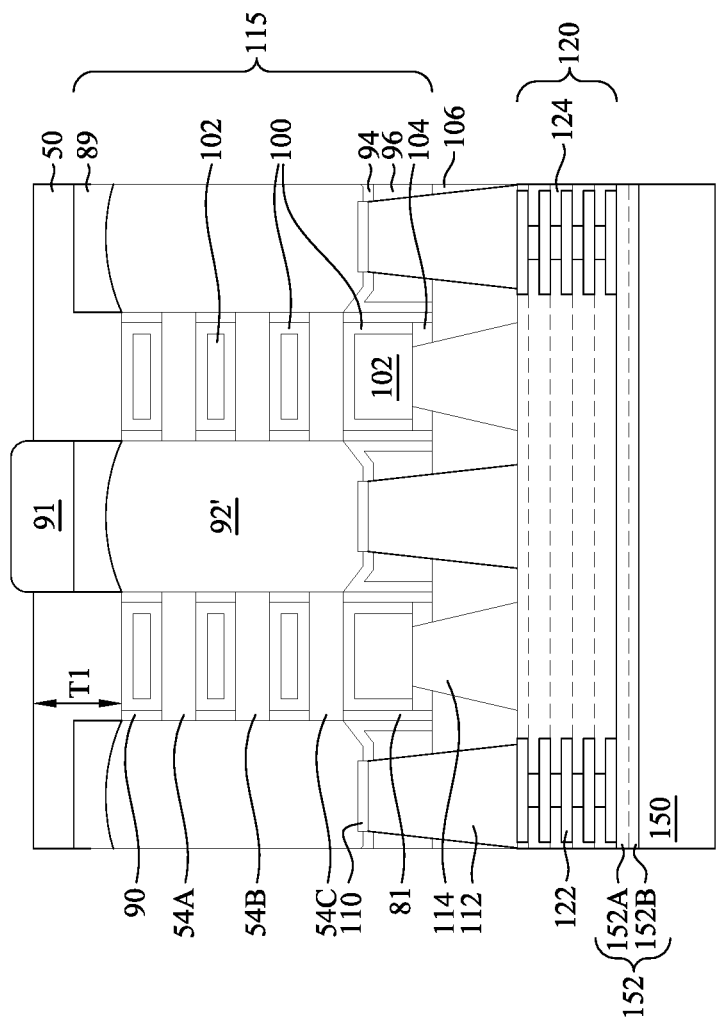

In FIGS. 22A through 22C, a carrier substrate 150 is bonded to a top surface of the front-side interconnect structure 120 by a first bonding layer 152A and a second bonding layer 152B (collectively referred to as a bonding layer 152). The carrier substrate 150 may be a glass carrier substrate, a ceramic carrier substrate, a wafer (e.g., a silicon wafer), or the like. The carrier substrate 150 may provide structural support during subsequent processing steps and in the completed device.

In various embodiments, the carrier substrate 150 may be bonded to the front-side interconnect structure 120 using a suitable technique, such as dielectric-to-dielectric bonding, or the like. The dielectric-to-dielectric bonding may comprise depositing the first bonding layer 152A on the front-side interconnect structure 120. In some embodiments, the first bonding layer 152A comprises silicon oxide (e.g., a high density plasma (HDP) oxide, or the like) that is deposited by CVD, ALD, PVD, or the like. The second bonding layer 152B may likewise be an oxide layer that is formed on a surface of the carrier substrate 150 prior to bonding using, for example, CVD, ALD, PVD, thermal oxidation, or the like. Other suitable materials may be used for the first bonding layer 152A and the second bonding layer 152B.

The dielectric-to-dielectric bonding process may further include applying a surface treatment to one or more of the first bonding layer 152A and the second bonding layer 152B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 152. The carrier substrate 150 is then aligned with the front-side interconnect structure 120 and the two are pressed against each other to initiate a pre-bonding of the carrier substrate 150 to the front-side interconnect structure 120. The pre-bonding may be performed at room temperature (e.g., between about 21° C. and about 25° C.). After the pre-bonding, an annealing process may be applied by, for example, heating the front-side interconnect structure 120 and the carrier substrate 150 to a temperature of about 170° C. to about 500° C. for example.

Further in FIGS. 22A through 22C, after the carrier substrate 150 is bonded to the front-side interconnect structure 120, the device may be flipped such that a backside of the transistor structures 109 faces upwards. The backside of the transistor structures 109 may refer to a side opposite to the front-side of the device layer 105 on which gate electrodes 102 of the active devices are formed.

A thinning process may then be applied to the backside of the substrate 50. The thinning process may comprise a planarization process (e.g., a mechanical grinding, a CMP, or the like), an etch-back process, or a combination thereof, or the like. In some embodiments, the thinning process includes a combination of a planarization to remove a majority of the substrate 50 followed by an etch back to further recess the substrate 50. The thinning process may expose surfaces of the first epitaxial material 91 opposite the front-side interconnect structure 120. For example, the thinning process may etch back the substrate 50 and the STI regions 68 below top surfaces of the first epitaxial regions 91. In some embodiments, the etch back process may be a plasma etching process which uses, $O_2$, $Cl_2$, HCl, HBr, combinations thereof, or the like to etch the substrate 60. Further, the etch back process may include an etchant flow rate in a range of about 5 sccm to about 100 sccm; a chamber pressure in a range of about 1 mTorr to about 100 mTorr, and a bias voltage in a range of about 300V to about 1000V. Other etching conditions may be applied in other embodiments.

Further, a portion of the substrate 50 remains over the epitaxial source/drain regions 92 (including the epitaxial source/drain regions 92'), the gate structures (e.g., the gate electrodes 102 and the gate dielectric layers 100), and the second epitaxial material 89 after the thinning process. For example, the remaining portion of the substrate 50 may extend over and cover the second epitaxial material 89 and the gate electrodes 102. In some embodiments, a thickness T1 of remaining portion of the substrate 50 may be in a range of about 5 nm to about 40 nm. It has been observed that by leaving a sufficiently thick portion (e.g., in the above thickness range) of the substrate 50 over the epitaxial source/drain regions 92, the epitaxial source/drain regions 92 may be protected fully during subsequent processes to remove the first epitaxial material 91 and the second epitaxial material 89 over the epitaxial source/drain regions 92'.

Figure 23B:
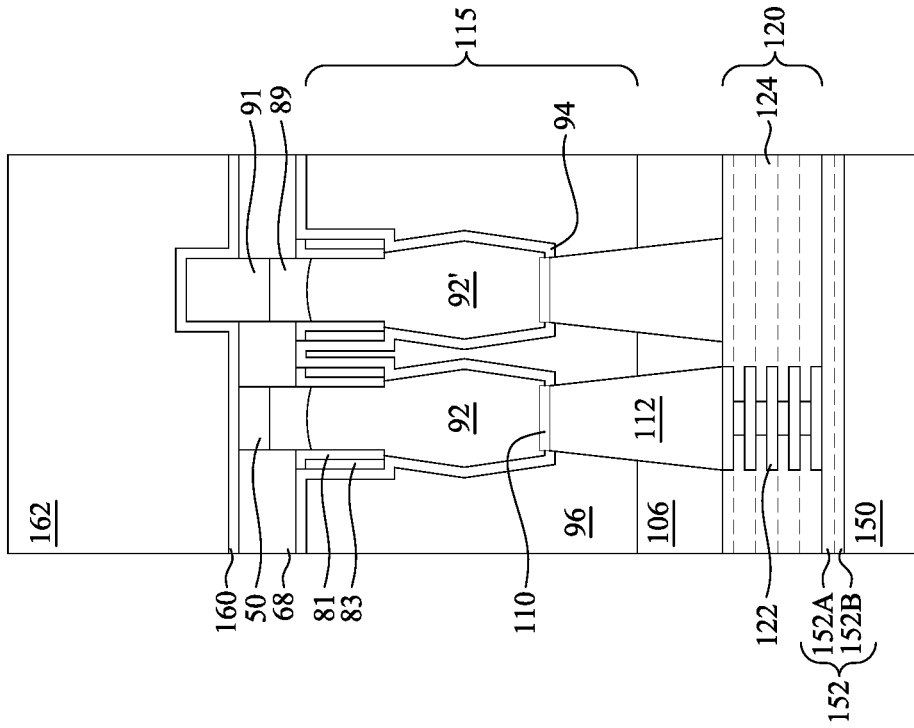
Figure 23A:
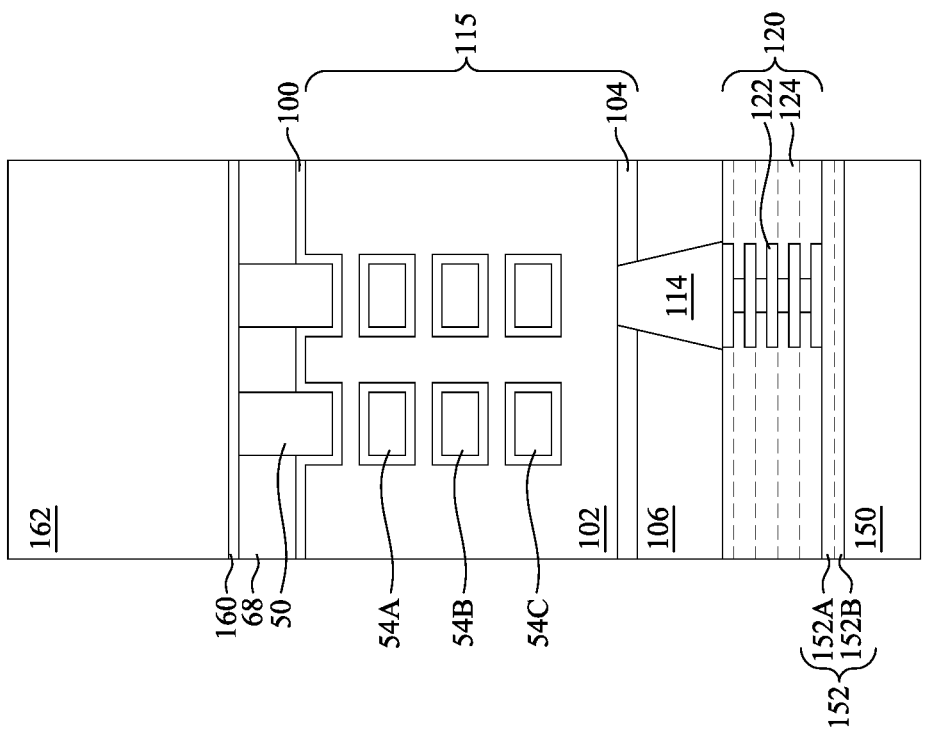
Figure 23C:
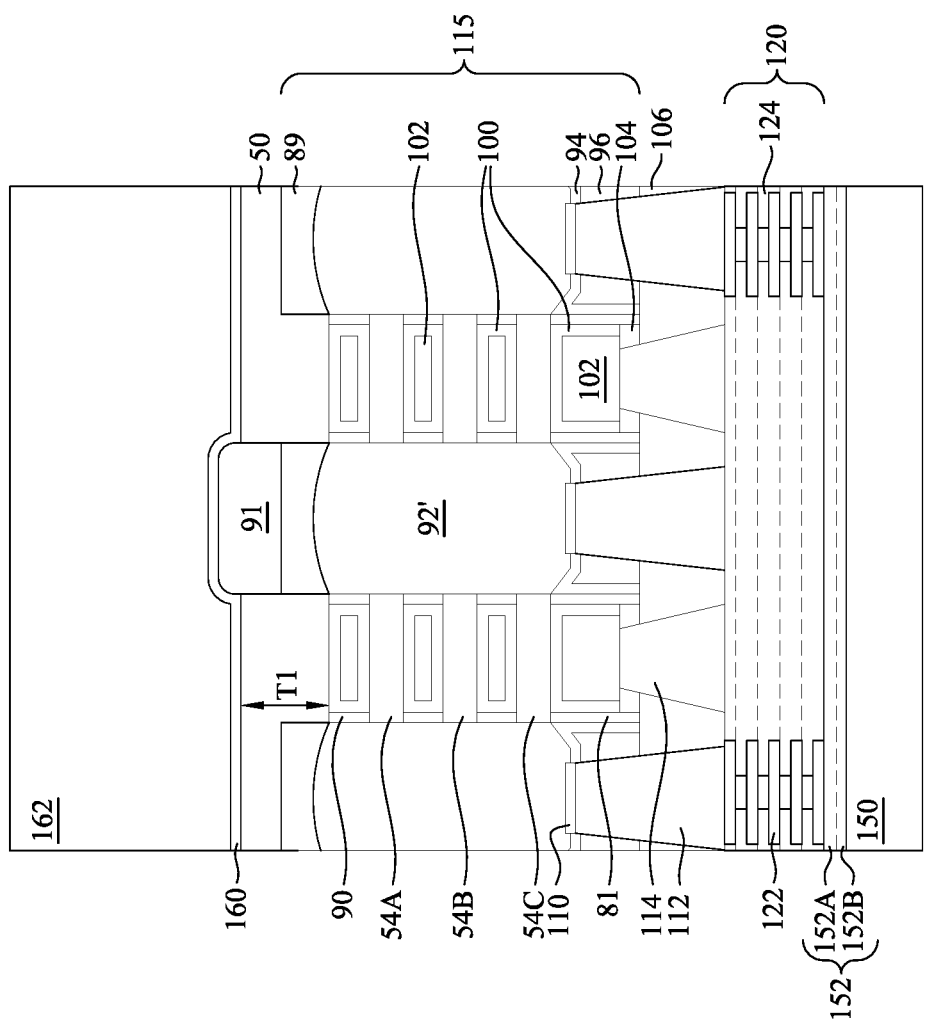

In FIGS. 23A through 23C, one or more insulating materials (e.g., dielectric layer 162) are then deposited on the structure illustrated in FIGS. 22A through 22C. The dielectric layer 162 may be deposited by any suitable method, such as CVD, plasma-enhanced CVD (PECVD), or FCVD. The dielectric layer 162 may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a dielectric liner 160 is disposed between the dielectric layer 162 and the STI regions 68, the semiconductor substrate 50, and the first epitaxial material 91. The dielectric liner 160 may comprise a dielectric material, such as, silicon nitride, silicon oxide, silicon oxynitride, or the like, and may be deposited using a similar process as the dielectric layer 162. In some embodiments, the dielectric liner 160 may be a conformal layer that extends along sidewalls of the first epitaxial material 91, and the dielectric liner 160 may prevent or reduce diffusion between the dielectric layer 162 and the semiconductor substrate 50, the second epitaxial material 89, and/or the source/drain regions 92. In the embodiment of FIGS. 23A through 23C, the semiconductor substrate 150 may full separate the dielectric liner 160 from the second epitaxial material 89 and the epitaxial source/drain regions 92 such that the dielectric liner 160 does not contact either the second epitaxial material 89 or the epitaxial source/drain regions 92.

Figure 24C:
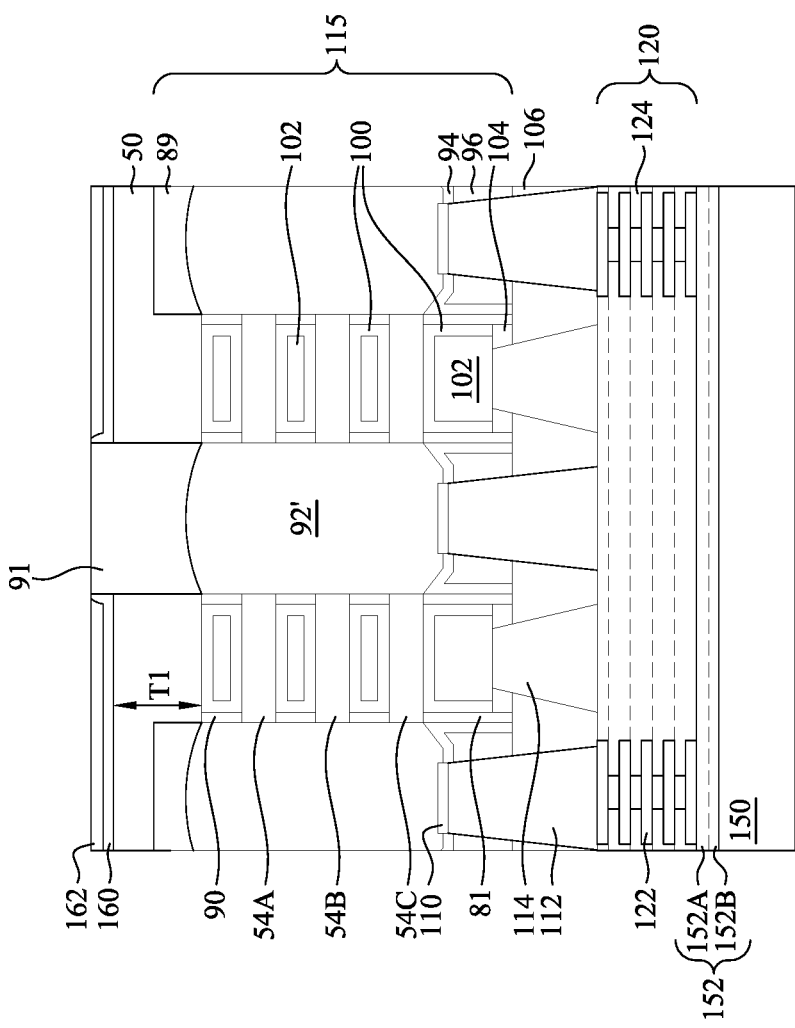

In FIGS. 24A through 24C, a planarization process, such as a CMP, may be performed to level the top surface of the dielectric layer 162 with the top surfaces of the first epitaxial material 91. After the planarization process, top surfaces of dielectric layer 162, the first epitaxial material 91, and the dielectric liner 160 are level within process variations. Accordingly, the top surface of the first epitaxial material 91 is exposed through the oxide layer 162.

Figure 25B:
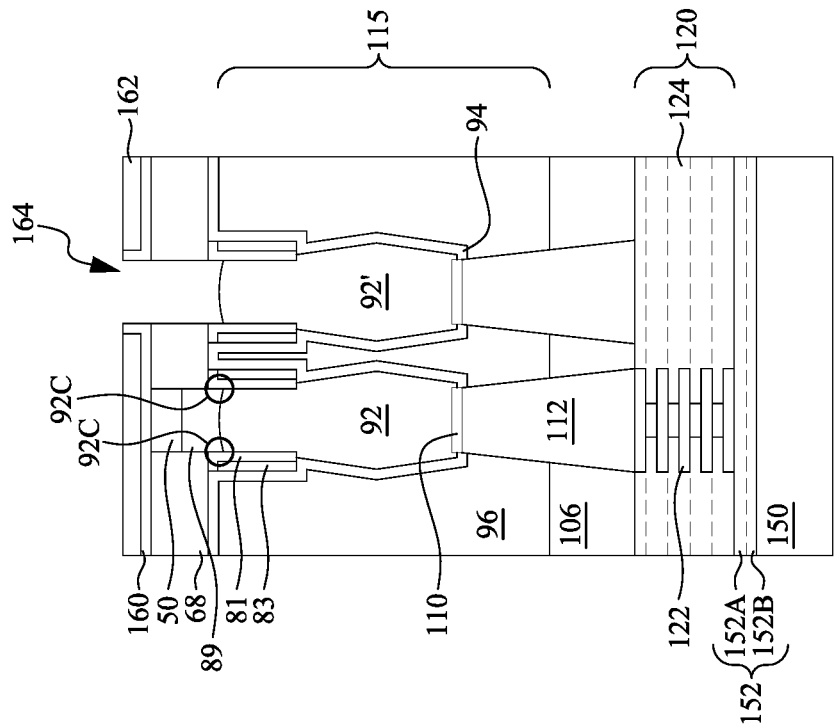
Figure 25A:
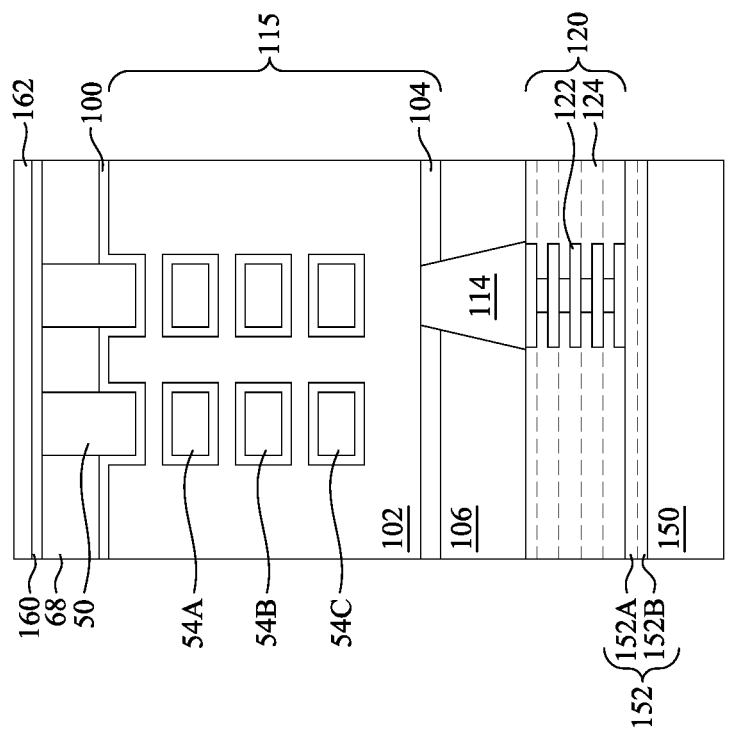
Figure 25C:
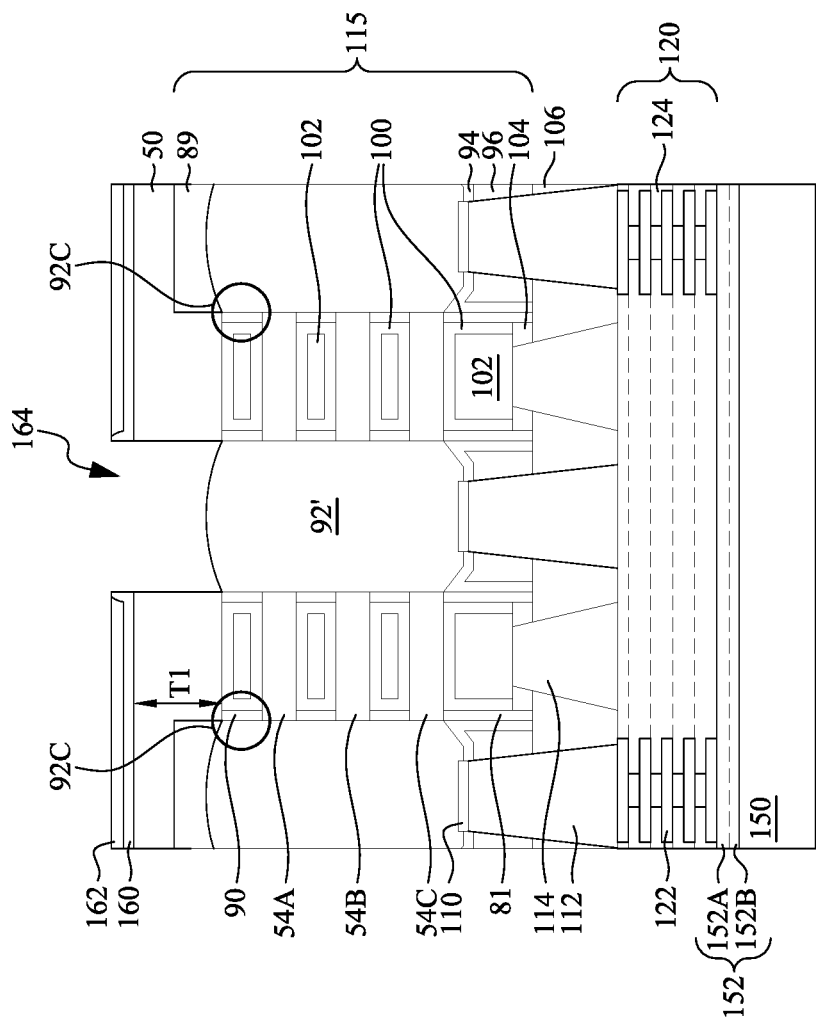

In FIGS. 25A through 25C, the first epitaxial material 91 and portions of the second epitaxial material 89 that covers the epitaxial source/drain regions 92' are removed, so that recesses 164 are formed. The recesses 164 may expose select ones of the epitaxial source/drain regions 92 (denoted as epitaxial source/drain regions 92') through the dielectric layer 162, the dielectric liner 160, the STI regions 68, and the semiconductor substrate 50. In some embodiments, the first epitaxial material 91 and the portions of the second epitaxial material 89 are removed by an anisotropic dry etch process, or the like. For example, the etching process may include a dry etch process using reaction gas(es) that selectively etch the first epitaxial material 91 and portions of the second epitaxial material 89 at a faster rate than dielectric liner 160 and the dielectric layer 162. During the etching processes to remove the first epitaxial material 91 and the portions of the second epitaxial material 89, the semiconductor substrate 50 and remaining portions of the second epitaxial material 89 may mask and protect other epitaxial source/drain regions 92 from being inadvertently etched. In particular, by leaving a portion of the semiconductor substrate 50 from being removed, corner regions 92C of the epitaxial source/drain regions that are otherwise exposed by the second epitaxial material 89 to lateral etching may be protected. As a result, manufacturing defects (e.g., etching damage to the source/drain regions 92) can be reduced, and yield can be increased.

Figure 26B:
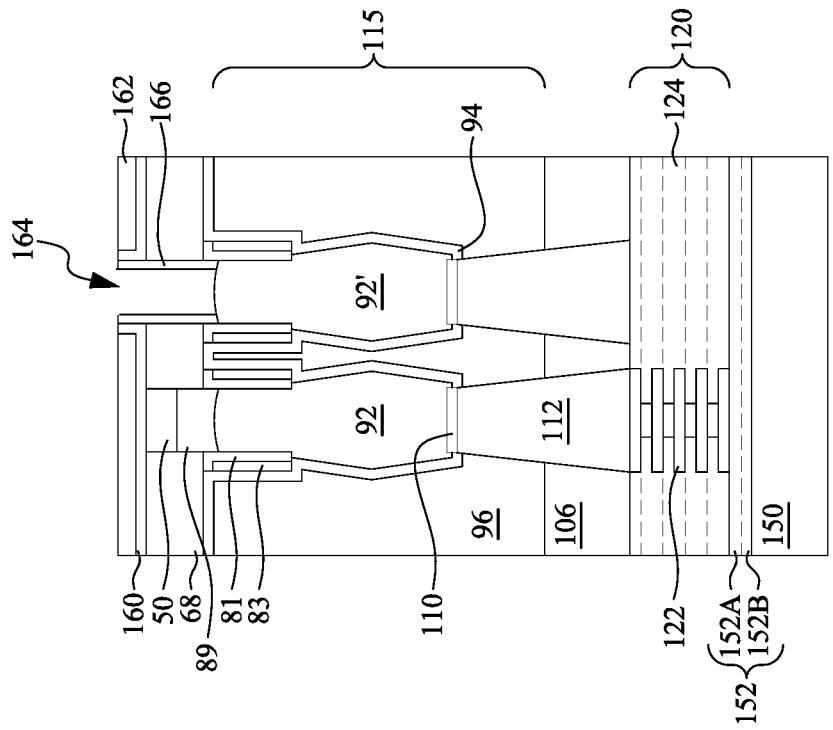
Figure 26A:
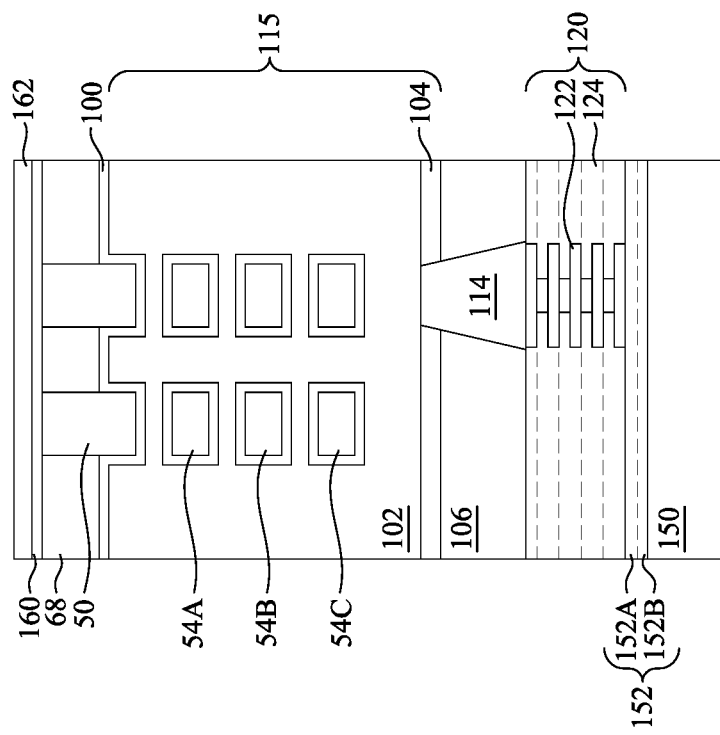
Figure 26C:
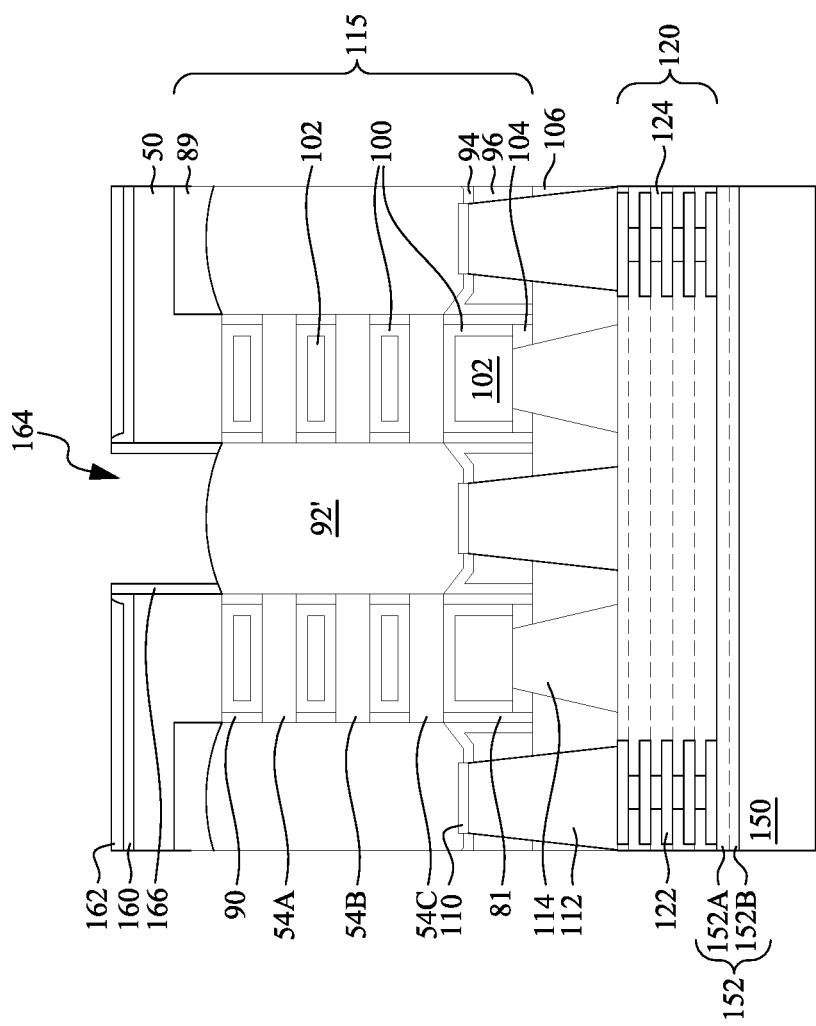

In FIGS. 26A to 26C, insulating spacers 166 are deposited on sidewalls of the recesses 164. The spacers 166 may comprise a dielectric material that is deposited by CVD, ALD, PVD, PECVD, or the like. After deposition, an etching process, such as a dry or wet etching process, may be performed to remove lateral portions of the dielectric material while leaving the dielectric material on the sidewalls of the recesses 164, thereby forming the spacers 166. The etching process may be anisotropic, and the dielectric material may be selected to be different than the dielectric layer 162. As such, the etching process may selectively etch the dielectric material without significantly etching the dielectric layer 162. For example, the dielectric material may be silicon oxide, silicon nitride, silicon oxynitride, combinations thereof, or the like.

Figure 27B:
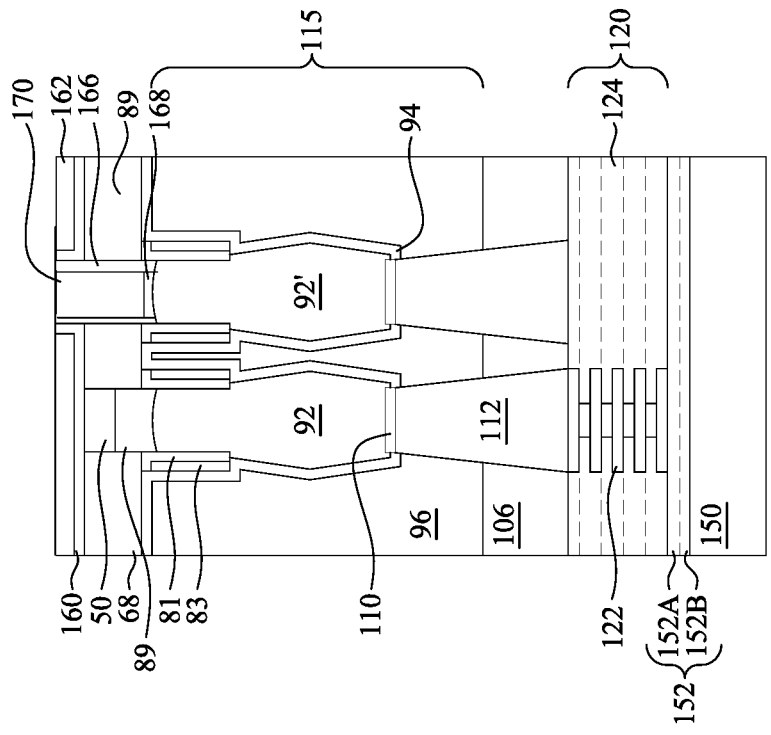
Figure 27A:
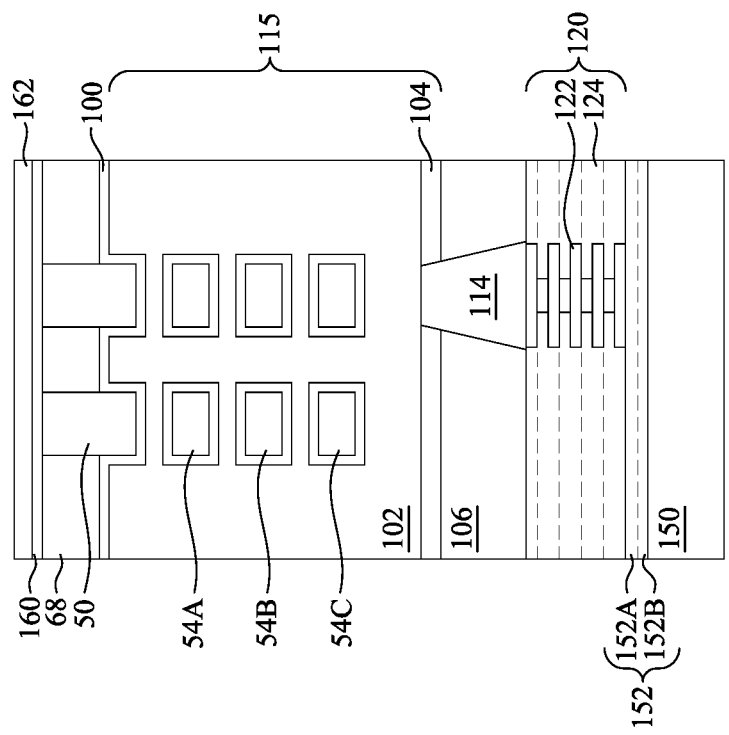
Figure 27C:
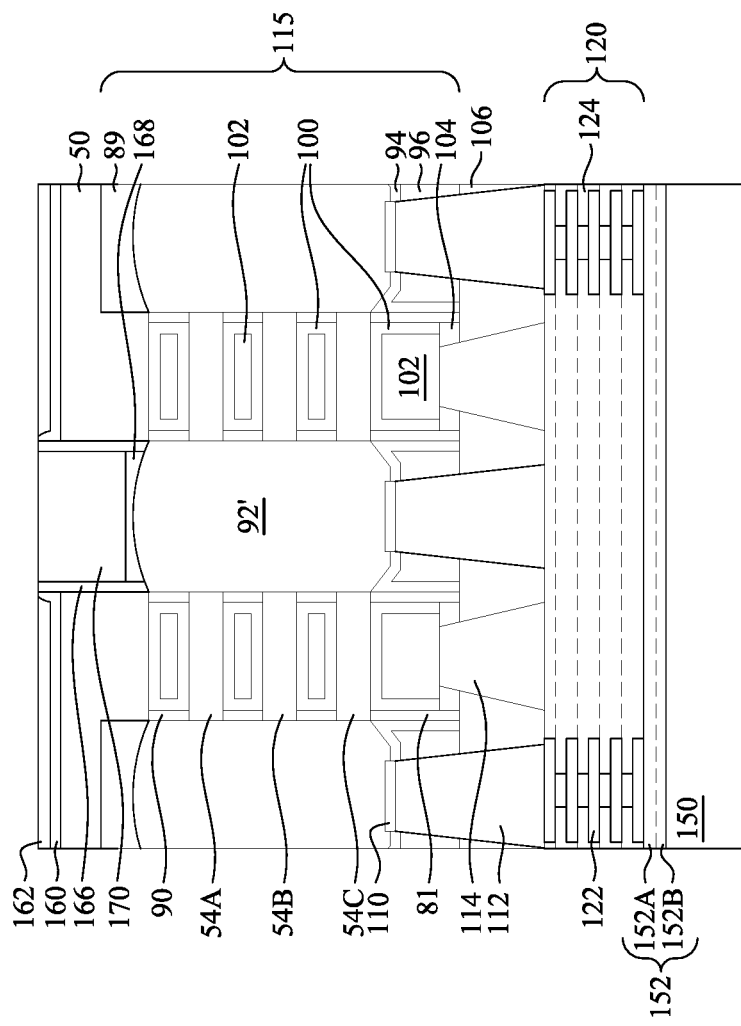

In FIGS. 27A through 27C, second silicide regions 168 are formed in the recesses 164 on backsides of the epitaxial source/drain regions 92'. The second silicide regions 168 may be formed using a like process as the first silicide regions 110. Further, the second silicide regions 168 may comprise TiSi, CrSi, TaSi, MoSi, ZrSi, HfSi, ScSi, YSi, HoSi, TbSi, GdSi, LuSi, DySi, ErSi, YbSi in the n-type region 50N, and the second silicide regions 168 may comprise NiSi, CoSi, MnSi, WSi, FeSi, RhSi, PdSi, RuSi, PtSi, IrSi, OsSi in the p-type region 50P. A material composition of the second silicide regions 168 may be the same or different than the first silicide regions 110. In some embodiments, the second silicide regions 168 have a thickness in range of 1 nm to 10 nm.

As further illustrated in FIGS. 27A through 27C, backside vias 170 are formed in the recesses 164. The backside vias 170 may extend through the dielectric layer 162, the dielectric liner 160, the STI regions 168, and the semiconductor substrate 50. The backside vias 170 may be electrically coupled to the epitaxial source/drain regions 92' through the second silicide regions 168. The backside vias 170 may be similar to the source/drain contacts 112, described above with respect to FIGS. 20A through 20C. For example, the backside vias 170 may be formed of a like material and using a like process as the source/drain contacts 112. In some embodiments, the backside vias 170 may have a thickness (e.g., as measured between top and bottom surfaces of the backside vias 170) in a range of about 10 nm to about 50 nm. A thickness of the backside vias 170 may be greater than a thickness of the semiconductor substrate 50. A material composition of the backside vias 170 may be the same or different than the source/drain contacts 112.

Figure 28B:
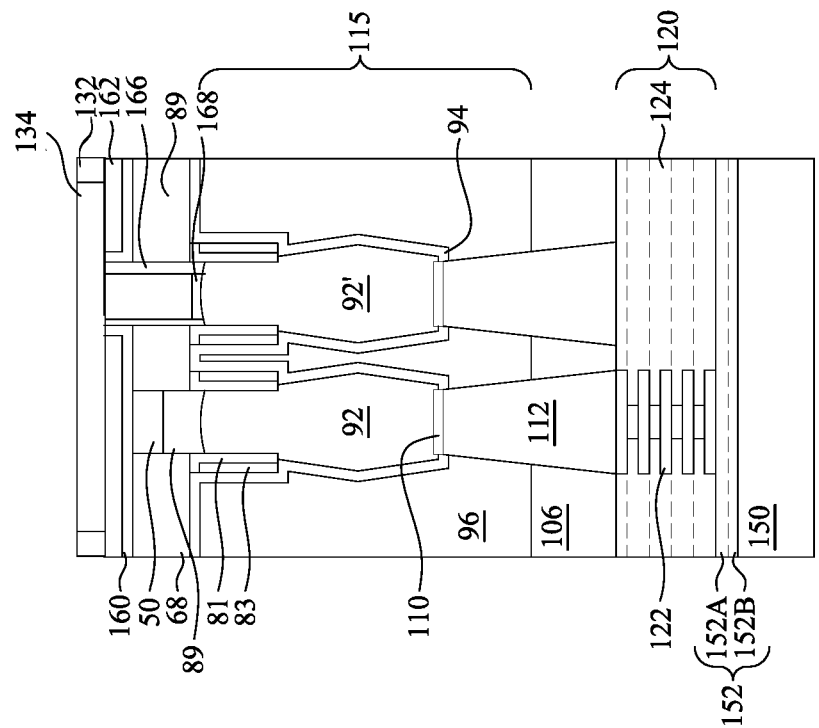
Figure 28A:
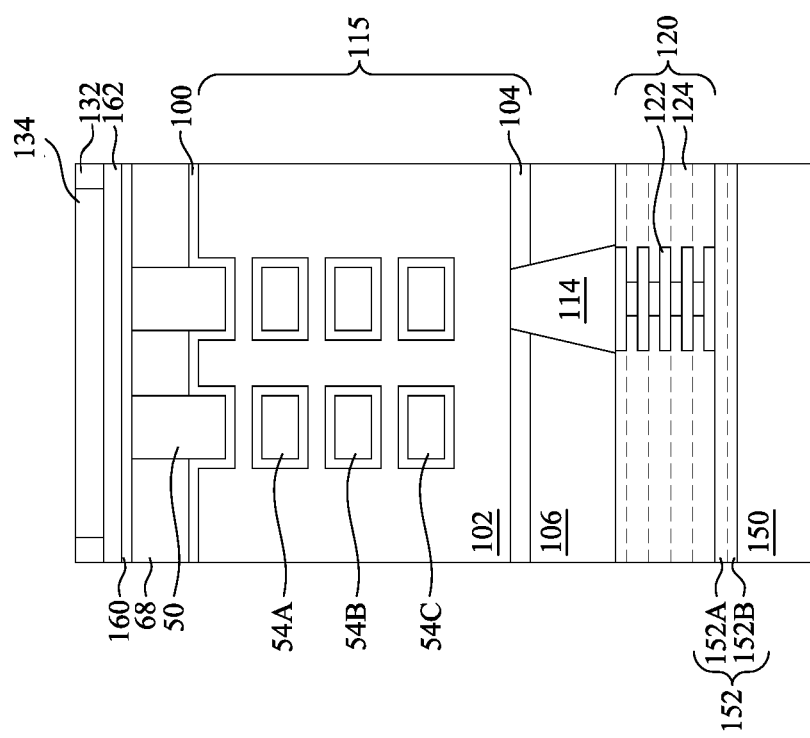
Figure 28C:
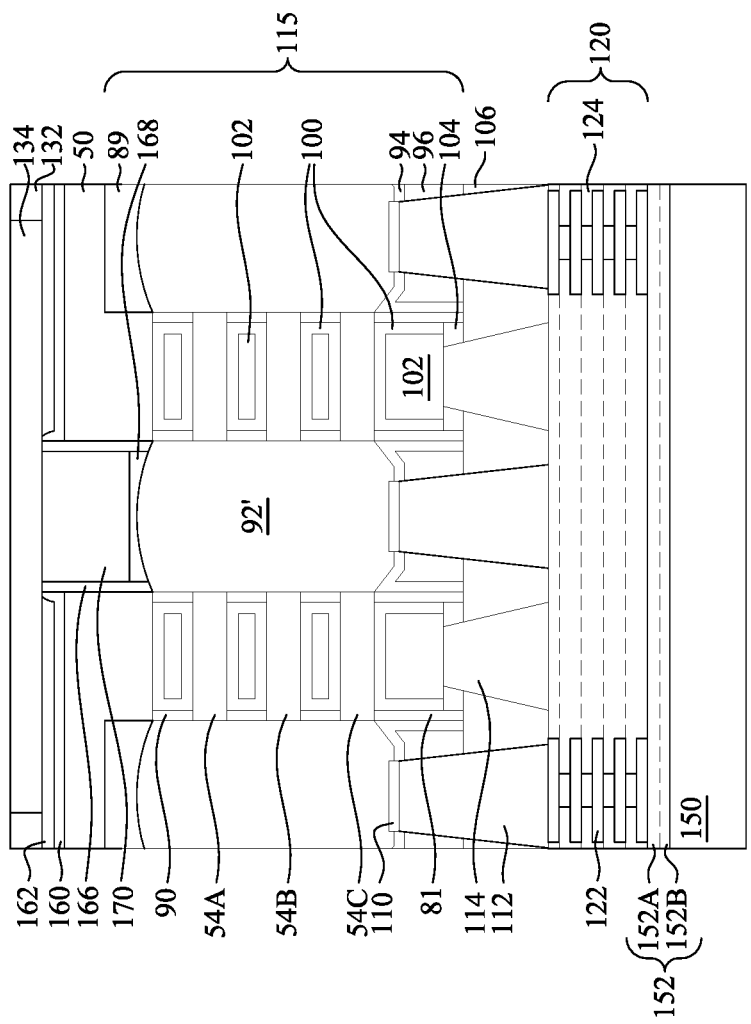

In FIGS. 28A through 28C, conductive lines 134 and a dielectric layer 132 are formed over the dielectric layer 162, the STI regions 68, and the backside vias 170. The dielectric layer 132 may be similar to the dielectric layer 162. For example, the dielectric layer 132 may be formed of a like material and using a like process as the dielectric layer 162.

The conductive lines 134 are formed in the dielectric layer 132. Forming the conductive lines 134 may include patterning recesses in the dielectric layer 132 using a combination of photolithography and etching processes, for example. A pattern of the recesses in the dielectric layer 132 may correspond to a pattern of the conductive lines 134. The conductive lines 134 are then formed by depositing a conductive material in the recesses. In some embodiments, the conductive lines 134 comprise a metal layer, which may be a single layer or a composite layer comprising a plurality of sub-layers formed of different materials. In some embodiments, the conductive lines 134 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, titanium oxide, or the like. The conductive lines 134 may be formed using, for example, CVD, ALD, PVD, plating or the like. The conductive lines 134 are physically and electrically coupled to the epitaxial source/drain regions 92' through the backside vias 170 and the second silicide regions 168. A planarization process (e.g., a CMP, a grinding, an etch-back, or the like) may be performed to remove excess portions of the conductive lines 134 formed over the dielectric layer 132.

In some embodiments, the conductive lines 134 are power rails, which are conductive lines that electrically connect the epitaxial source/drain regions 92' to a reference voltage, a supply voltage, or the like. By placing power rails on a backside of the resulting semiconductor die rather than on a front-side of the semiconductor die, advantages may be achieved. For example, a gate density of the nano-FETs and/or interconnect density of the front-side interconnect structure 120 may be increased. Further, the backside of the semiconductor die may accommodate wider power rails, reducing resistance and increasing efficiency of power delivery to the nano-FETs. For example, a width of the conductive lines 134 may be at least twice a width of first level conductive lines (e.g., first conductive features 122) of the front-side interconnect structure 120.

Figure 29B:
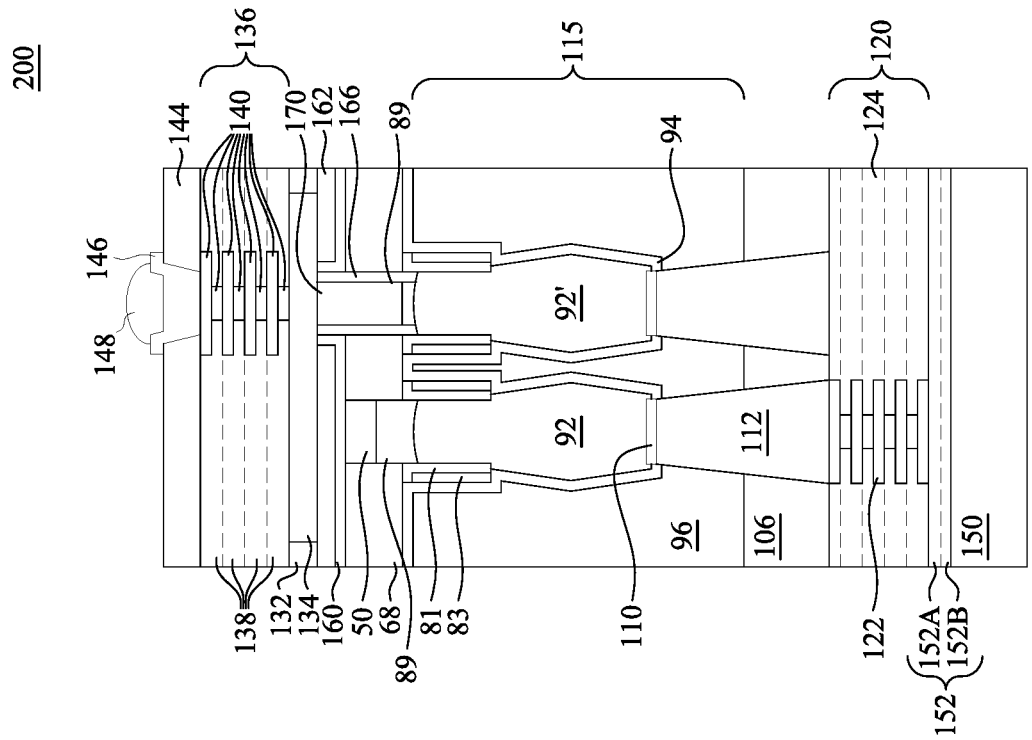
Figure 29A:
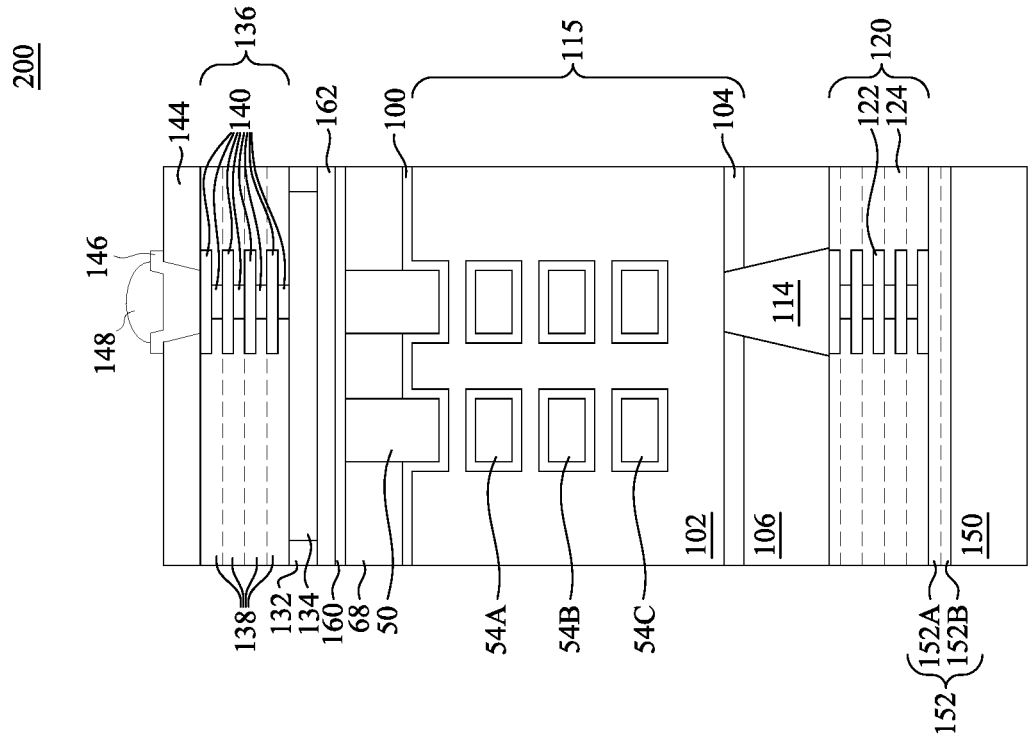
Figure 29C:
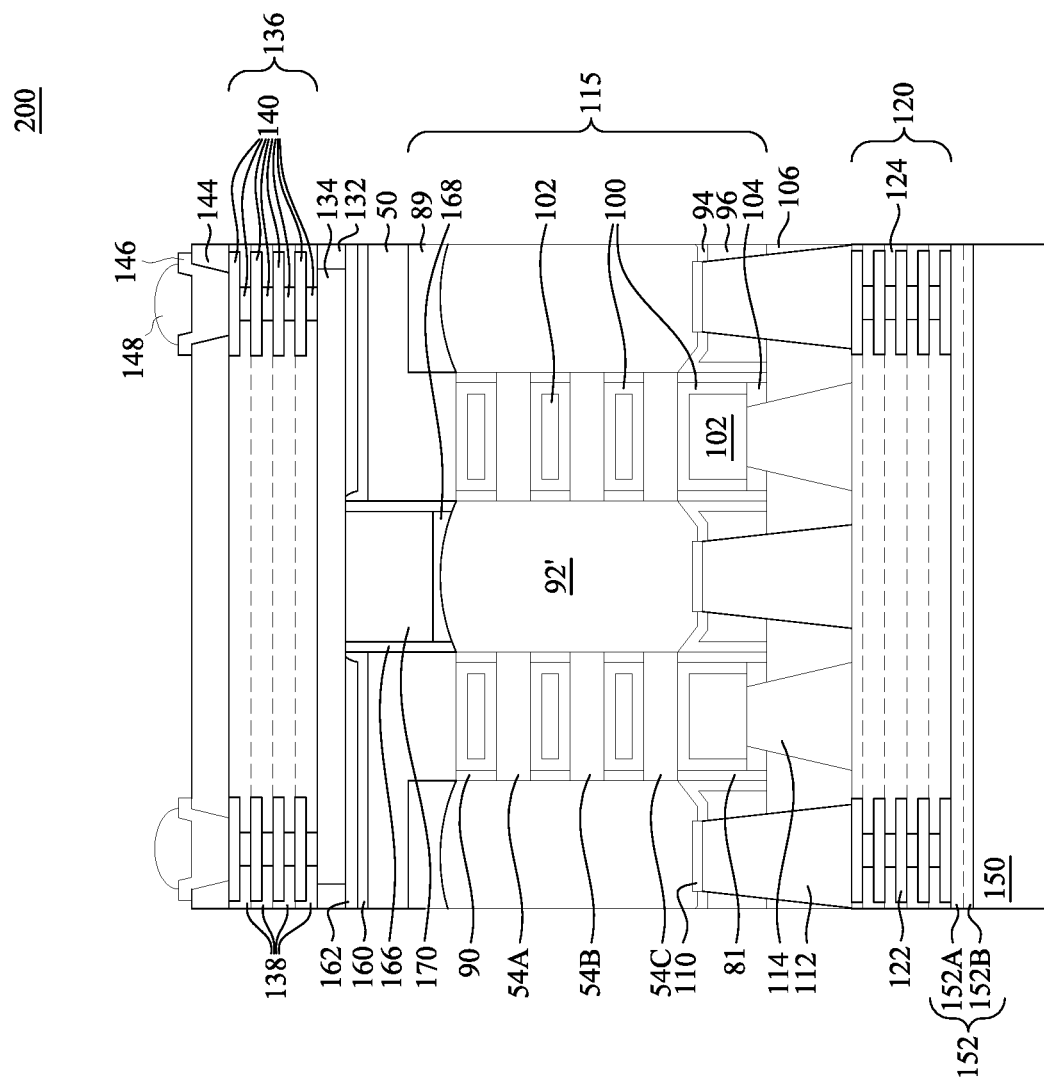

In FIGS. 29A through 29C, remaining portions of a backside interconnect structure 136 are formed over the dielectric layer 132 and the conductive lines 134. The backside interconnect structure 136 may be referred to as a backside interconnect structure because it is formed on a backside of the device layer 115 (e.g., a side of the transistor structures opposite the gate electrodes 102). The backside interconnect structure 136 may comprise the second dielectric layer 125, the third dielectric layer 132, the backside vias 130, and the conductive lines 134.

The remaining portions of the backside interconnect structure 136 may comprise materials and be formed using processes the same as or similar to those used for the front-side interconnect structure 120, discussed above with respect to FIGS. 21A through 21D. In particular, the backside interconnect structure 136 may comprise stacked layers of second conductive features 140 formed in dielectric layers 138. The second conductive features 140 may include routing lines (e.g., for routing to and from subsequently formed contact pads and external connectors). The second conductive features 140 may further be patterned to include one or more embedded passive devices such as, resistors, capacitors, inductors, or the like. The embedded passive devices may be integrated with the conductive lines 134

(e.g., the power rail) to provide circuits (e.g., power circuits) on the backside of the nano-FETs.

As further illustrated in FIGS. 29A through 29C, a passivation layer 144, UBMs 146, and external connectors 148 are formed over the backside interconnect structure 136. The passivation layer 144 may comprise polymers such as PBO, polyimide, BCB, or the like. Alternatively, the passivation layer 144 may include non-organic dielectric materials such as silicon oxide, silicon nitride, silicon carbide, silicon oxynitride, or the like. The passivation layer 144 may be deposited by, for example, CVD, PVD, ALD, or the like.

The UBMs 146 are formed through the passivation layer 144 to the second conductive features 140 in the backside interconnect structure 136 and the external connectors 148 are formed on the UBMs 146. The UBMs 146 may comprise one or more layers of copper, nickel, gold, or the like, which are formed by a plating process, or the like. The external connectors 148 (e.g., solder balls) are formed on the UBMs 146. The formation of the external connectors 148 may include placing solder balls on exposed portions of the UBMs 146 and reflowing the solder balls. In some embodiments, the formation of the external connectors 148 includes performing a plating step to form solder regions over the topmost second conductive features 140 and then reflowing the solder regions. The UBMs 146 and the external connectors 148 may be used to provide input/output connections to other electrical components, such as, other device dies, redistribution structures, printed circuit boards (PCBs), motherboards, or the like. The UBMs 146 and the external connectors 148 may also be referred to as backside input/output pads that may provide signal, supply voltage, and/or ground connections to the nano-FETs described above. Thus, semiconductor dies 200 comprising a device layer 115, a front-side interconnect structure 120, and a backside interconnect structure 136 is formed.

FIGS. 30A through 36E illustrate intermediate steps of a backside interconnect structure according to some other embodiments. FIGS. 30A, 31A, 32A, 33A, 34A, 35A, and 36A illustrate reference cross-section A-A' illustrated in FIG. 1. FIGS. 30B, 31B, 32B, 33B, 34B, 35B, 36B illustrate reference cross-section B-B' illustrated in FIG. 1. FIGS. 30C, 31C, 32C, 33C, 33D, 33E, 34C, 34D, 34E, 35C, 35D, 35E, 36C, 36D, and 36E illustrate reference cross-section C-C' illustrated in FIG. 1. In FIGS. 30A through 36E, semiconductor dies 250 are formed. Semiconductor dies 250 may be similar to semiconductor dies 200 described above where like reference numerals indicate like elements formed using like processes unless otherwise noted.

Figure 30B:
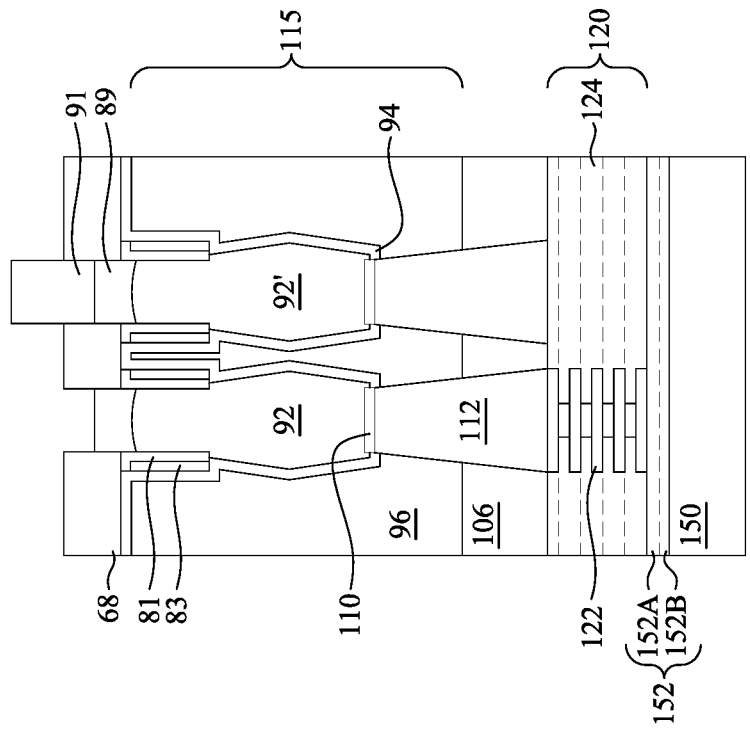
FIGS. 30A, 30B, 30C, 31A, 31B, 31C, 32A, 32B, 32C, 33A, 33B, 33C, 33D, 33E, 34A, 34B, 34C, 34D, 34E, 35A, 35B, 35C, 35D, 35E, 36A, 36B, 36C, 36D, and 36E are cross-sectional views of intermediate stages in the manufacturing of nano-FETs, in accordance with some embodiments.
Figure 30A:
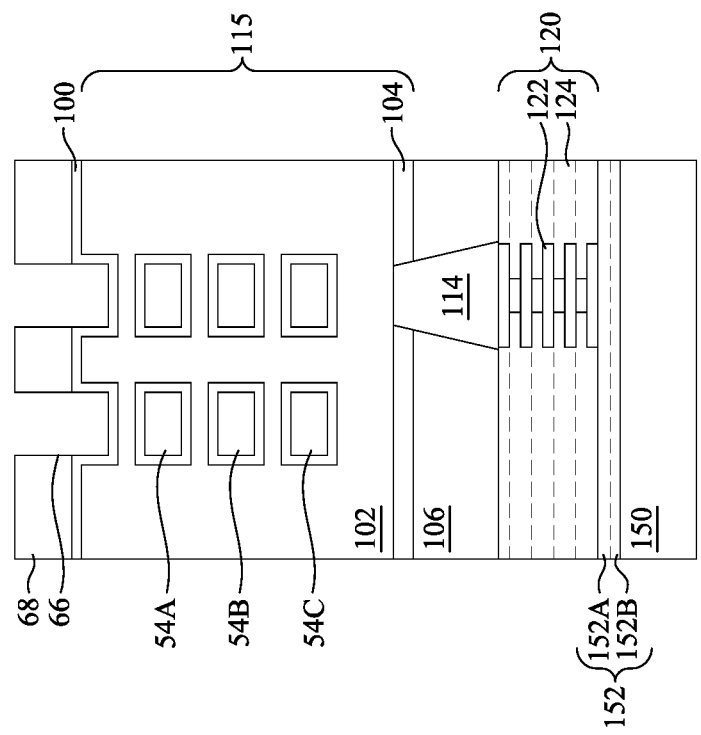
Figure 30C:
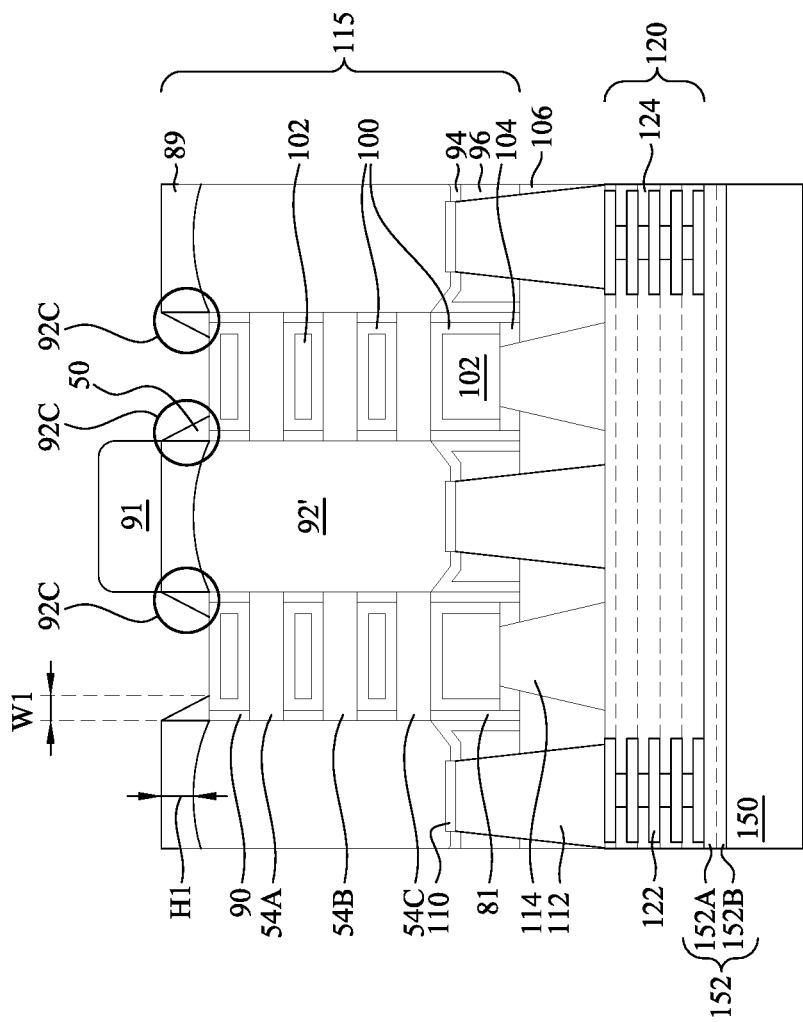

FIGS. 30A through 30C illustrates a structure similar to the structure illustrated in FIGS. 22A through 22C, and like process steps as those described above with respect to FIGS. 1 through 21C may be performed to arrive at the structure in FIGS. 30A through 30C. As further illustrated in FIGS. 30A through 30C, a backside of the semiconductor substrate 50 is patterned to expose the first epitaxial material 91. The patterning process may comprise a planarization process (e.g., a mechanical grinding, a CMP, or the like), an etch-back process, or a combination thereof, or the like. In some embodiments, the patterning process includes a combination of a planarization to remove a majority of the substrate 50 followed by an etch back to further remove portions of the substrate 50. The patterning process may expose surfaces of the first epitaxial material 91 and the second epitaxial material 89 opposite the front-side interconnect structure 120. Surfaces of the STI regions 68 and the gate electrodes (including the gate dielectric 100 and the gate electrodes 102) may also be exposed. For example, the patterning process may etch back the substrate 50 and the STI regions 68 below top surfaces of the first epitaxial regions 91. In some embodiments, the etch back process may be a plasma etching process which uses, O$_2$, Cl$_2$, HCl, HBr, combinations thereof, or the like to etch the substrate 50. Further, the etch back process may include an etchant flow rate in a range of about 5 sccm to about 100 sccm; a chamber pressure in a range of about 1 mTorr to about 100 mTorr, and a bias voltage in a range of about 300V to about 1000V. Other process conditions may be used in other embodiments.

As a result of patterning the substrate 50, a substantial majority of the substrate 50 is removed, and only portions of the substrate 50 at corners of the epitaxial source/drain regions 92 remain. In some embodiments, the remaining portions of the substrate 50 may include a surface along the <111> crystalline plane. By removing a substantial majority of the substrate 50, leakage and capacitance may be lowered in the resulting device. Further, by leaving portions of the substrate 50 to cover corner regions of the epitaxial source/drain regions 92, the epitaxial source/drain regions 92 may still be protected during subsequent etching processes. As such, manufacturing defects may be reduced. In some embodiments, each of the remaining portions of the substrate 50 may have a width W1 in a range of about 1 nm to about 5 nm and a height H1 in a range of about 1 nm to about 15 nm. It has been observed that by having the remaining portions of the substrate 50 fall within the above dimensions, leakage and capacitance may be reduced while still protecting the epitaxial source/drain regions 92 in subsequent processing steps.

Figure 31B:
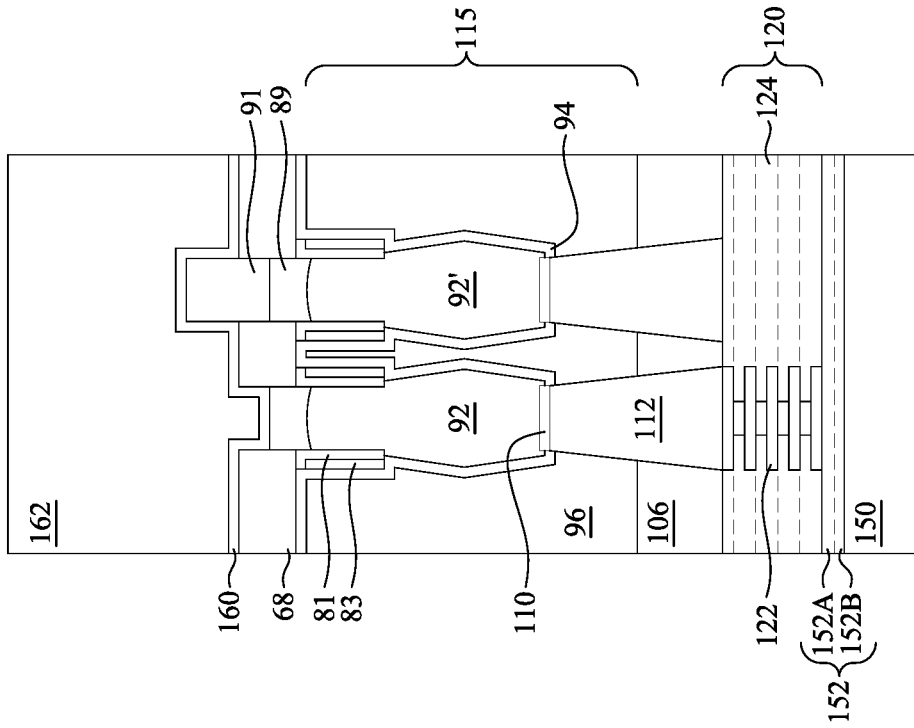
Figure 31A:
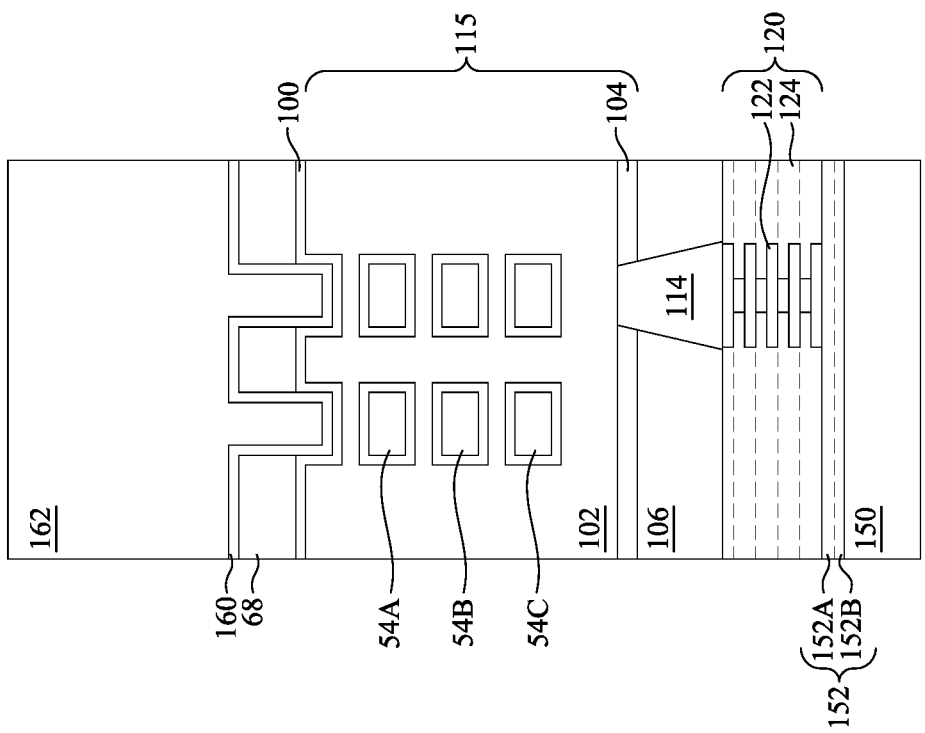
Figure 31C:
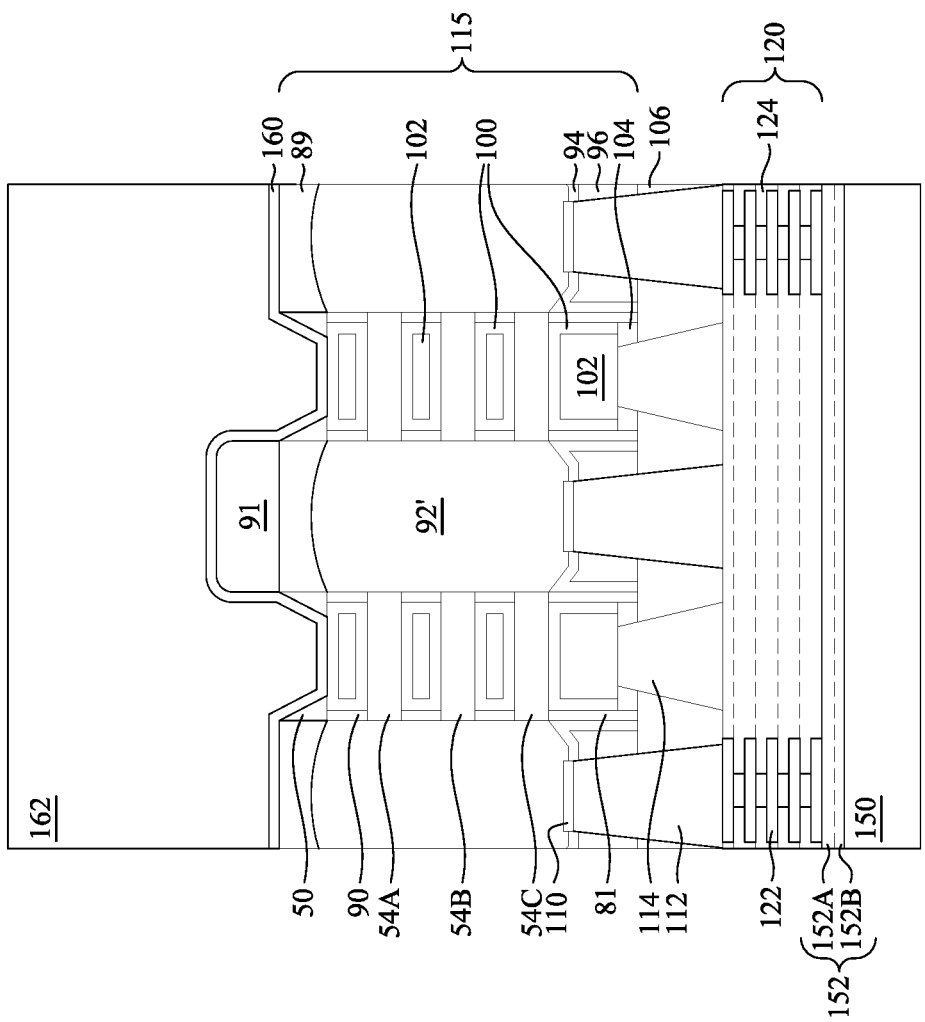

In FIGS. 31A through 31C, the dielectric layer 162 and the dielectric liner 160 are then deposited of a similar material and a similar process as described above with respect to FIGS. 23A through 23C. For example, the dielectric liner 160 and the dielectric layer 162 may be deposited over the STI regions 68, the first epitaxial material 91, the second epitaxial material 89, and the gate stacks (including the gate dielectric 100 and the gate electrode 102). Because a significant portion of the substrate 50 is removed, an insulating material (e.g., the dielectric liner 160) may directly contact the STI regions 68, the first epitaxial material 91, the second epitaxial material 92, and the gate stacks (e.g., the gate dielectric 100) of the active devices. For example, the dielectric layer 162 and the dielectric liner 160 may extend through remaining portions 50 to contact the gate stack (see FIG. 31C).

Figure 32B:
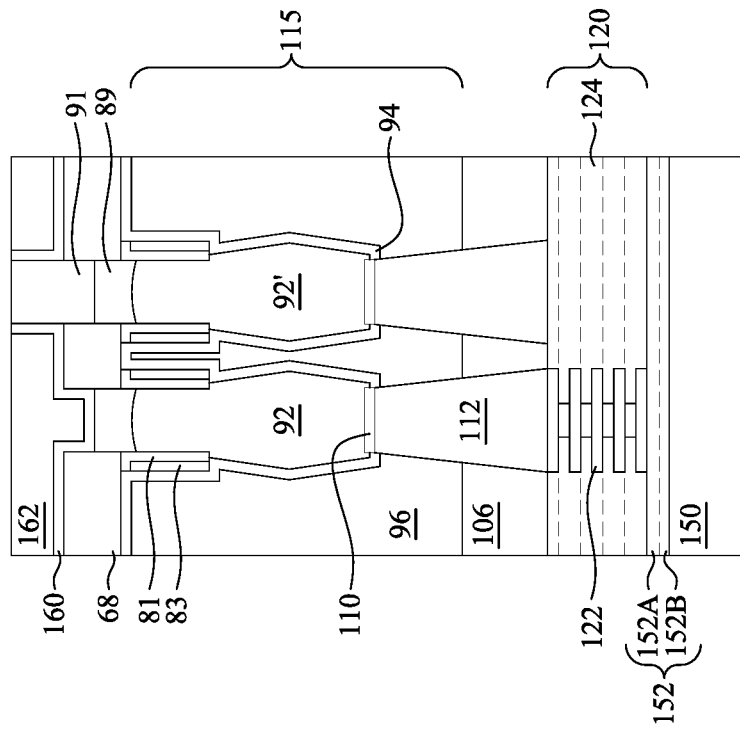
Figure 32A:
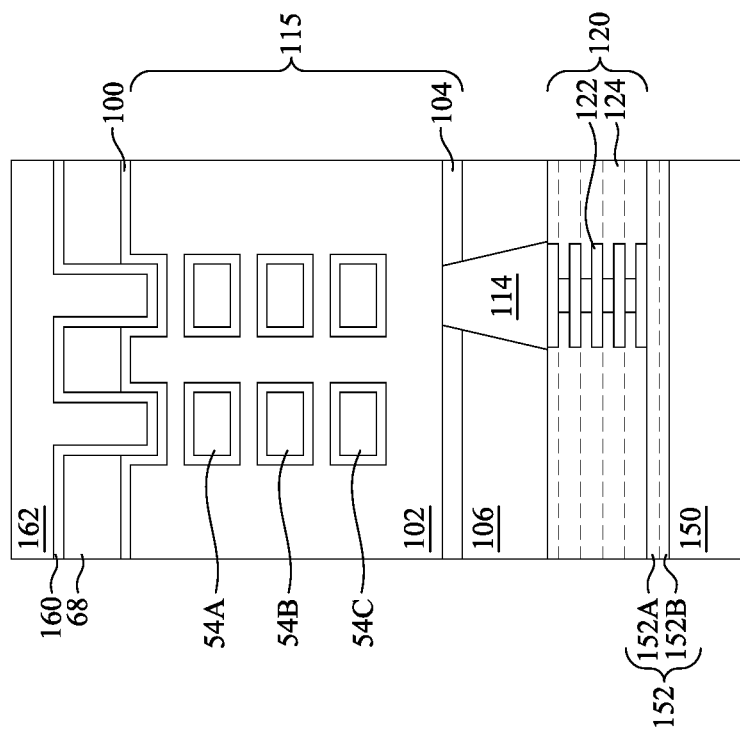
Figure 32C:
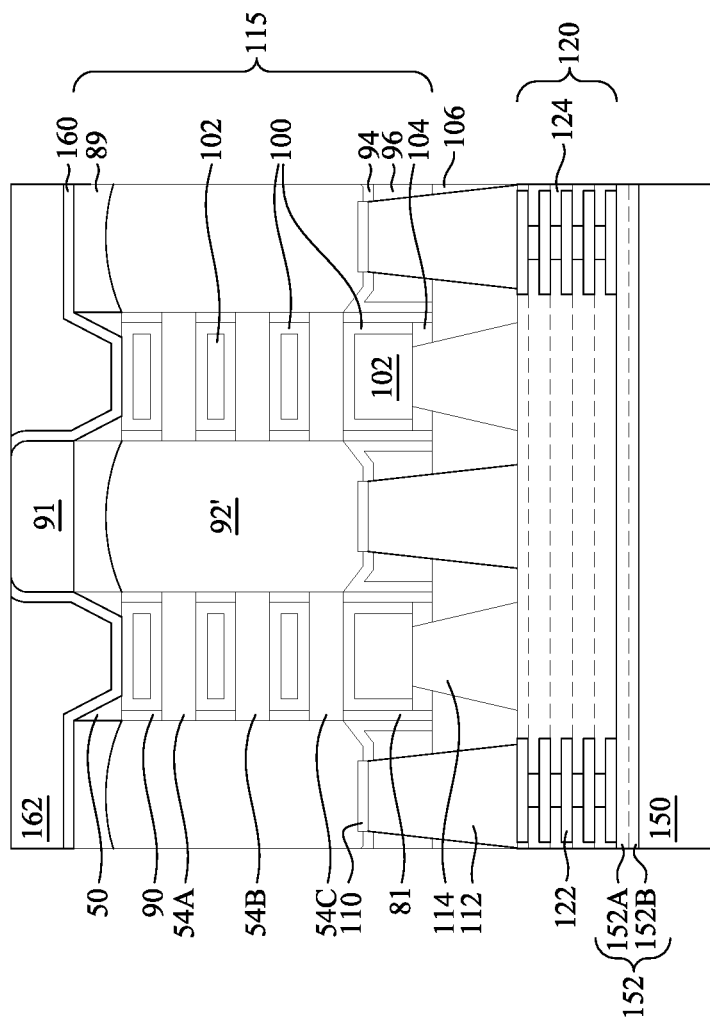

In FIGS. 32A through 32C, a thinning process may be applied to the dielectric layer 162 and the dielectric liner 160 using a similar process as described above with respect to FIGS. 24A through 24C. As a result, the first epitaxial material 91 may be exposed.

Figure 33B:
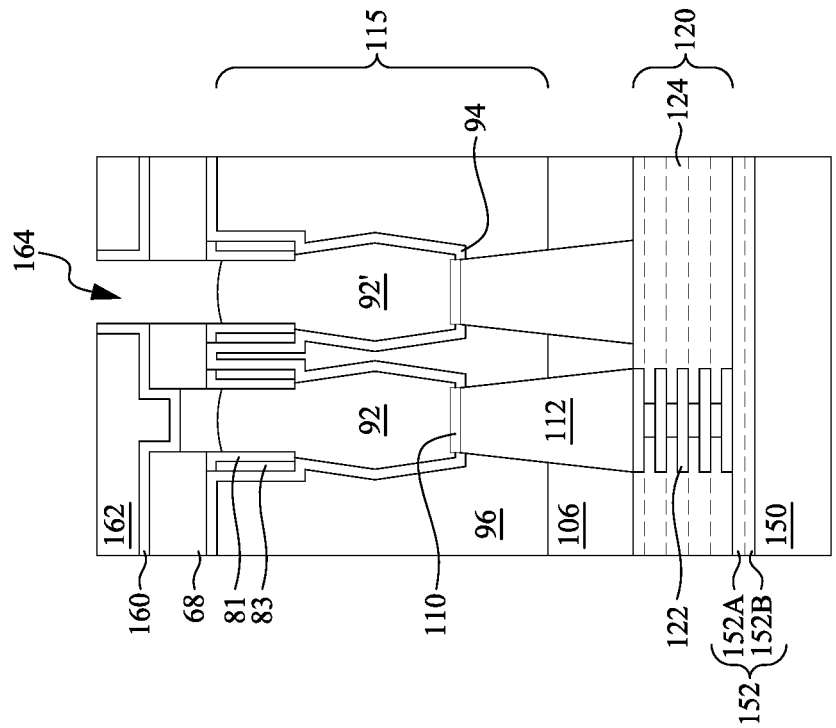
Figure 33A:
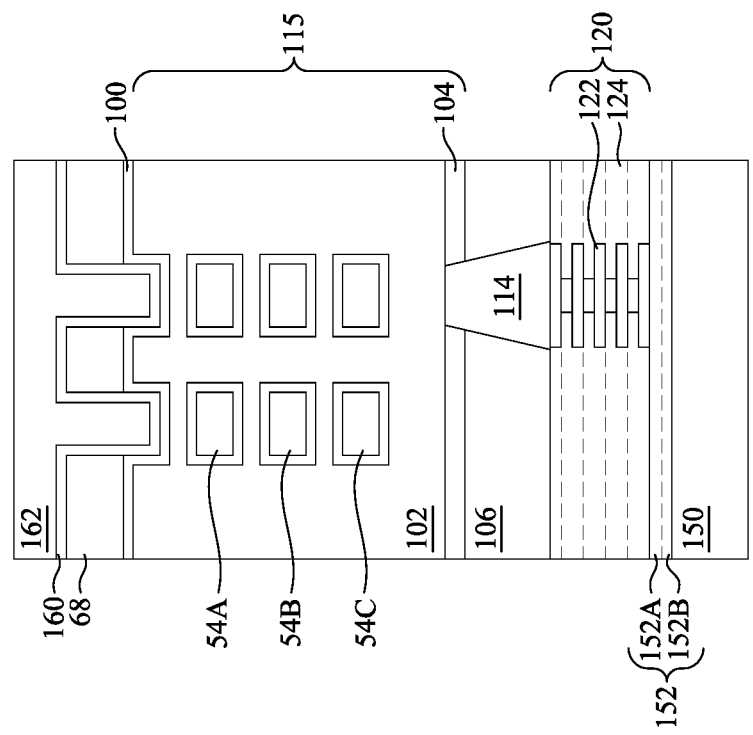
Figure 33C:
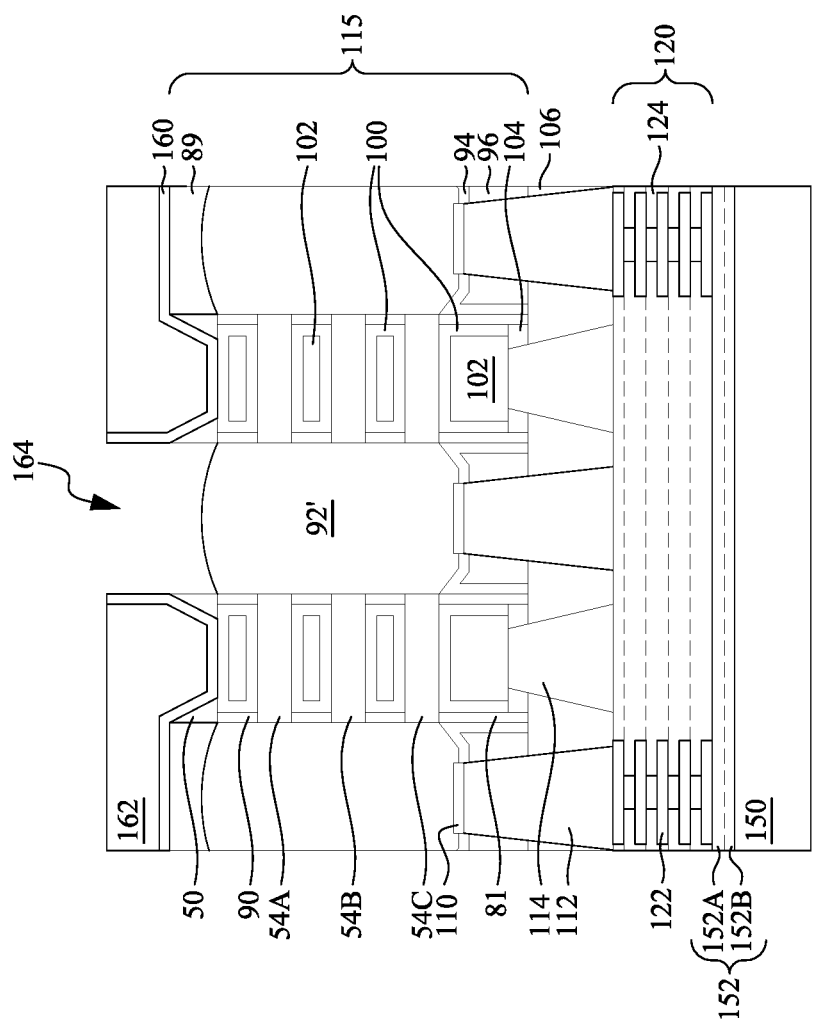

In FIGS. 33A through 33C, an etching process may be applied to remove the first epitaxial material 91 as described above with respect to FIGS. 25A through 25C. Portions of the second epitaxial material 89 that cover the epitaxial source/drain regions 92' may also be removed. As a result, the recesses 164 are formed extending through the dielectric layer 162, the dielectric material 160, and the STI regions 68 to expose the epitaxial source/drain regions 92'. Because portions of the substrate 50 remain in the recesses 164 during the patterning process, the epitaxial source/drain regions 92 may be covered and protected, thereby reducing manufacturing defects.

Figure 33D:
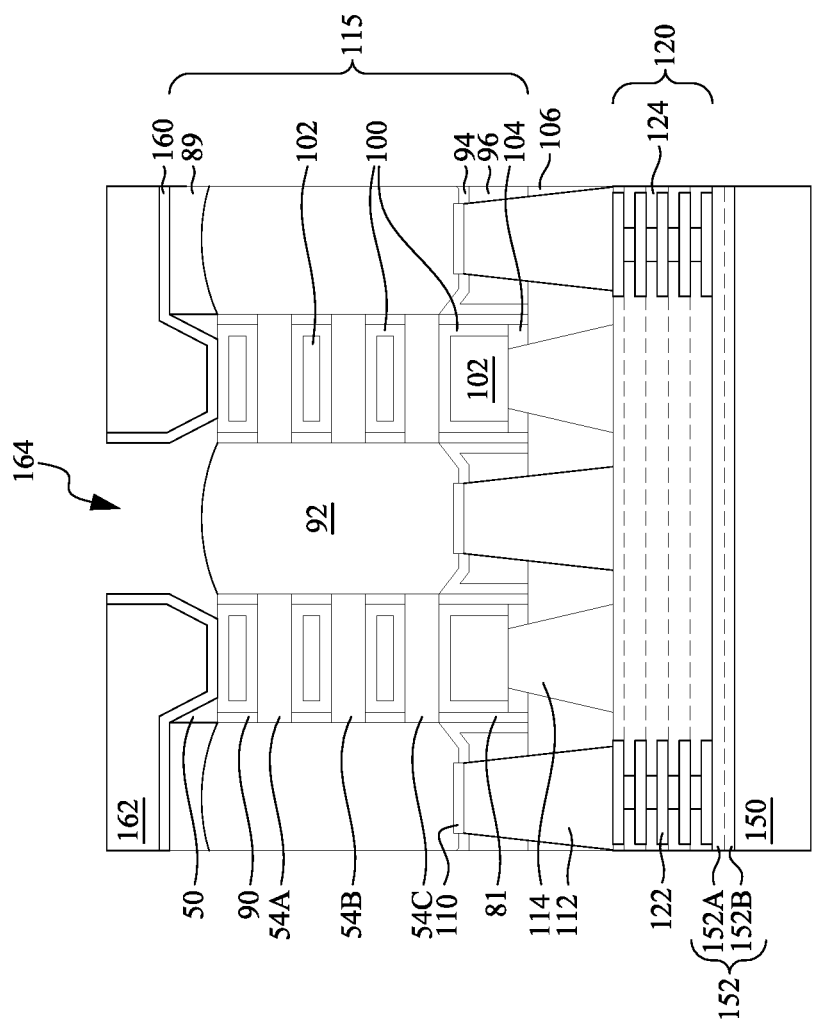

In some embodiments (e.g., as illustrated by FIG. 33D), portions of the substrate 50 in the recesses 164 may be optionally removed after the recesses 164 as etched using a suitable etching process, such as a wet etch, a dry etch, or the like. The etching process may use a chemical etchant that selectively etches the substrate 50 without significantly etching the epitaxial source/drain regions 92 (including regions 92'). As a result, the substrate 50 may be removed from the recesses 164 without significantly damaging or etching the epitaxial source/drain regions 92.

Figure 33E:
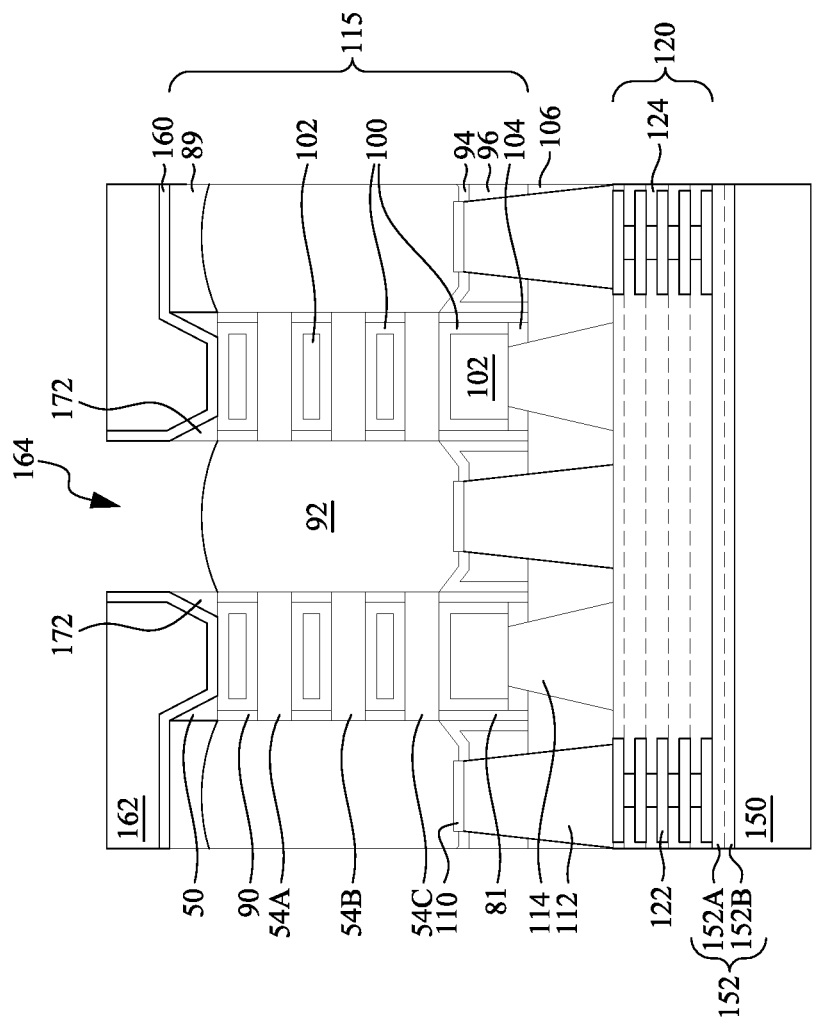

In some embodiments, an insulating material 172 may be optionally deposited in the recesses 164 as illustrated by FIG. 33E. In some embodiments, the insulating material 172 may be deposited after the substrate 50 is removed from the recesses 164, and the insulating material 172 may comprise a dielectric material such as silicon oxide, silicon nitride, an oxynitride, combinations thereof or the like. Depositing the insulating material 172 may comprise any suitable method, such as CVD, ALD, PVD, PECVD, or the like. After the insulating material 172 is deposited, an etching may be performed to remove excess portions of the insulting material 172 from the recesses 164. The etching may be anisotropic in some embodiments. In some embodiments, the insulating material 172 may be performed by performing an oxidation process (e.g., a thermal oxidation) on the semiconductor substrate 50 in the recesses 164 to convert the semiconductor substrate 50 in the recesses 164 to silicon oxide, or the like. The resulting insulating material 172 may have a similar shape and dimension as the substrate 50 in the recesses 164. For example, the insulating material 172 may have a width in a range of about 1 nm to about 5 nm and a height in a range of about 1 nm to about 15 nm. The steps illustrated in FIGS. 33D and/or 33E are optional and one or the other of them may be omitted in other embodiments.

Figure 34B:
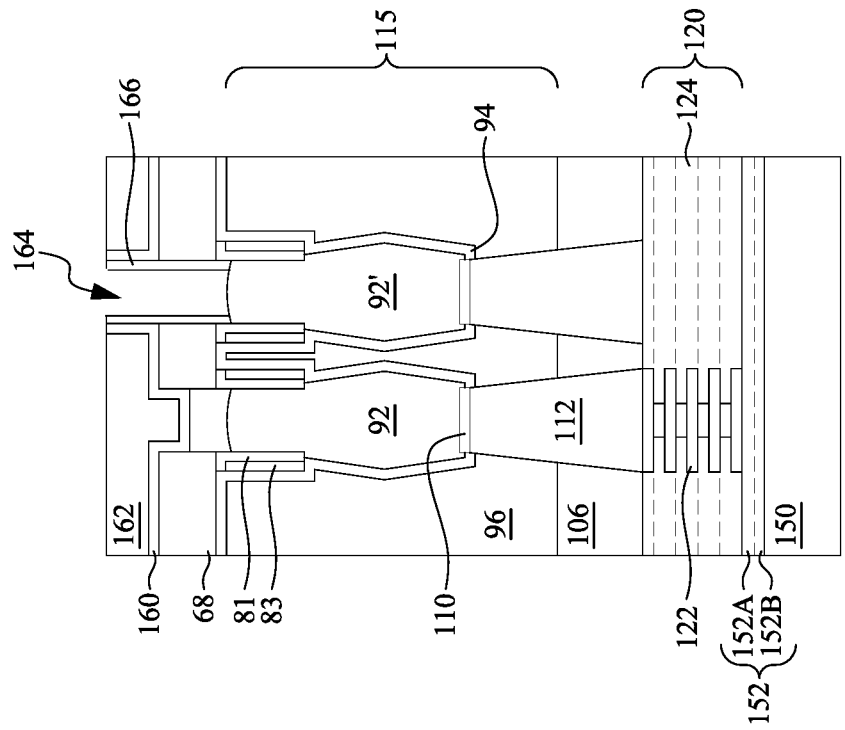
Figure 34A:
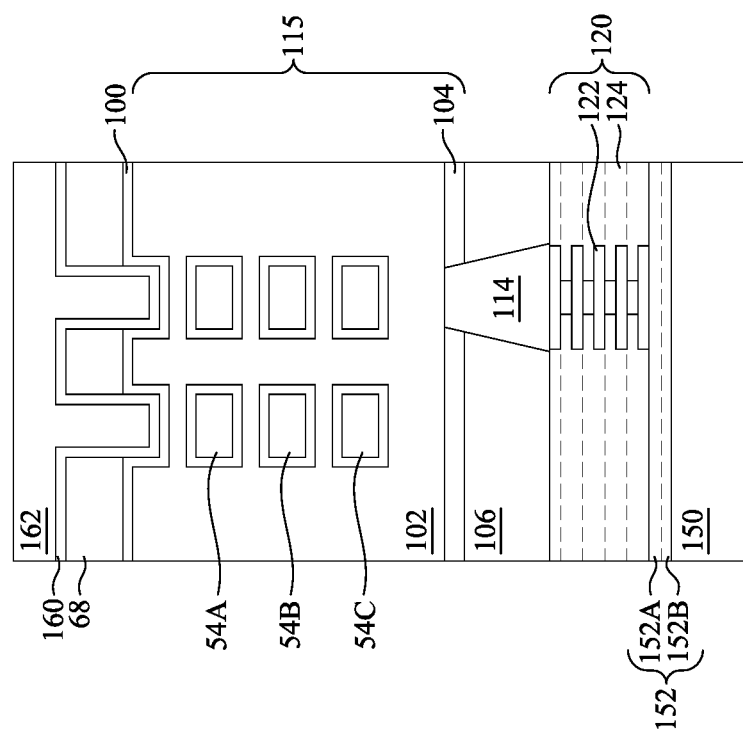
Figure 34C:
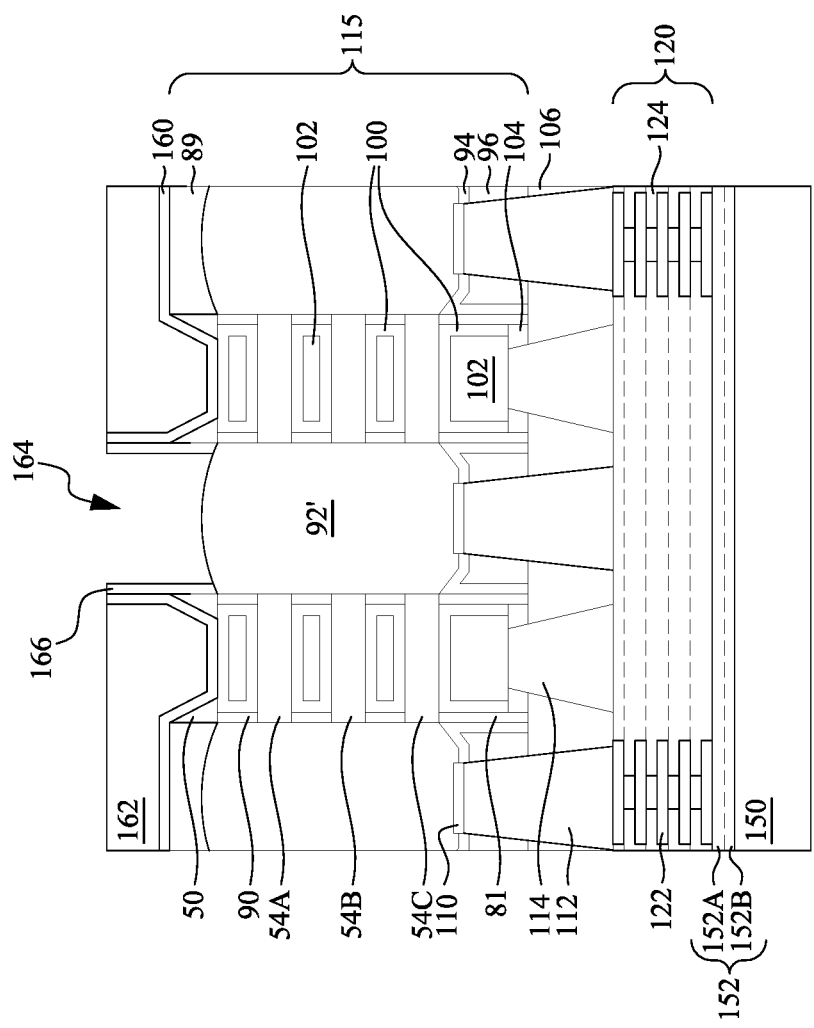
Figure 34D:
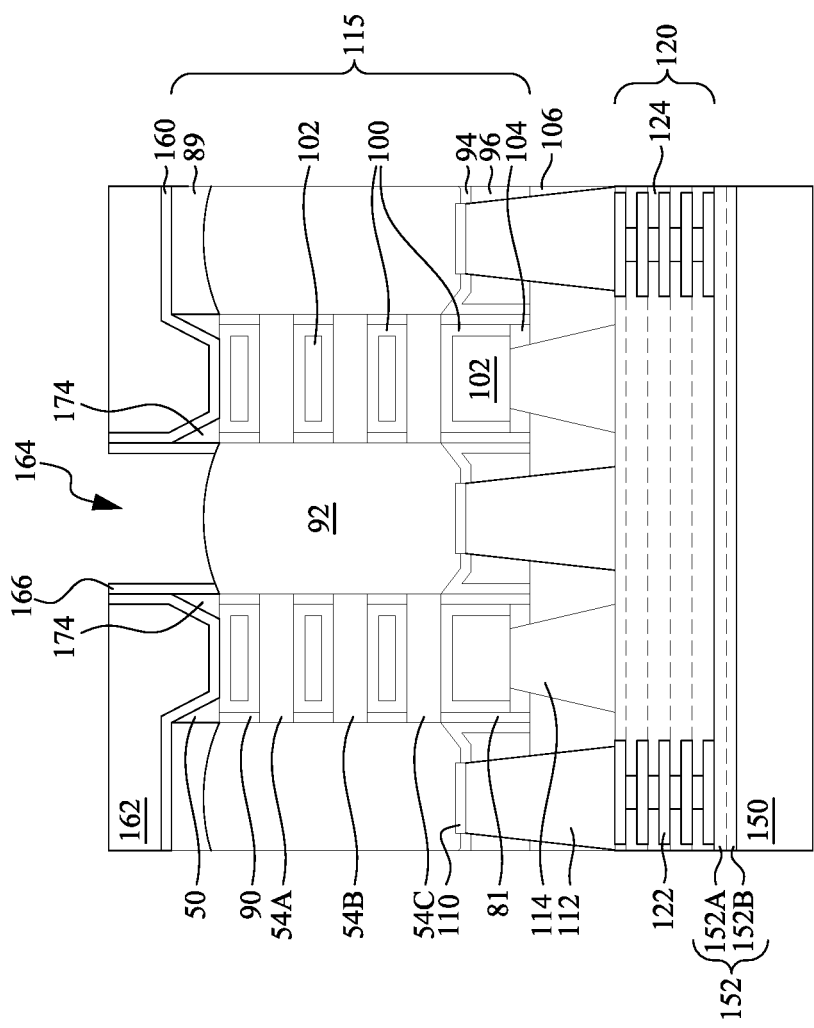
Figure 34E:
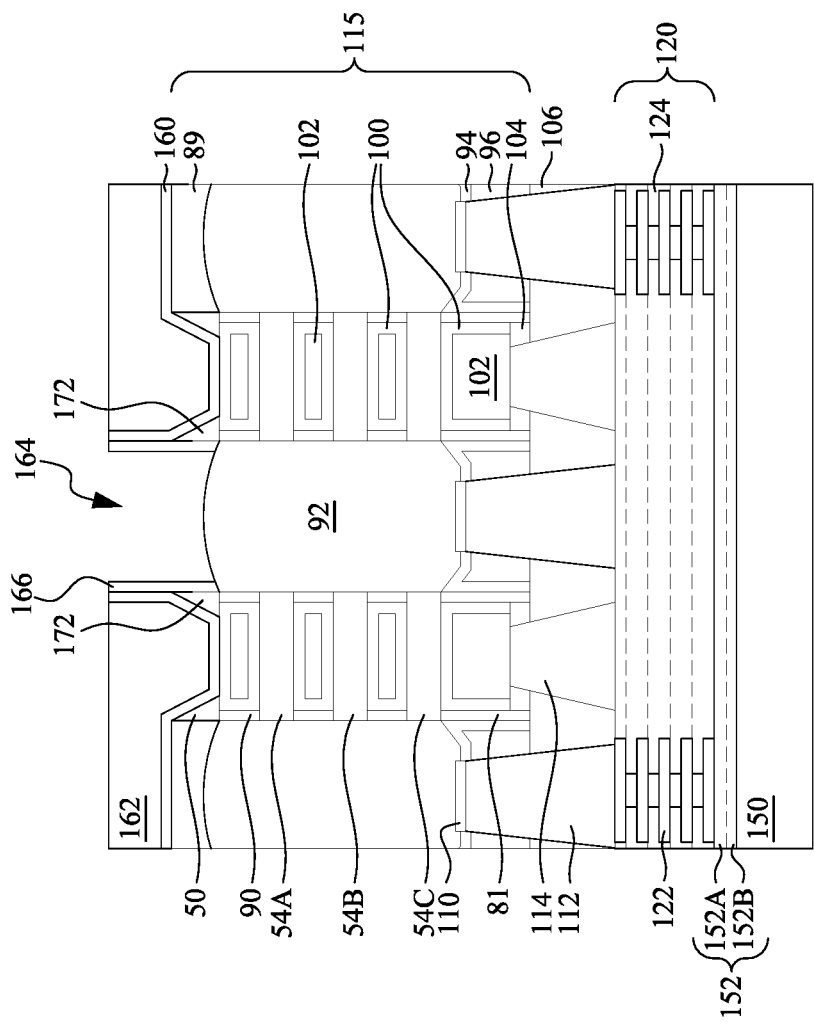

In FIGS. 34A through 34C, insulating spacers 166 are formed on sidewalls of the recesses 164 according to the embodiments of FIG. 33A through 33C. FIG. 34D illustrates the insulating spacers 166 formed on the sidewalls of the recesses 164 according to the embodiments of FIG. 33D (e.g., where the substrate 50 is removed from the recesses 164). As a result of removing the substrate 50, voids 174 may be defined between the insulating spacers 166 and the dielectric liner 160. In some embodiments, the voids 174 may be sealed by a material of the insulating spacers 166, and the voids 174 may be sealed by tuning process conditions (e.g., chamber pressure, gas flow, and the like) during the deposition of the spacers 166 such that the spacers 166 seal the voids 174 without filling the voids 174. The voids 174 may have a similar shape and dimension as the substrate 50 previously removed from the recesses 164. For example, the voids 174 may have a width in a range of about 1 nm to about 5 nm and a height in a range of about 1 nm to about 15 nm. FIG. 34E illustrates the insulating spacers 166 formed on the sidewalls of the recesses 164 and the insulating material 172 according to the embodiments of FIG. 33E (e.g., where the substrate 50 is replaced with the insulating material 172 in the recesses 164). The insulating spacers 166 may be formed using a similar process and a same material as described above with respect to FIGS. 26A through 26C.

Figure 35B:
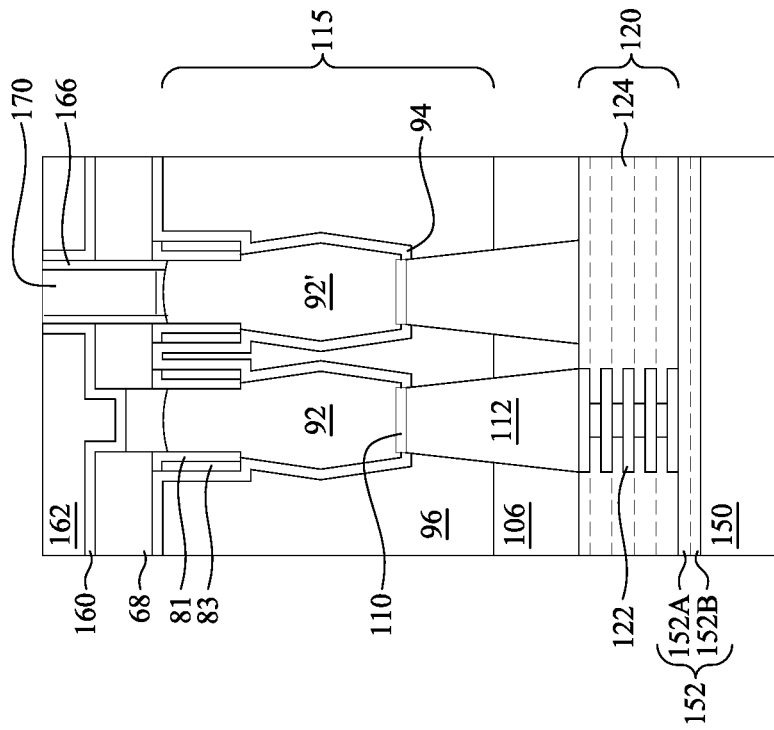
Figure 35A:
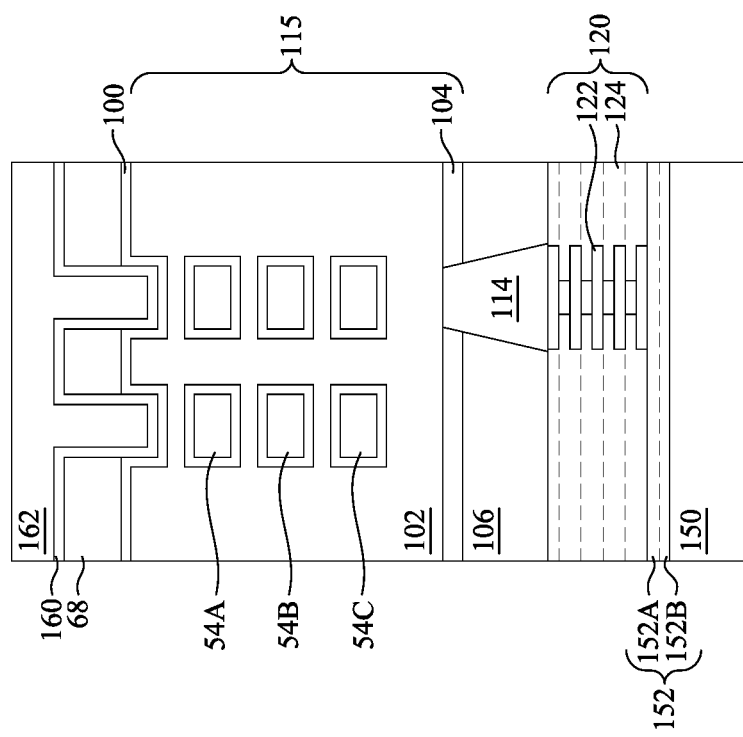
Figure 35C:
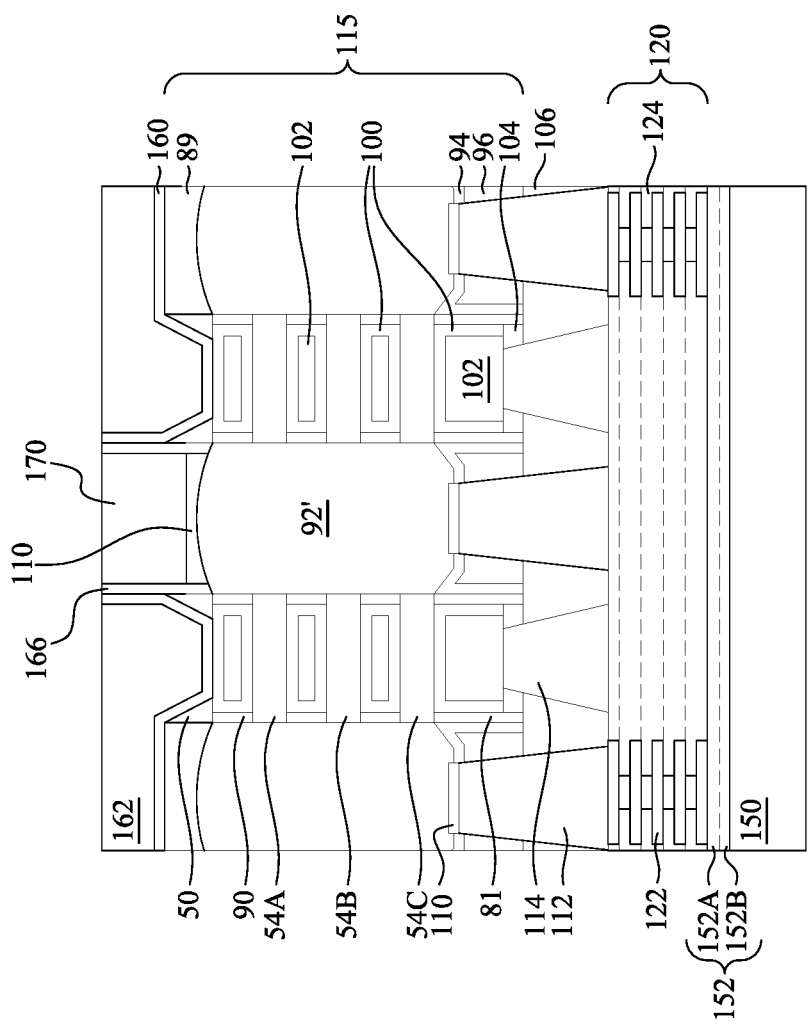
Figure 35D:
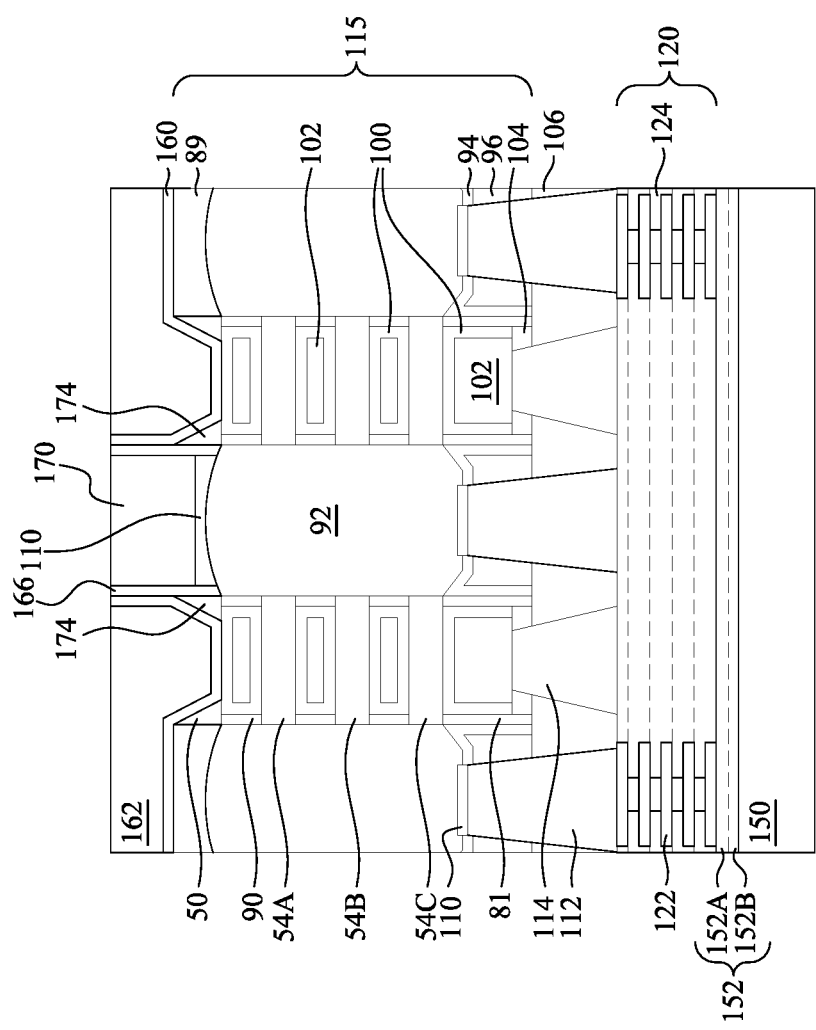
Figure 35E:
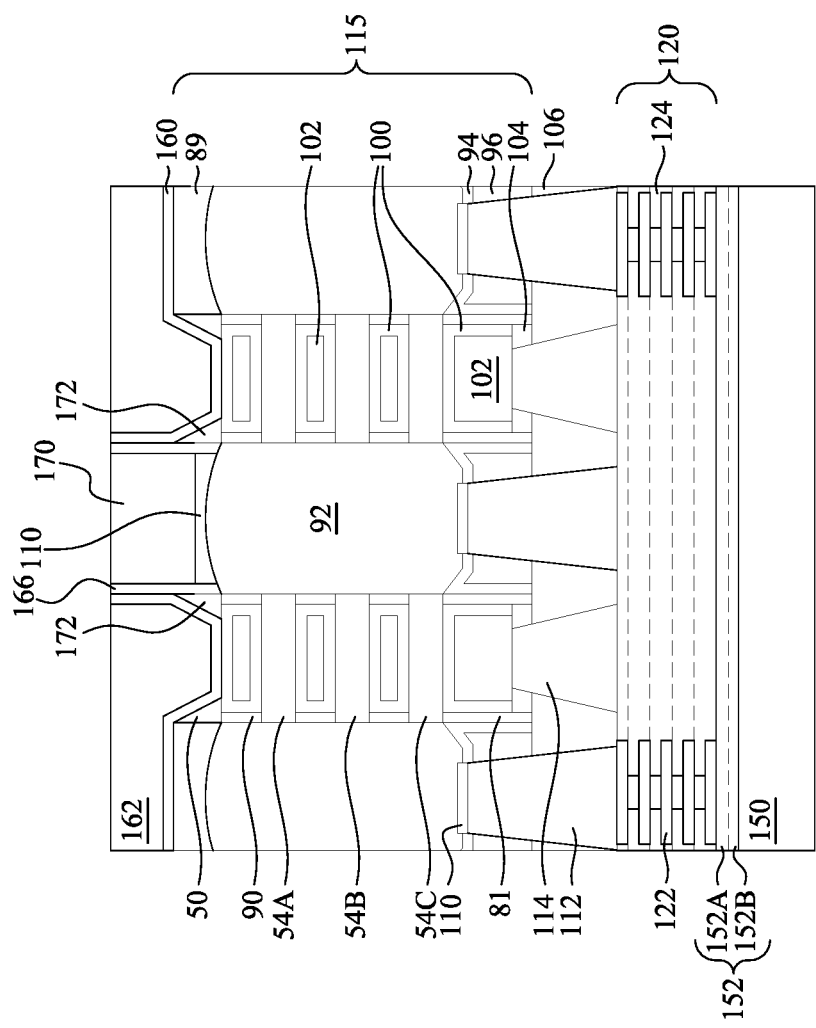

In FIGS. 35A through 35C, backside vias 170 and the second silicide regions 110 are formed in the recesses 164 according to the embodiment of FIG. 33A through 33C. FIG. 34D illustrates the backside vias 170 and the second silicide regions 110 formed in the recesses 164 according to the embodiments of FIG. 33D (e.g., where the substrate 50 is removed from the recesses 164). FIG. 34E illustrates the backside vias 170 and the second silicide regions 110 are formed in the recesses 164 according to the embodiment of FIG. 33E (e.g., where the substrate 50 is replaced with the insulating material 172 in the recesses 164). The backside vias 170 and the second silicide regions 110 may be formed using a similar process and a same material as described above with respect to FIGS. 27A through 27C.

Figure 36B:
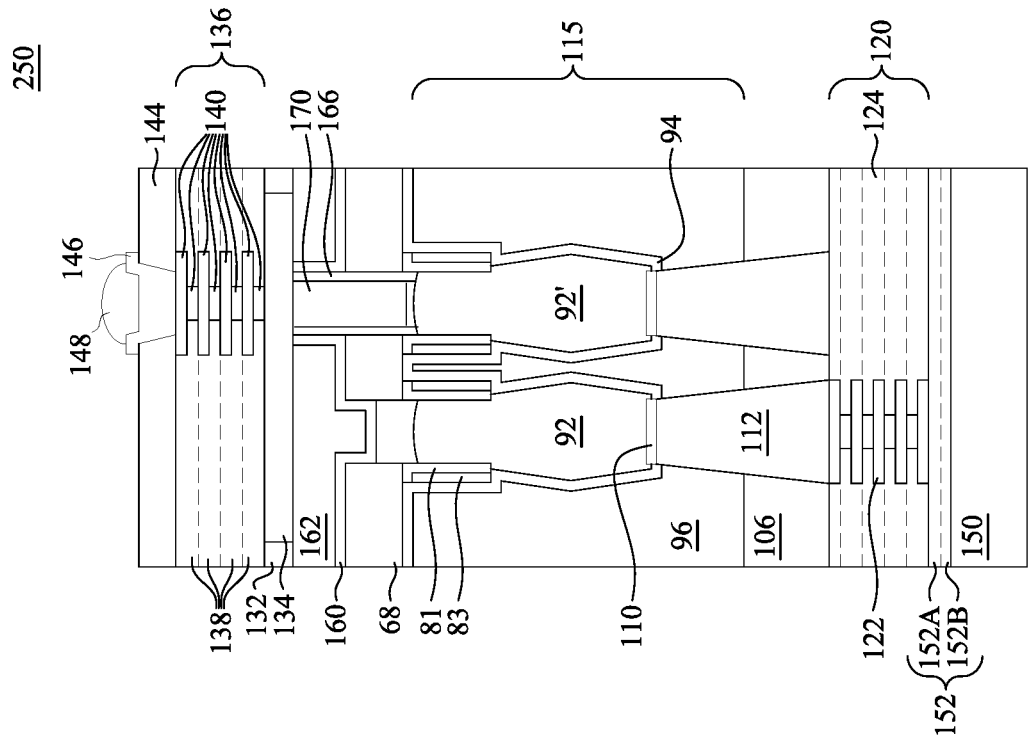
Figure 36A:
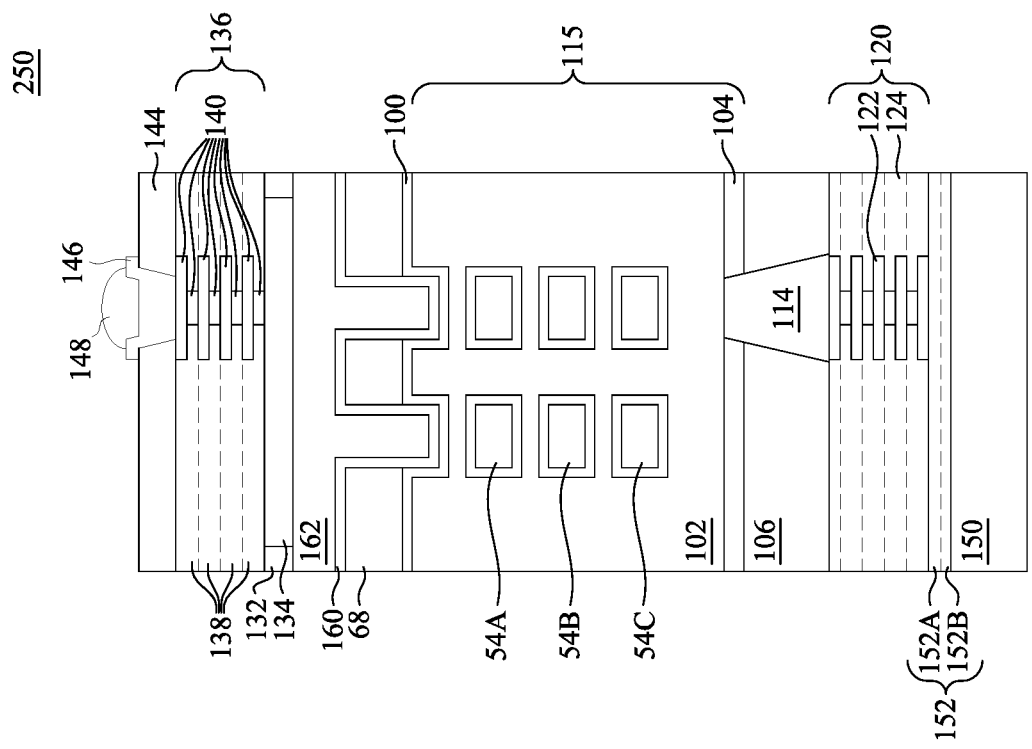
Figure 36C:
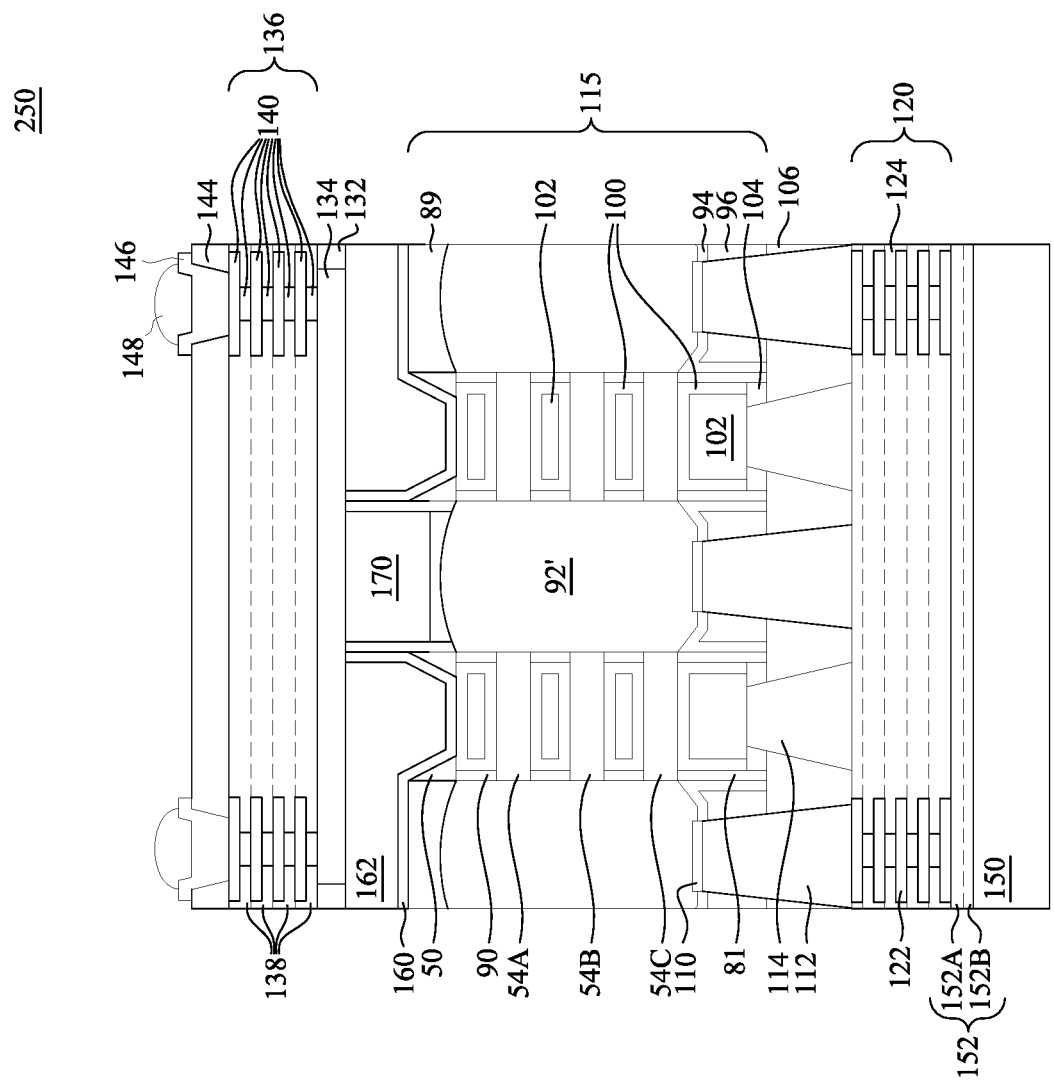
Figure 36D:
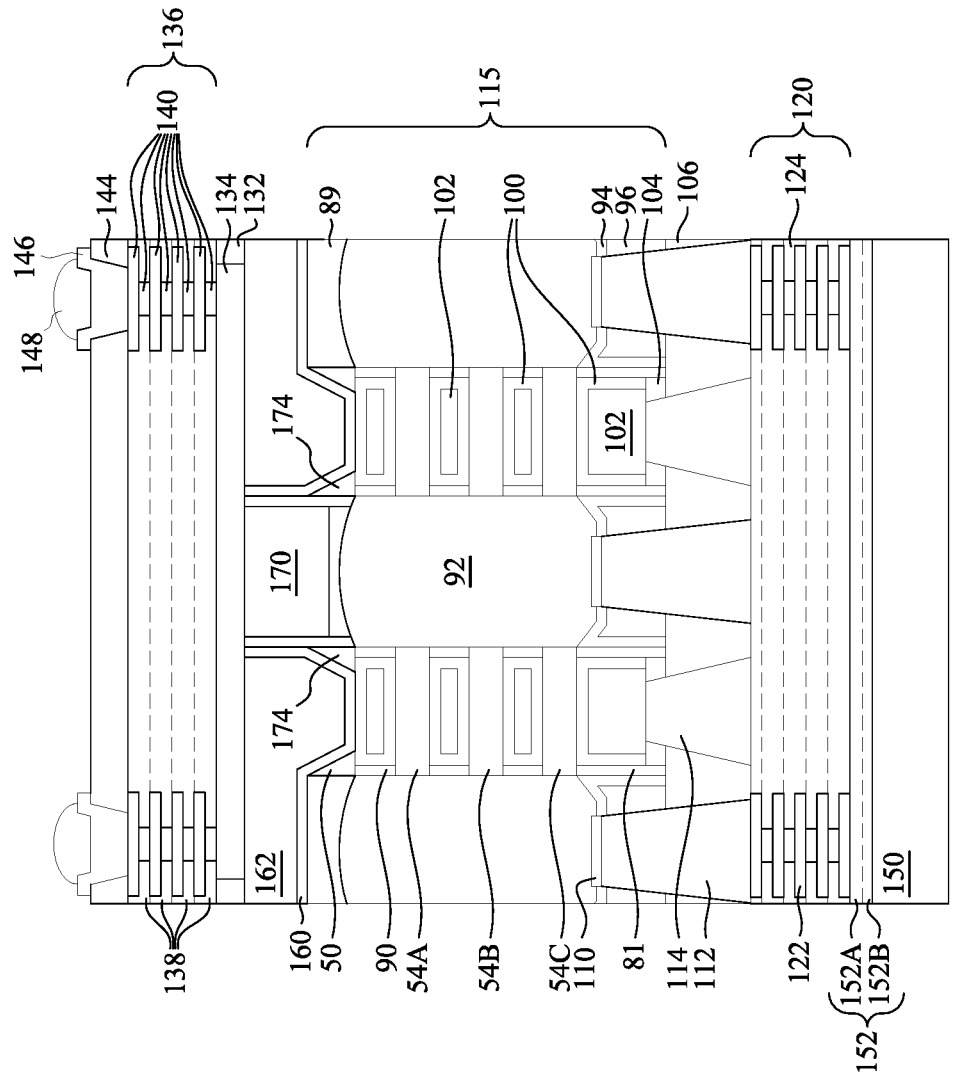
Figure 36E:
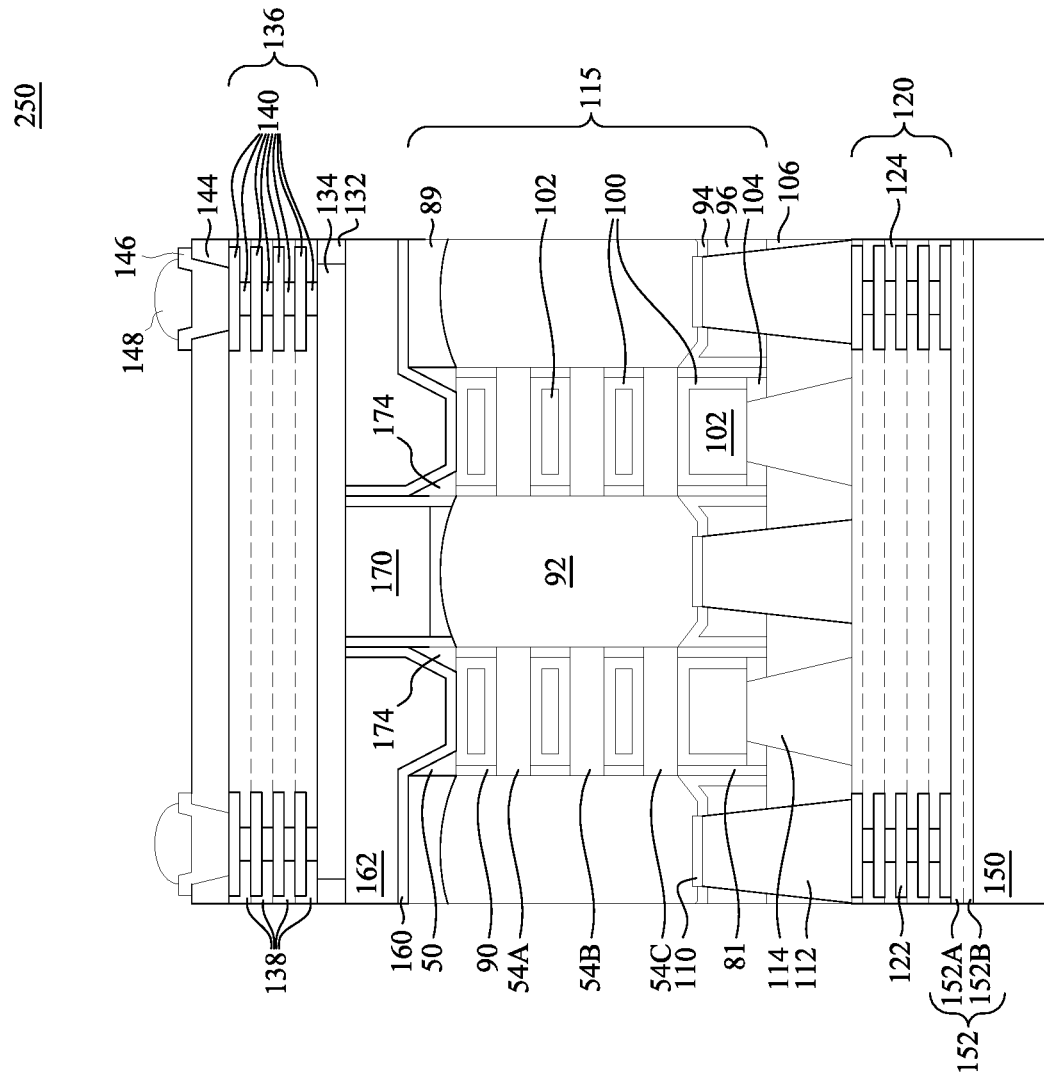

Additional processing (e.g., similar to those described above with respect to FIGS. 28A through 29C) may be performed on the structures of FIGS. 35A through 35E to form remaining portions of the backside interconnect structure 136, the passivation layer 144, the UBMs 146, and the external connectors 148. FIGS. 36A through 36C correspond to the embodiments of FIG. 35A through 35C; FIG. 36D corresponds to the embodiments of FIG. 35D; and FIG. 36E corresponds to the embodiments of FIG. 35E. Thus, the device 250 are completed. In the device 250, the substrate 50 is substantially removed leaving only portions along the <111> crystalline plane and covering corner regions of the epitaxial source/drain regions 92. Optionally, the substrate 50 may remain around bottom portions of the backside vias 170, or the substrate 50 may be replaced with voids 174 (see FIG. 36D) or insulating materials 172 (see FIG. 36E).

Embodiments may achieve advantages. Various embodiments provide a backside interconnect structure where a majority of a semiconductor substrate is etched away and removed, and backside contacts are made to source/drain regions of transistors formed on the semiconductor substrate. As part of forming the backside contacts, etching the semiconductor substrate includes leaving a portion of the semiconductor substrate to cover at least edge regions of the source/drain regions. As a result, the source/drain regions can be better protected during the backside contact formation process, and manufacturing defects can be reduced. Additional portions of the substrate may be removed to further reduce leakage and capacitance.

In accordance with an embodiment, a device includes a device layer comprising a first transistor and a second transistor; a first interconnect structure on a front-side of the device layer; and a second interconnect structure on a backside of the device layer. The second interconnect structure includes a first dielectric layer on the backside of the device layer, wherein a semiconductor material is disposed between the first dielectric layer and a first source/drain region of the first transistor; a contact extending through the first dielectric layer to a second source/drain region of the second transistor; and a first conductive line electrically connected to the second source/drain region of the second transistor through the contact. Optionally, in some embodiments, the first conductive line is a power supply line or an electrical ground line. Optionally, in some embodiments, the device further includes a dielectric liner between the first dielectric layer and the device layer, wherein the contact extends through the dielectric liner. Optionally, in some embodiments, the dielectric liner contacts a gate stack of the first transistor. Optionally, in some embodiments, the device further includes an insulating spacer on a sidewall of the contact. Optionally, in some embodiments, the insulating spacer contacts the semiconductor material. Optionally, in some embodiments, the device further includes a void between the insulating spacer and the semiconductor material. Optionally, in some embodiments, the device further includes an insulating material between the insulating spacer and the semiconductor material.

In accordance with another embodiment, a device layer includes a plurality of transistors; a front-side interconnect structure on a front-side of the device layer; and a backside interconnect structure on a backside of the device layer. The backside interconnect structure includes a semiconductor material on the backside of the device layer; a first insulating material on the backside of the device layer, wherein the first insulating material contacts a gate stack in the device layer, and wherein the semiconductor material separates the first insulating material from a corner region of a first source/drain region in the device layer; a contact extending through the first insulating material to a second source/drain region in the device layer; and a conductive line electrically connected to the second source/drain region by the contact. Optionally, in some embodiments, the semiconductor material has a surface in a <111> crystalline plane. Optionally, in some embodiments, the device further includes a void between the contact and the first insulating material. Optionally, in some embodiments, the device further includes a second insulating material between the contact and the first insulating material. Optionally, in some embodiments, the device further includes an insulating spacer on sidewalls of the contact, the insulating spacer separates the contact from the first insulating material. Optionally, in some embodiments, the device further includes an epitaxial material between the first source/drain region and the first insulating material, wherein the semiconductor material is disposed on a sidewall of the epitaxial material.

In accordance with yet another embodiment, a method includes forming a device layer on a semiconductor substrate, the device layer comprising a plurality of transistors, wherein forming the device layer comprises: etching a first recess and a second recess in the semiconductor substrate; epitaxially growing a first semiconductor material in the first recess; epitaxially growing a second semiconductor material over the first semiconductor material in the first recess; and epitaxially growing a third semiconductor material in the second recess; forming a first interconnect structure over a backside of the device layer, wherein forming the first interconnect structure comprises: removing a portion of semiconductor substrate to expose the first semiconductor material; depositing a first dielectric layer over remaining portions of the semiconductor substrate and around the first semiconductor material; removing the first semiconductor material to define a third recess, wherein the remaining portions of the semiconductor substrate masks at least a corner region of the third semiconductor material while removing the first semiconductor material, and wherein the third recess exposes the second semiconductor material; and forming a contact in the second recess and electrically connected to the second semiconductor material. Optionally, in some embodiments, removing the portion of the semiconductor substrate further exposes a gate stack of the device layer. Optionally, in some embodiments forming the device layer further comprises: epitaxially growing a fourth semiconductor material in the second recess, wherein the third semiconductor material is over the fourth semiconductor material, and wherein the remaining portions of the semiconductor substrate contacts a sidewall of the fourth semiconductor material. Optionally, in some embodiments, the method further includes removing the semiconductor substrate from the third recess before forming the contact. Optionally, in some embodiments, the method further includes oxidizing the semiconductor substrate in the third recess to form an insulating material. Optionally, in some embodiments, the method further includes replacing the semiconductor substrate in the third recess with an insulating material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a device layer comprising a first transistor and a second transistor;
   a first interconnect structure on a front-side of the device layer; and
   a second interconnect structure on a backside of the device layer, the second interconnect structure comprising:
   a first dielectric layer on the backside of the device layer, wherein a semiconductor material is disposed between the first dielectric layer and a first source/drain region of the first transistor;
   a metal contact extending through the first dielectric layer to a second source/drain region of the second transistor; and
   a first conductive line electrically connected to the second source/drain region of the second transistor through the metal contact.

2. The device of claim 1, wherein the first conductive line is a power supply line or an electrical ground line.

3. The device of claim 1 further comprising a dielectric liner between the first dielectric layer and the device layer, wherein the metal contact extends through the dielectric liner.

4. The device of claim 3, wherein the dielectric liner contacts a gate stack of the first transistor.

5. The device of claim 1 further comprising an insulating spacer on a sidewall of the metal contact.

6. The device of claim 5, wherein the insulating spacer contacts the semiconductor material.

7. The device of claim 5 further comprising a void between the insulating spacer and the semiconductor material.

8. The device of claim 5 further comprising an insulating material between the insulating spacer and the semiconductor material.

9. A device comprising:
   a device layer comprising a plurality of transistors;
   a front-side interconnect structure on a front-side of the device layer; and
   a backside interconnect structure on a backside of the device layer, the backside interconnect structure comprising:
   a semiconductor material on the backside of the device layer;
   a first insulating material on the backside of the device layer, wherein the first insulating material contacts a gate stack in the device layer, and wherein the semiconductor material separates the first insulating material from a corner region of a first source/drain region in the device layer;
   a contact extending through the first insulating material to a second source/drain region in the device layer; and
   a conductive line electrically connected to the second source/drain region by the contact.

10. The device of claim 9, wherein the semiconductor material has a surface in a <111> crystalline plane.

11. The device of claim 9 further comprising a void between the contact and the first insulating material.

12. The device of claim 9 further comprising a second insulating material between the contact and the first insulating material.

13. The device of claim 9 further comprising an insulating spacer on sidewalls of the contact, the insulating spacer separates the contact from the first insulating material.

14. The device of claim 13 further comprising an epitaxial material between the first source/drain region and the first insulating material, wherein the semiconductor material is disposed on a sidewall of the epitaxial material.

15. A method comprising:
   forming a device layer on a semiconductor substrate, the device layer comprising a plurality of transistors, wherein forming the device layer comprises:
      etching a first recess and a second recess in the semiconductor substrate;
      epitaxially growing a first semiconductor material in the first recess;
      epitaxially growing a second semiconductor material over the first semiconductor material in the first recess; and
      epitaxially growing a third semiconductor material in the second recess;
   forming a first interconnect structure over a backside of the device layer, wherein forming the first interconnect structure comprises:
      removing a portion of semiconductor substrate to expose the first semiconductor material;
      depositing a first dielectric layer over remaining portions of the semiconductor substrate and around the first semiconductor material;
      removing the first semiconductor material to define a third recess, wherein the remaining portions of the semiconductor substrate masks at least a corner region of the third semiconductor material while removing the first semiconductor material, and wherein the third recess exposes the second semiconductor material; and
      forming a contact in the second recess and electrically connected to the second semiconductor material.

16. The method of claim 15, wherein removing the portion of the semiconductor substrate further exposes a gate stack of the device layer.

17. The method of claim 16, wherein forming the device layer further comprises:
   epitaxially growing a fourth semiconductor material in the second recess, wherein the third semiconductor material is over the fourth semiconductor material, and wherein the remaining portions of the semiconductor substrate contacts a sidewall of the fourth semiconductor material.

18. The method of claim 17 further comprising removing the semiconductor substrate from the third recess before forming the contact.

19. The method of claim 17 further comprising oxidizing the semiconductor substrate in the third recess to form an insulating material.

20. The method of claim 17 further comprising replacing the semiconductor substrate in the third recess with an insulating material.

* * * * *